(12) United States Patent
Park et al.

(10) Patent No.: US 12,011,907 B2
(45) Date of Patent: Jun. 18, 2024

(54) SUBSTRATE FOR DISPLAY

(71) Applicant: LG INNOTEK CO., LTD., Seoul (KR)

(72) Inventors: Duck Hoon Park, Seoul (KR); Hae Sik Kim, Seoul (KR); Jee Heum Paik, Seoul (KR); Woo Young Chang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 585 days.

(21) Appl. No.: 17/282,511

(22) PCT Filed: Jan. 10, 2020

(86) PCT No.: PCT/KR2020/000458
§ 371 (c)(1),
(2) Date: Apr. 2, 2021

(87) PCT Pub. No.: WO2020/145718
PCT Pub. Date: Jul. 16, 2020

(65) Prior Publication Data
US 2021/0352814 A1 Nov. 11, 2021

(30) Foreign Application Priority Data

Jan. 11, 2019 (KR) .................. 10-2019-0003792
Jan. 11, 2019 (KR) .................. 10-2019-0003813

(51) Int. Cl.
*B32B 3/26* (2006.01)
*G06F 1/16* (2006.01)
(Continued)

(52) U.S. Cl.
CPC ............ *B32B 3/266* (2013.01); *G06F 1/1652* (2013.01); *G09F 9/301* (2013.01); *H05K 5/0226* (2013.01)

(58) Field of Classification Search
CPC .............................. B32B 3/266; G06F 1/1652
See application file for complete search history.

(56) References Cited

U.S. PATENT DOCUMENTS 9,983,424 B2  5/2018  Kim et al.
10,074,824 B2  9/2018  Han et al.
(Continued)

FOREIGN PATENT DOCUMENTS

CN  106252378  12/2016
CN  107068862  8/2017
(Continued)

OTHER PUBLICATIONS

International Search Report dated Apr. 27, 2020 issued in Application No. PCT/KR2020/000458.
(Continued)

*Primary Examiner* — Zachary M Davis
(74) *Attorney, Agent, or Firm* — KED & ASSOCIATES, LLP

(57) ABSTRACT

A display substrate according to the embodiment includes: a base material having a long direction and a short direction, and including one surface and the other surface, and a first region and a second region; and a hole passing through the one surface and the other surface of the base material, wherein the first region is defined as a folding region in which the one surface is folded to face, the second region is defined as an unfolding region, the hole includes a first hole formed in the first region, and the first hole includes at least three first holes having different sizes in the long direction of the base material.

20 Claims, 37 Drawing Sheets

(51) Int. Cl.
  *G09F 9/30* (2006.01)
  *H05K 5/02* (2006.01)

(56) References Cited

U.S. PATENT DOCUMENTS

| | | |
|---|---|---|
| 10,164,208 B2 | 12/2018 | Lee et al. |
| 10,170,505 B2 | 1/2019 | Lee et al. |
| 10,347,852 B2 | 7/2019 | Myeong et al. |
| 10,381,581 B2 | 8/2019 | Jeong et al. |
| 10,608,024 B2 | 3/2020 | Lee et al. |
| 11,114,629 B2 | 9/2021 | Myeong et al. |
| 2016/0357052 A1 | 12/2016 | Kim et al. |
| 2017/0162821 A1 | 6/2017 | Oh et al. |
| 2017/0278899 A1* | 9/2017 | Yang ............... H10K 59/40 |
| 2017/0352692 A1* | 12/2017 | Lee ................. H01L 24/32 |
| 2018/0090698 A1 | 3/2018 | Jeong et al. |
| 2018/0097197 A1 | 4/2018 | Han et al. |
| 2018/0145269 A1 | 5/2018 | Myeong et al. |
| 2018/0190936 A1 | 7/2018 | Lee et al. |
| 2018/0343753 A1 | 11/2018 | Kim et al. |
| 2019/0280226 A1 | 9/2019 | Myeong et al. |

FOREIGN PATENT DOCUMENTS

| | | |
|---|---|---|
| CN | 107464800 | 12/2017 |
| CN | 107709601 | 2/2018 |
| CN | 107871762 | 4/2018 |
| CN | 108268170 | 7/2018 |
| CN | 109166472 | 1/2019 |
| EP | 3288097 | 2/2018 |
| EP | 3993075 | 5/2022 |
| KR | 10-2016-0144912 | 12/2016 |
| KR | 10-2017-0137260 | 12/2017 |
| KR | 10-2018-0034780 | 4/2018 |
| KR | 10-2018-0036904 | 4/2018 |
| KR | 10-2018-0056444 | 5/2018 |
| KR | 10-2018-0079091 | 7/2018 |
| KR | 10-2018-0129007 | 12/2018 |

OTHER PUBLICATIONS

Chinese Office Action dated Jul. 14, 2022 issued in Application No. 202080008082.8.
Korean Office Action dated Jun. 14, 2023 issued in Application No. 10-2019-0003792.

* cited by examiner

[FIG. 1]
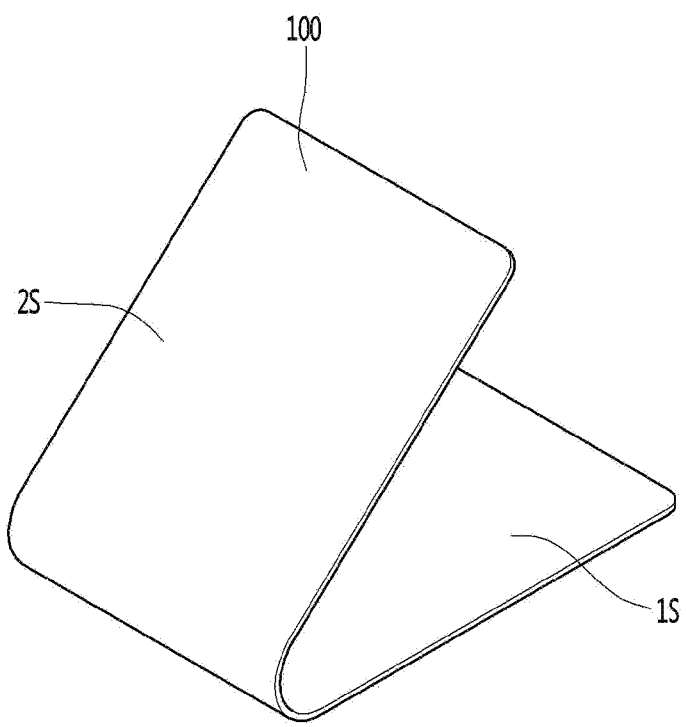

[FIG. 2]
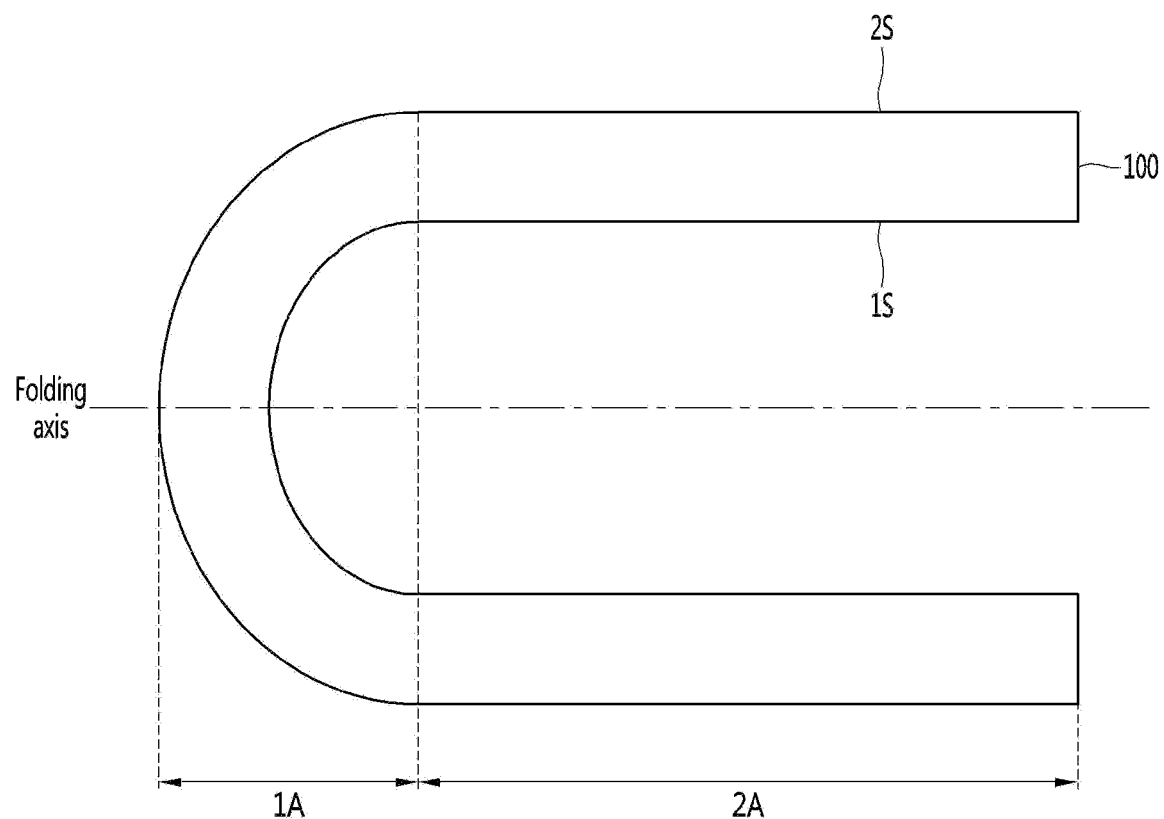

[FIG. 3]
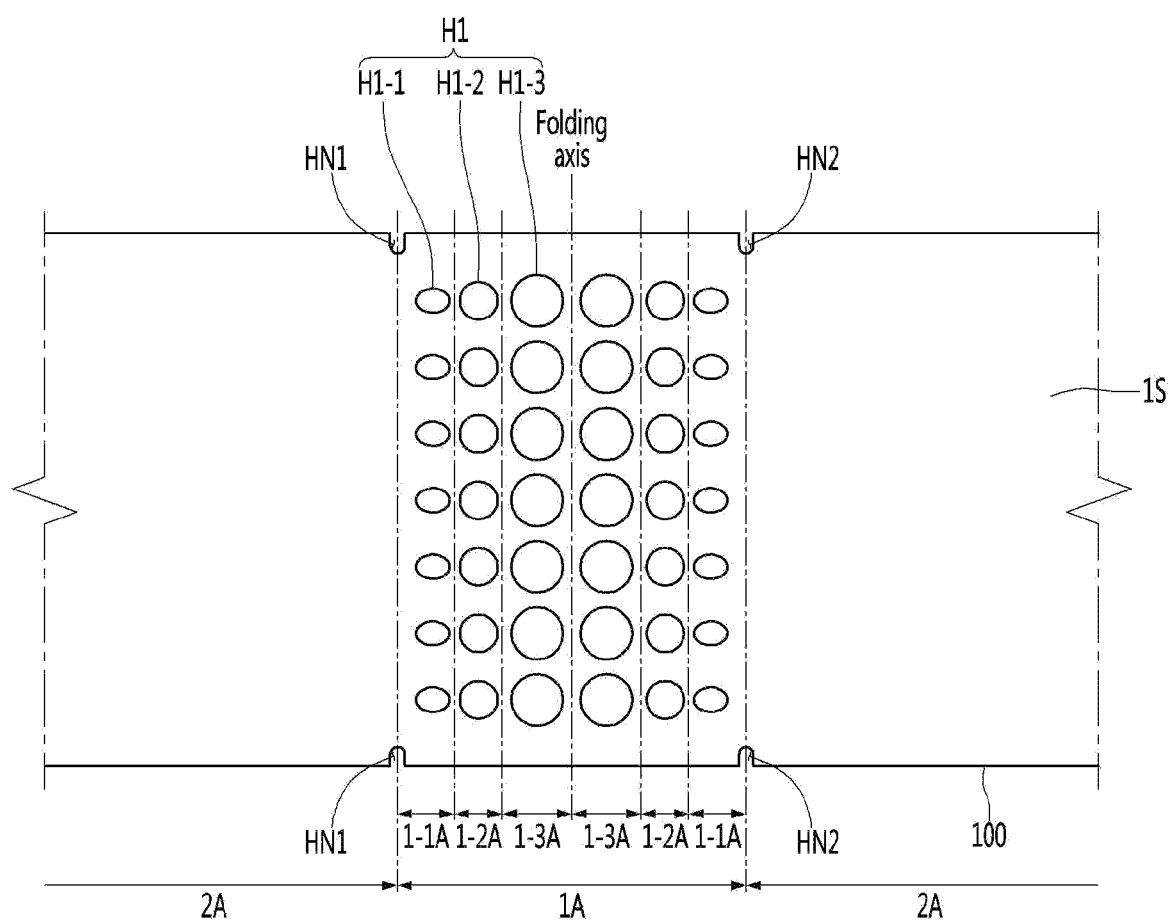

[FIG. 4]
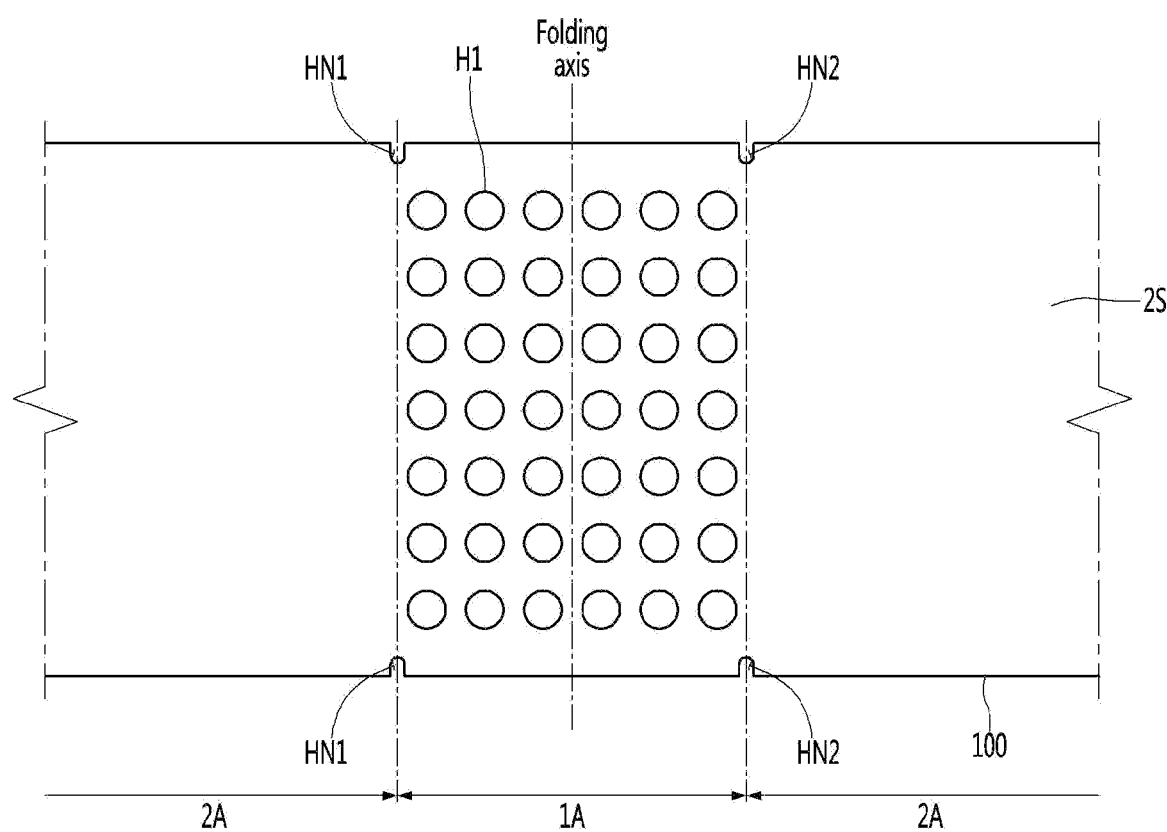

[FIG. 5]
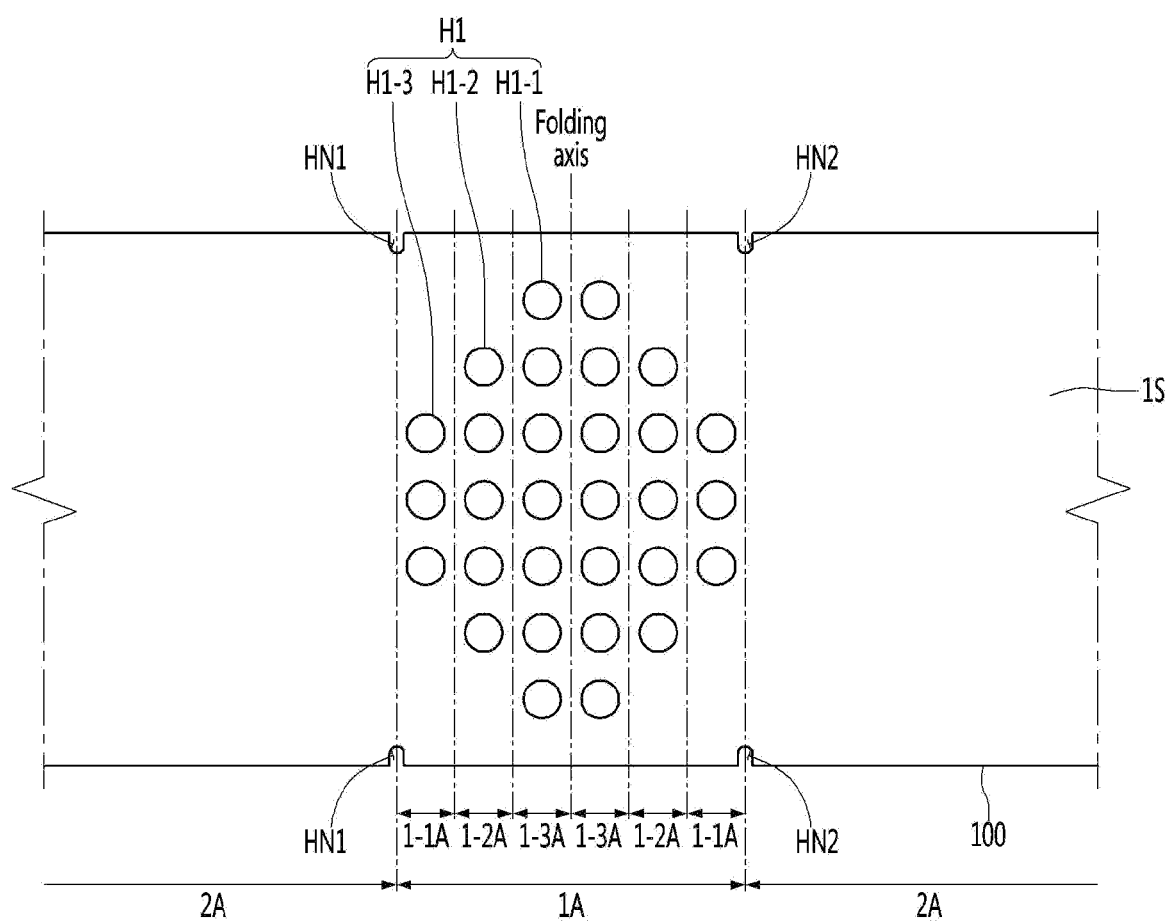

[FIG. 6]
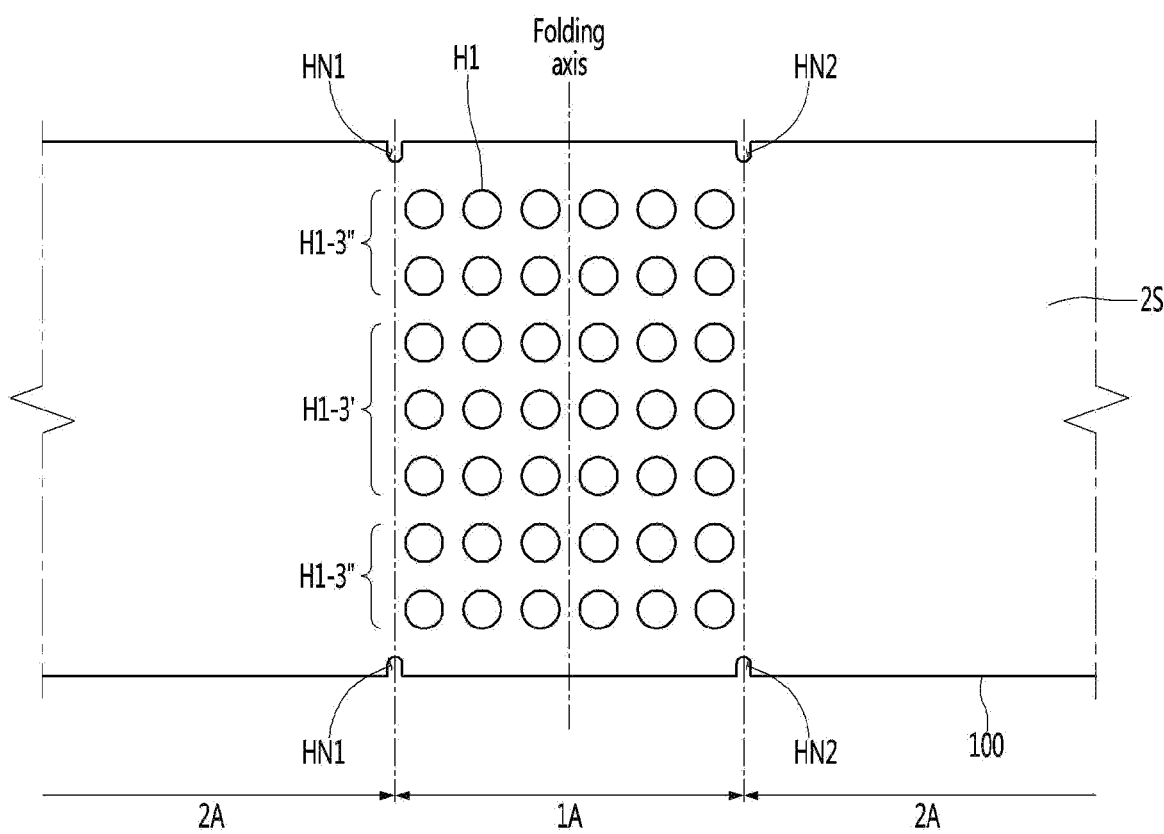

[FIG. 7]
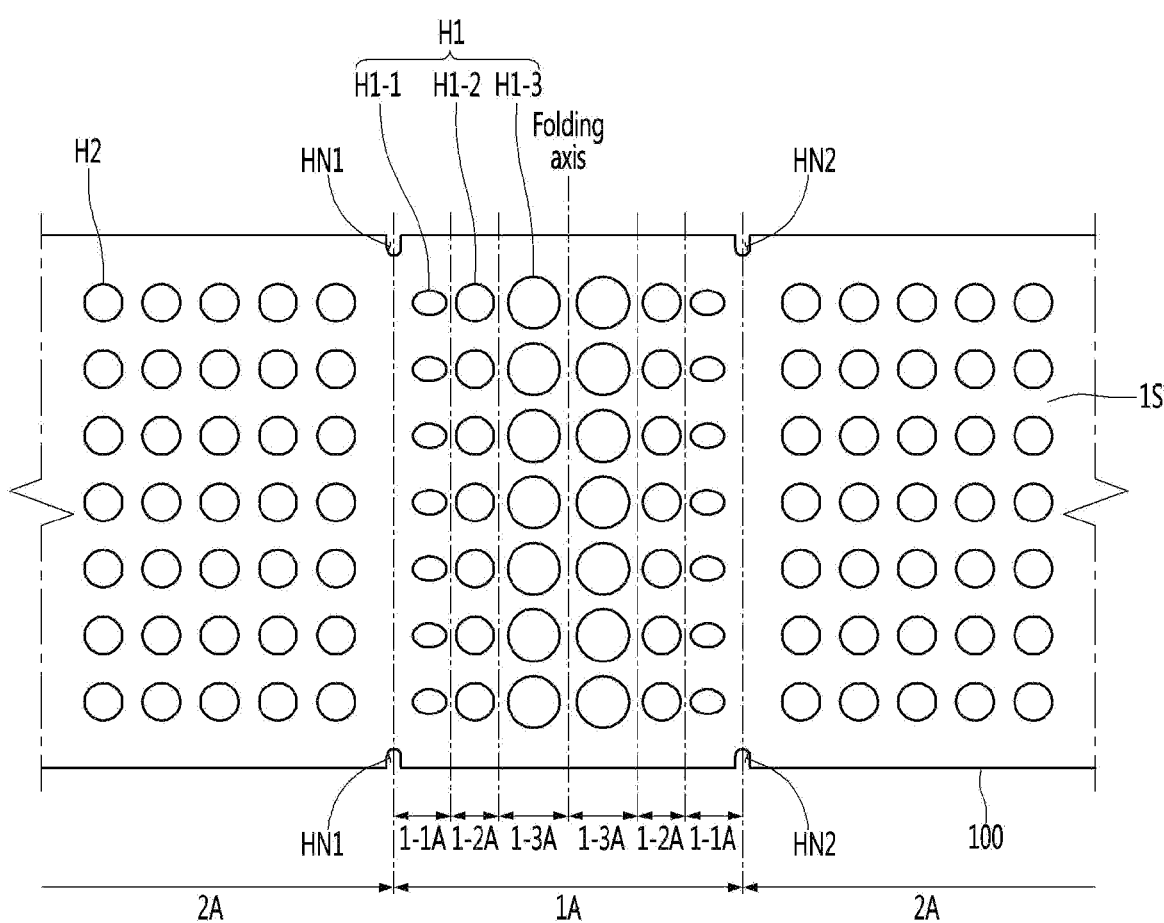

[FIG. 8]
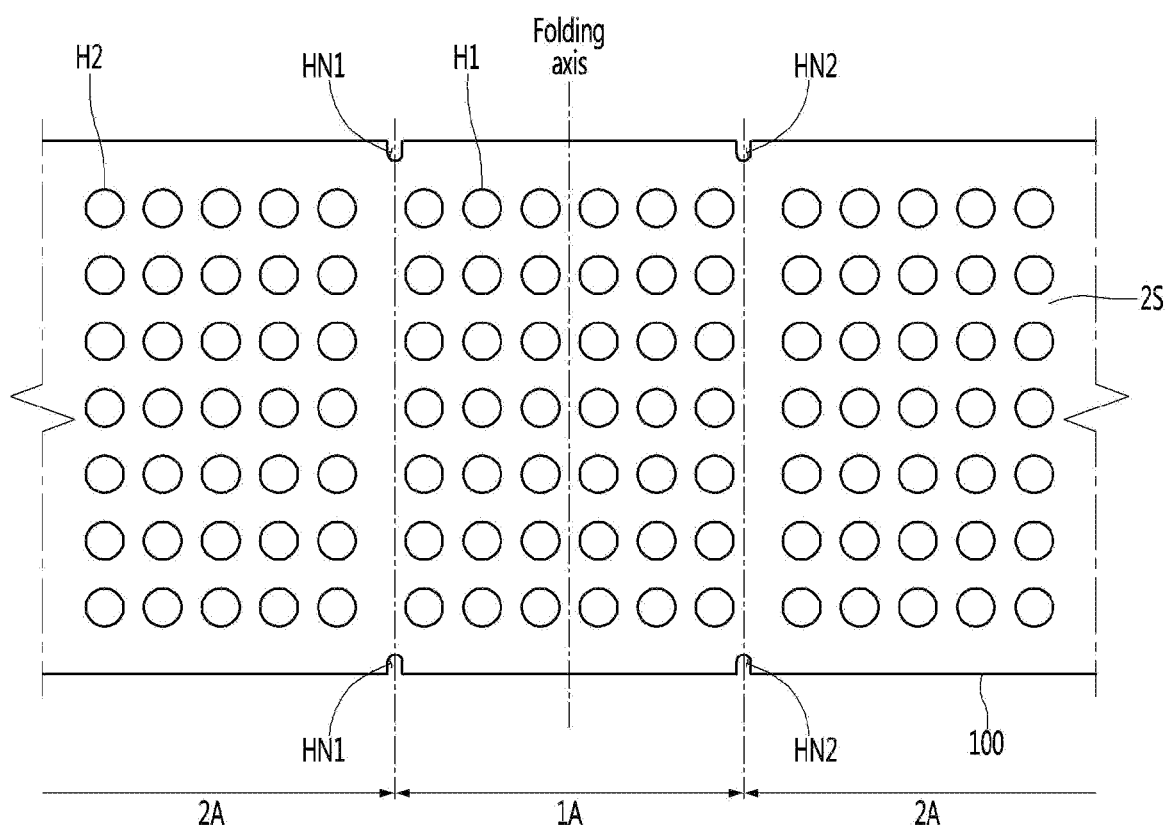

[FIG. 9]
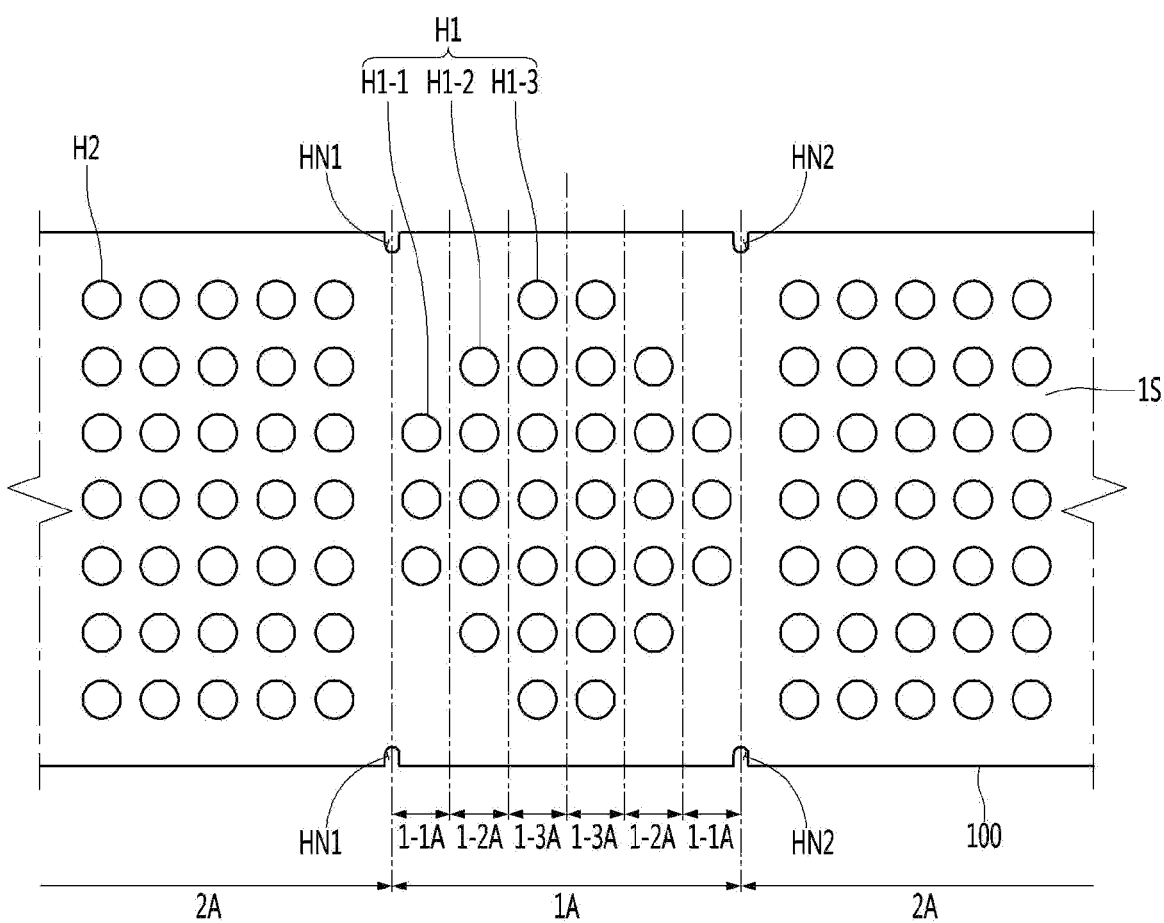

[FIG. 10]
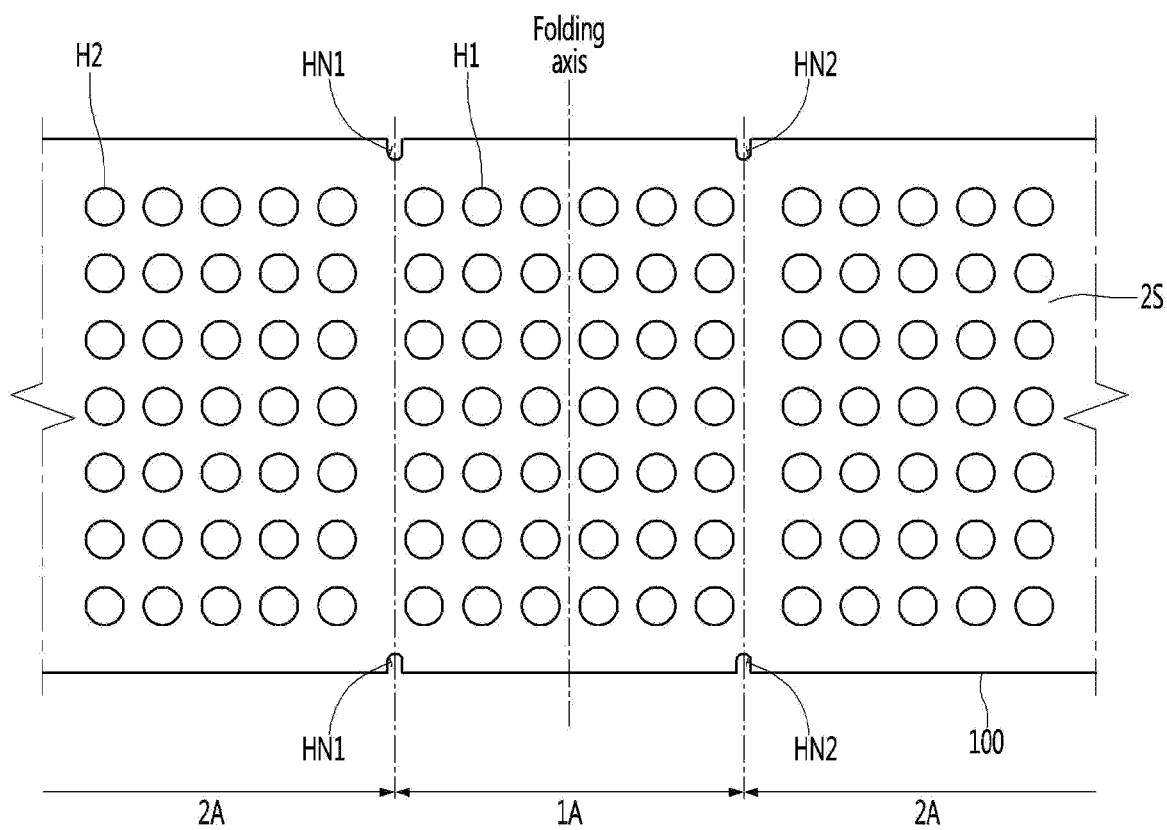

[FIG. 11]
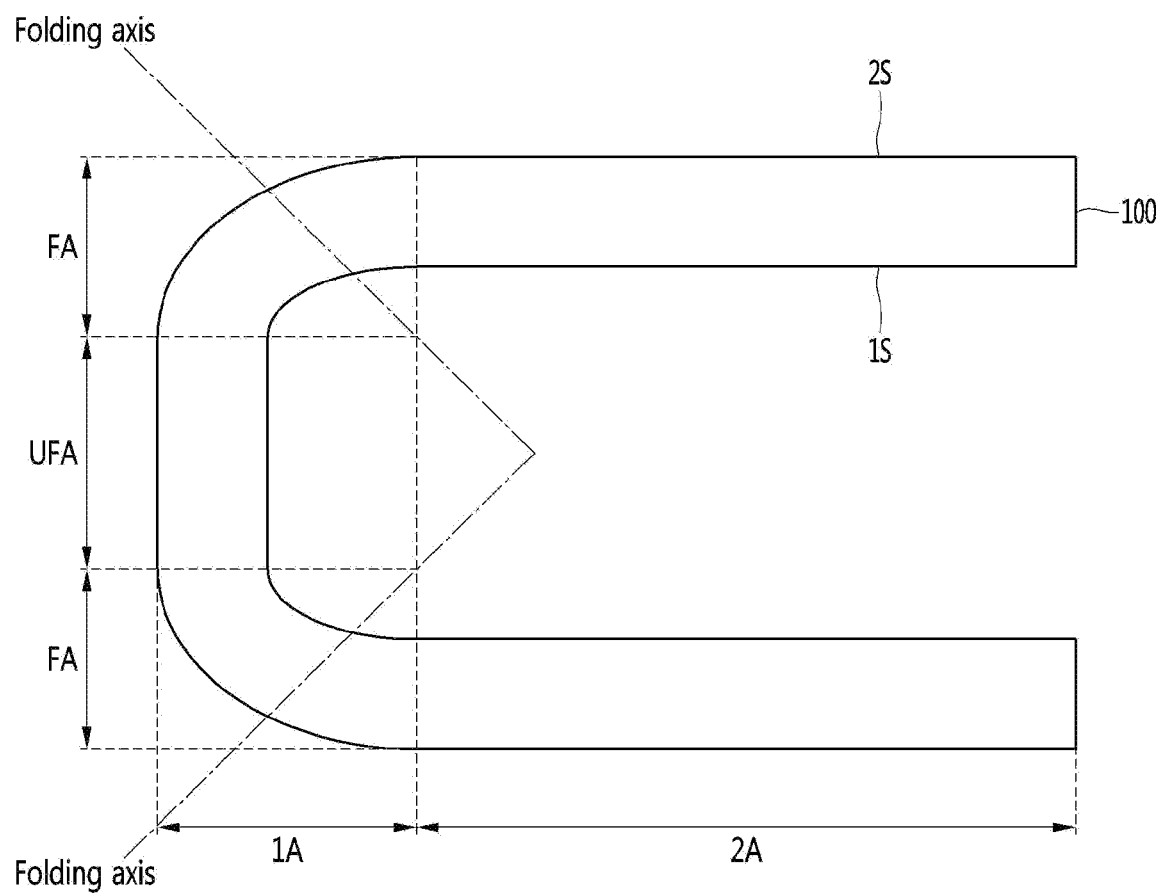

[FIG. 12]
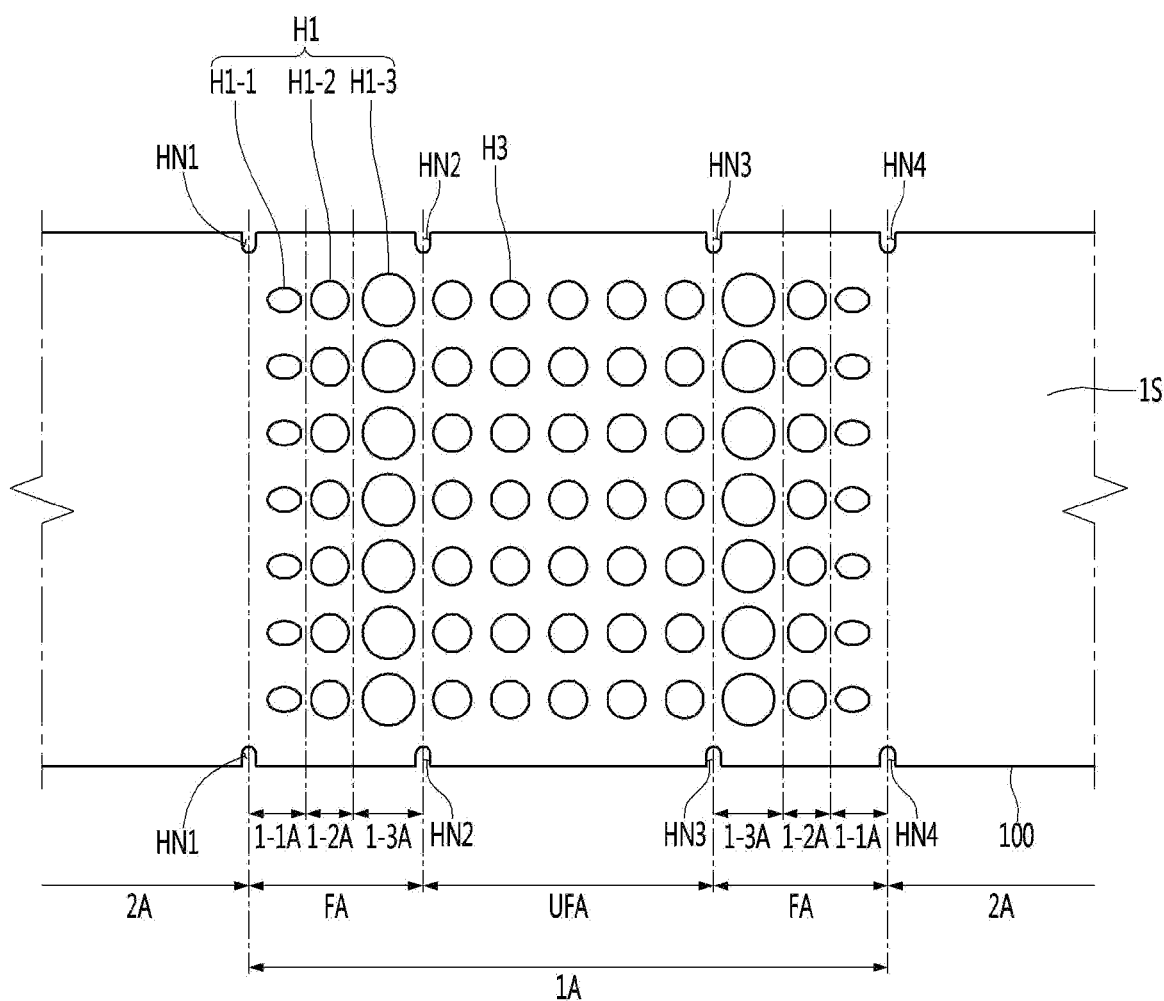

[FIG. 13]
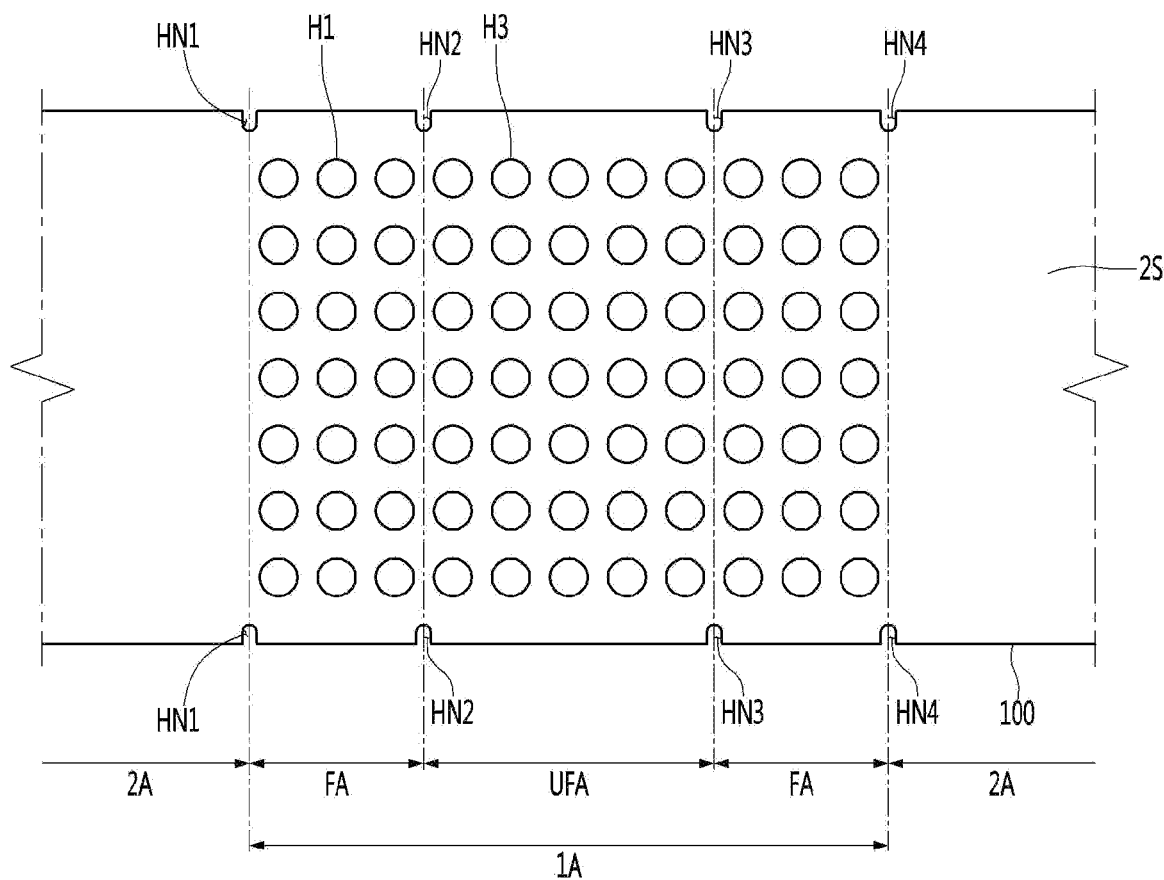

[FIG. 14]
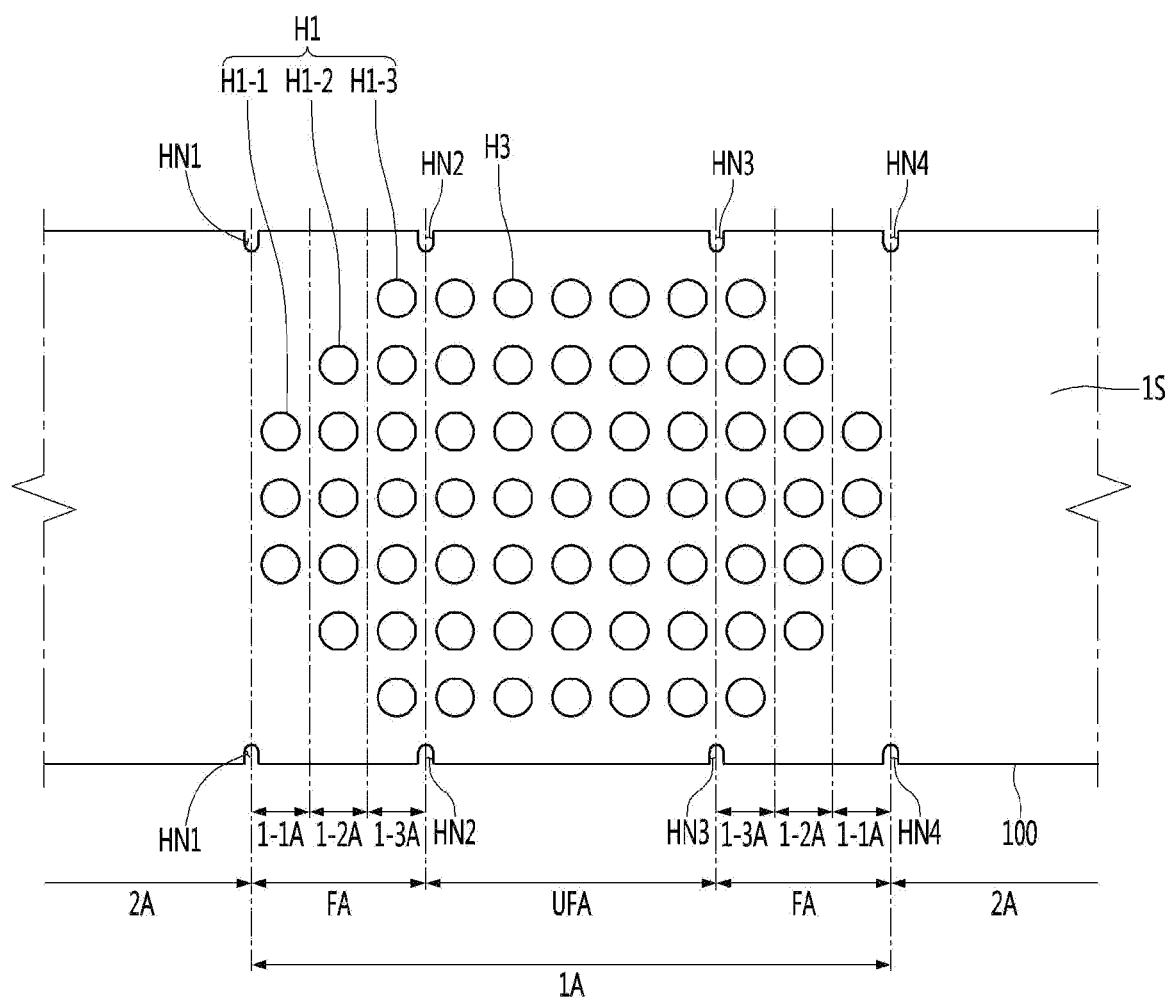

[FIG. 15]
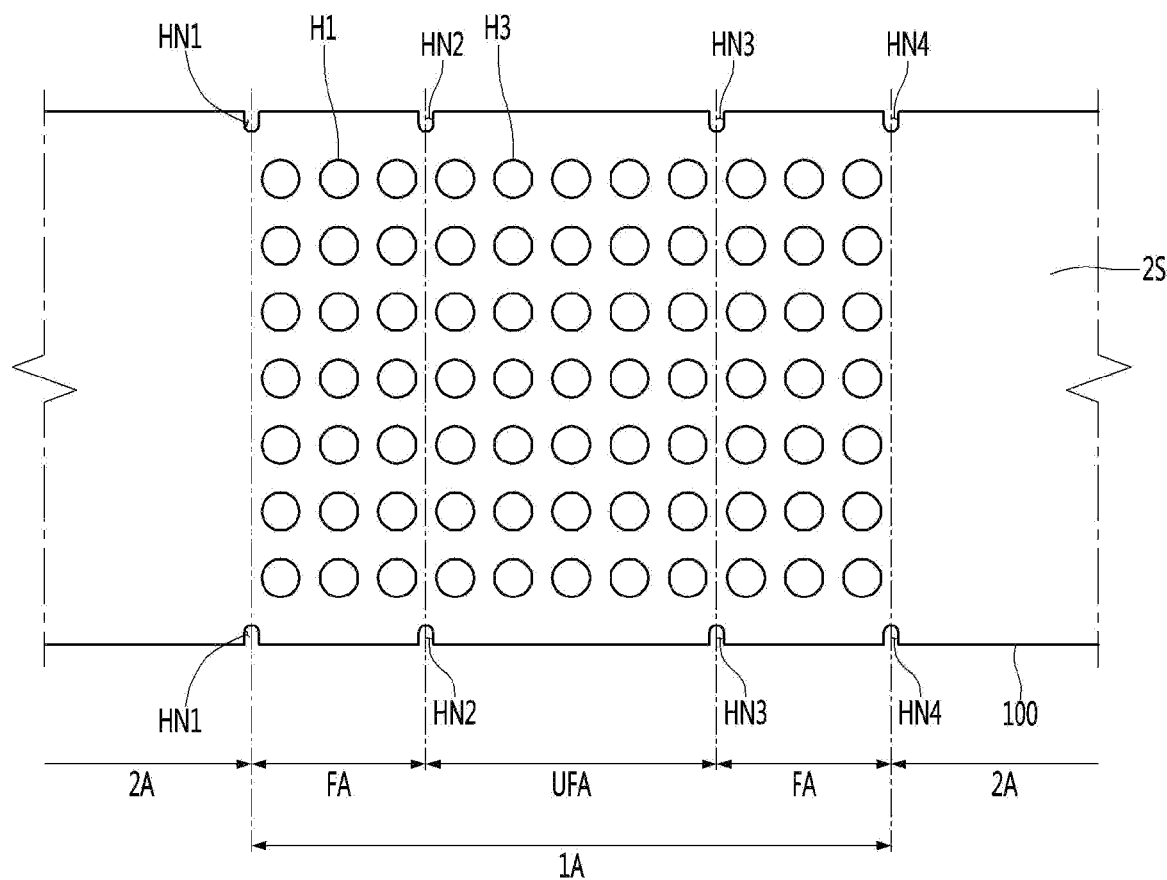

[FIG. 16]
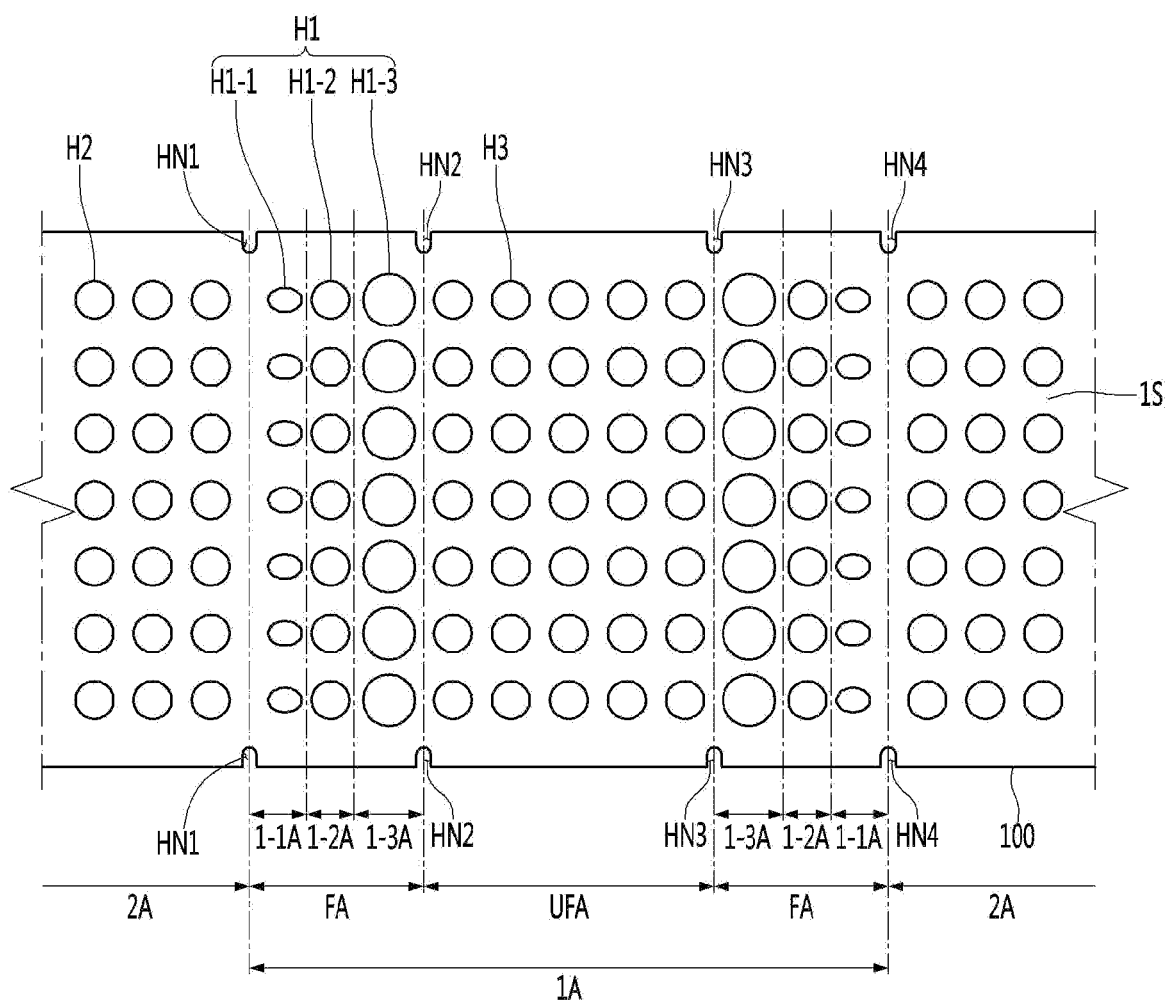

[FIG. 17]
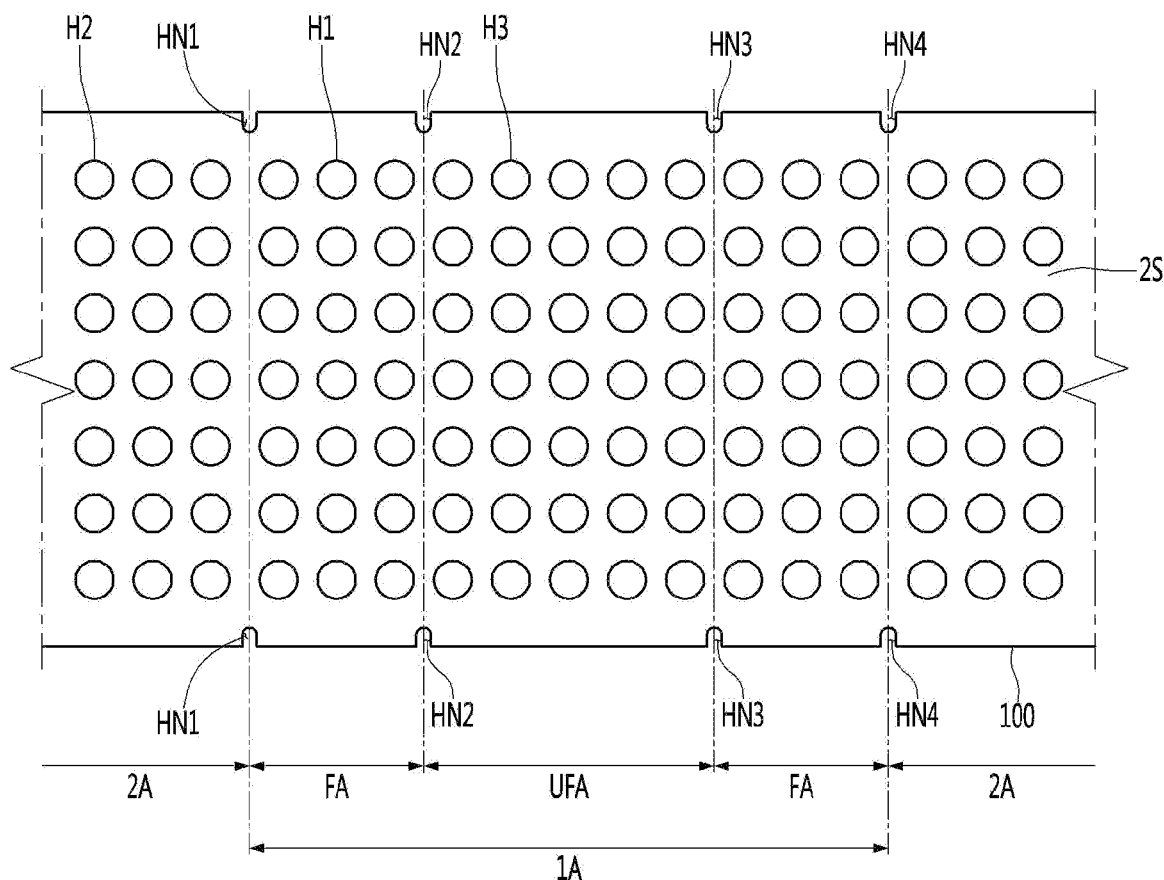

[FIG. 18]
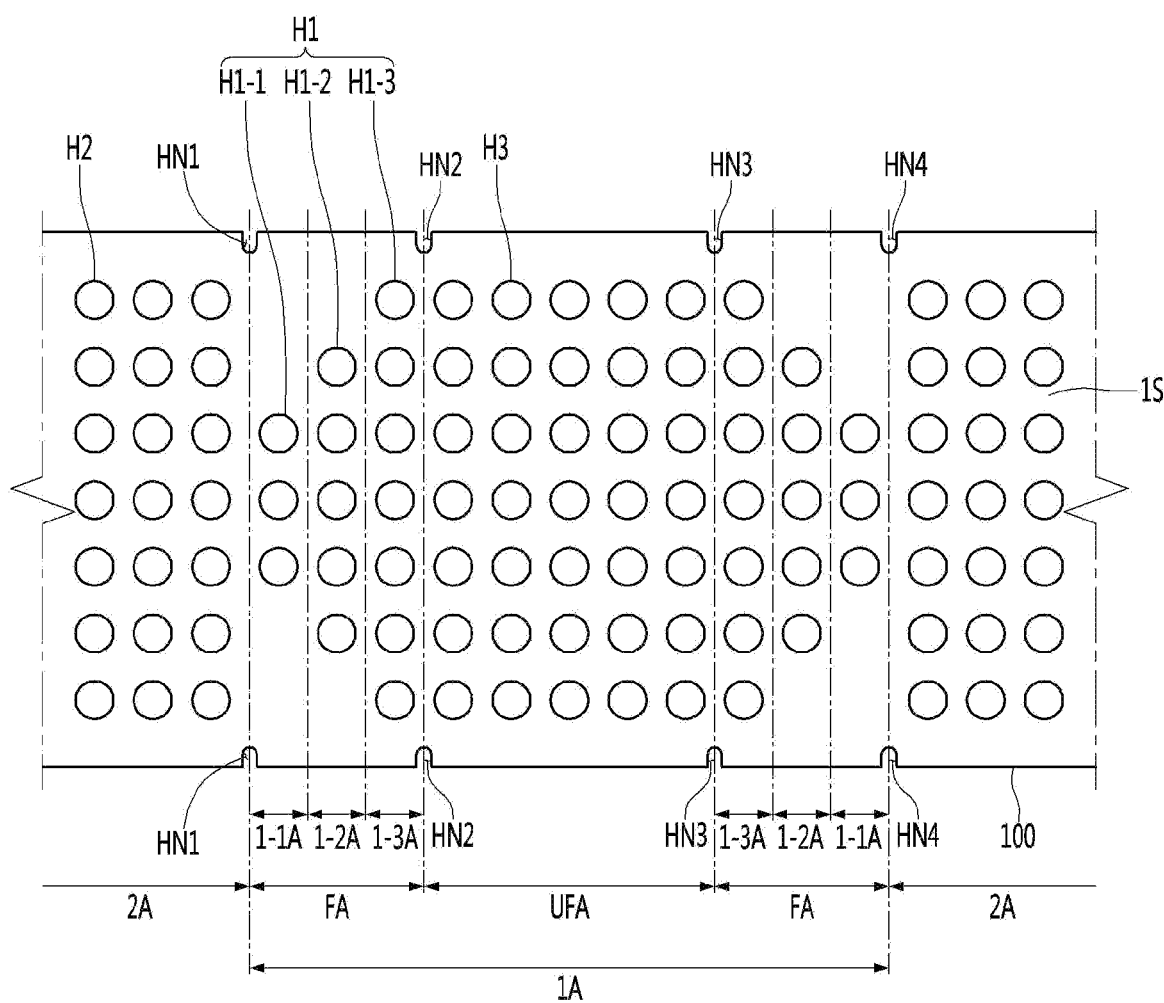

[FIG. 19]
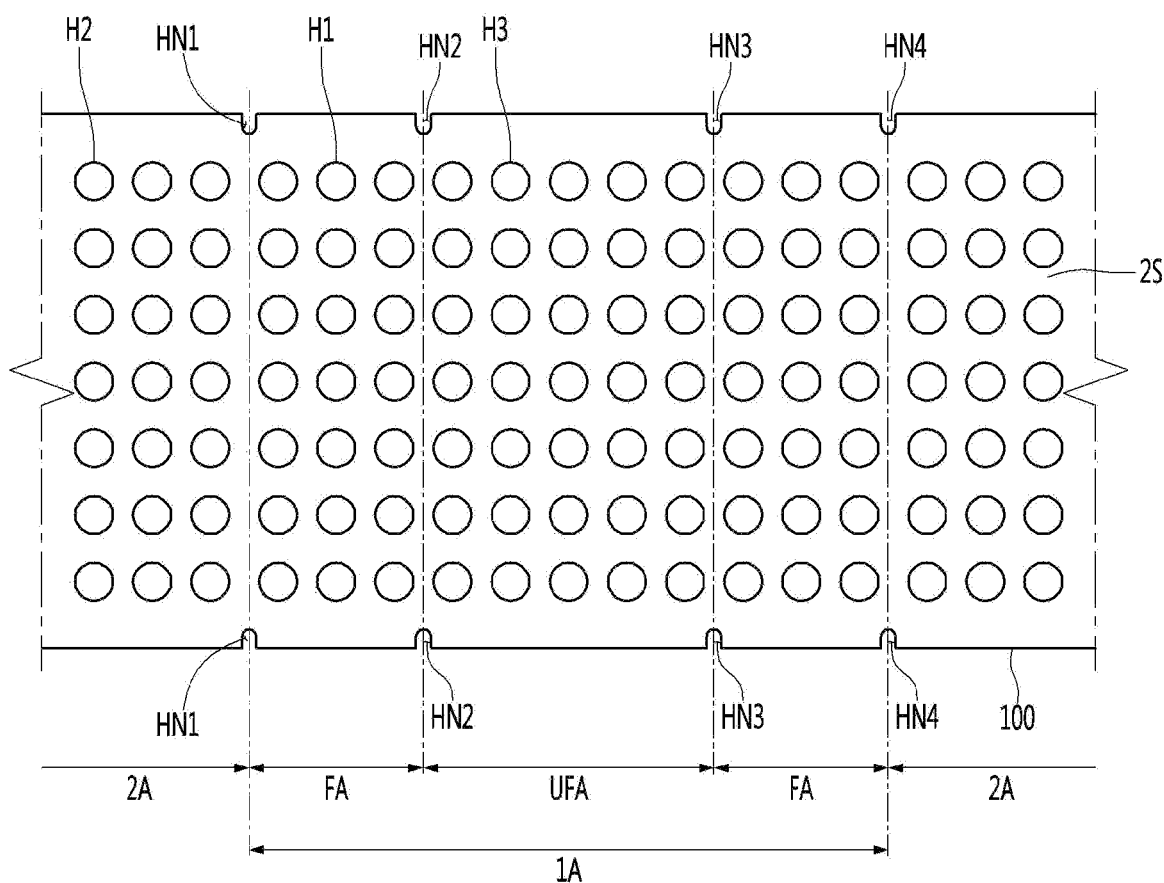

[FIG. 20]
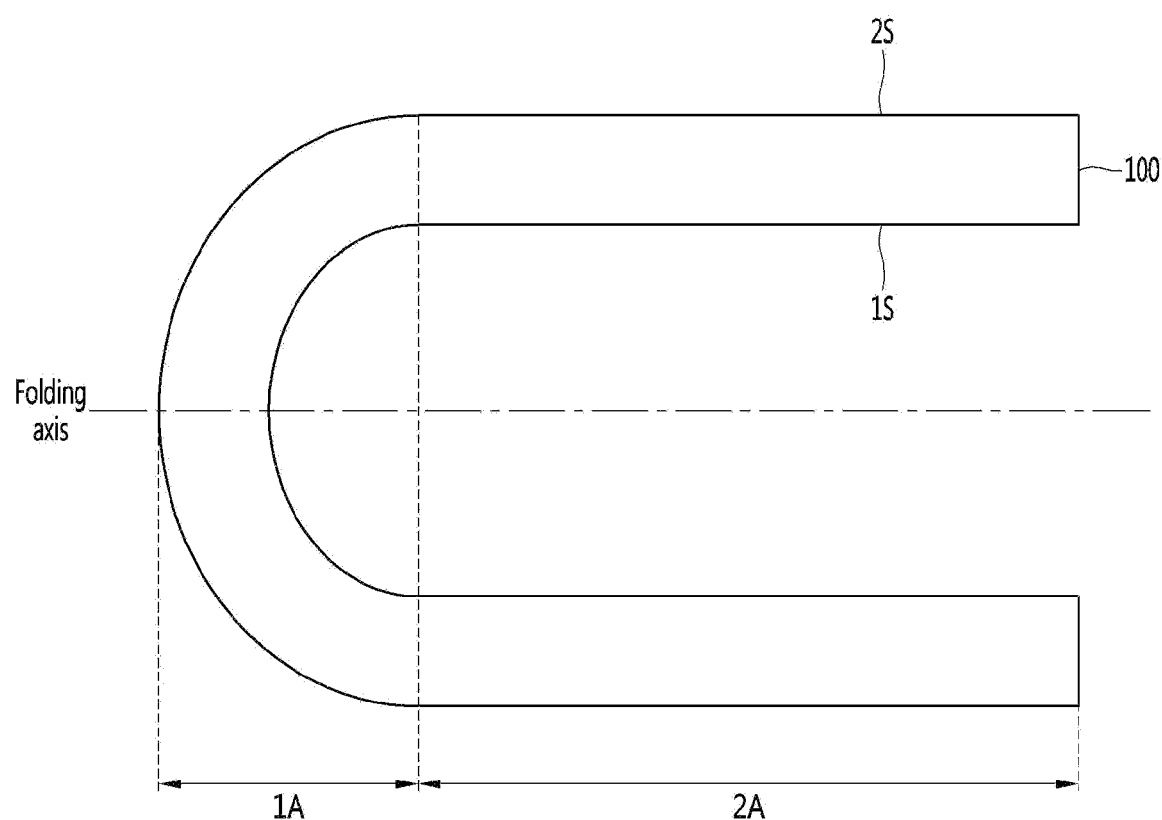

[FIG. 21]
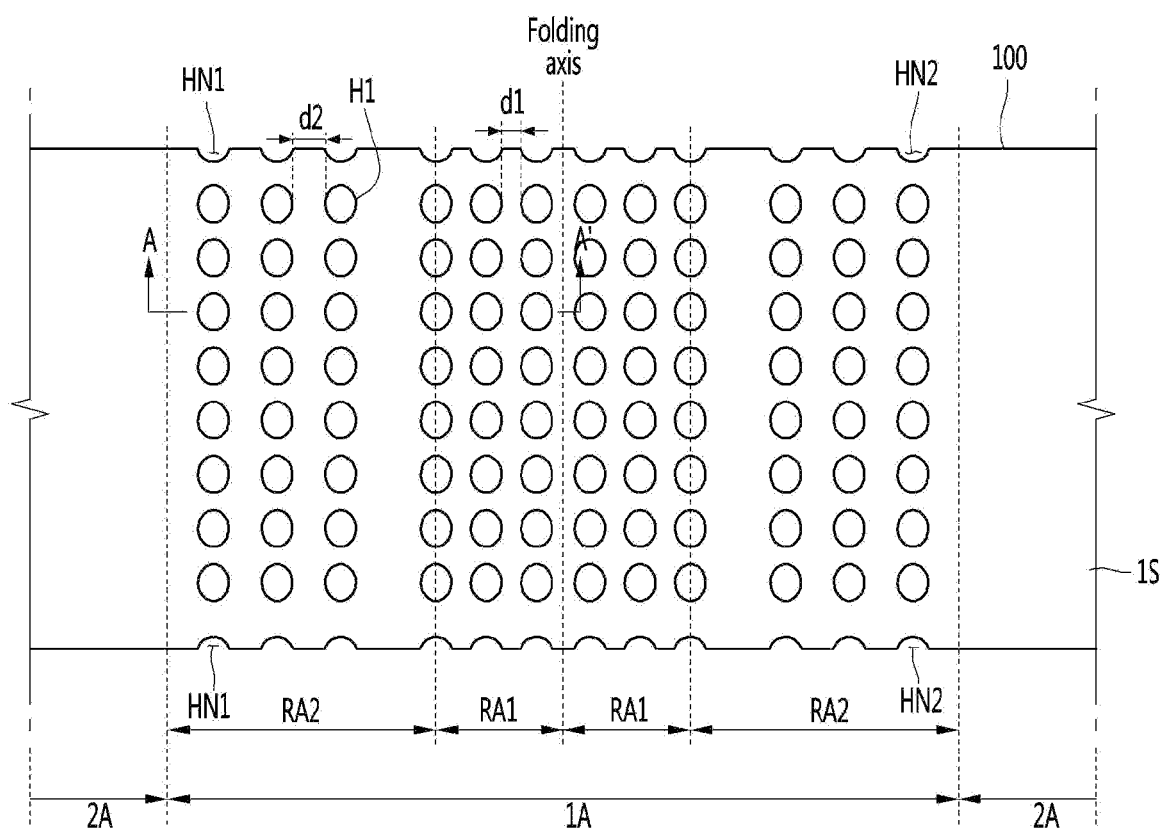

[FIG. 22]
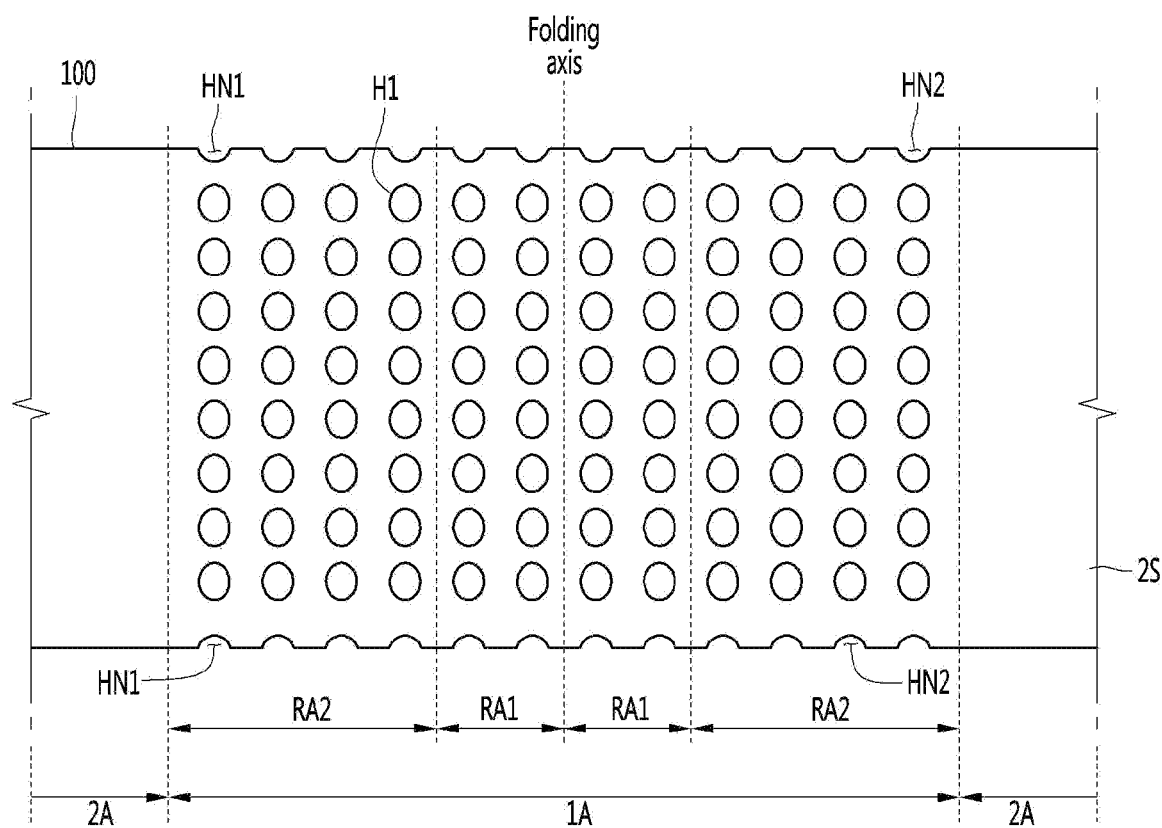

[FIG. 23]
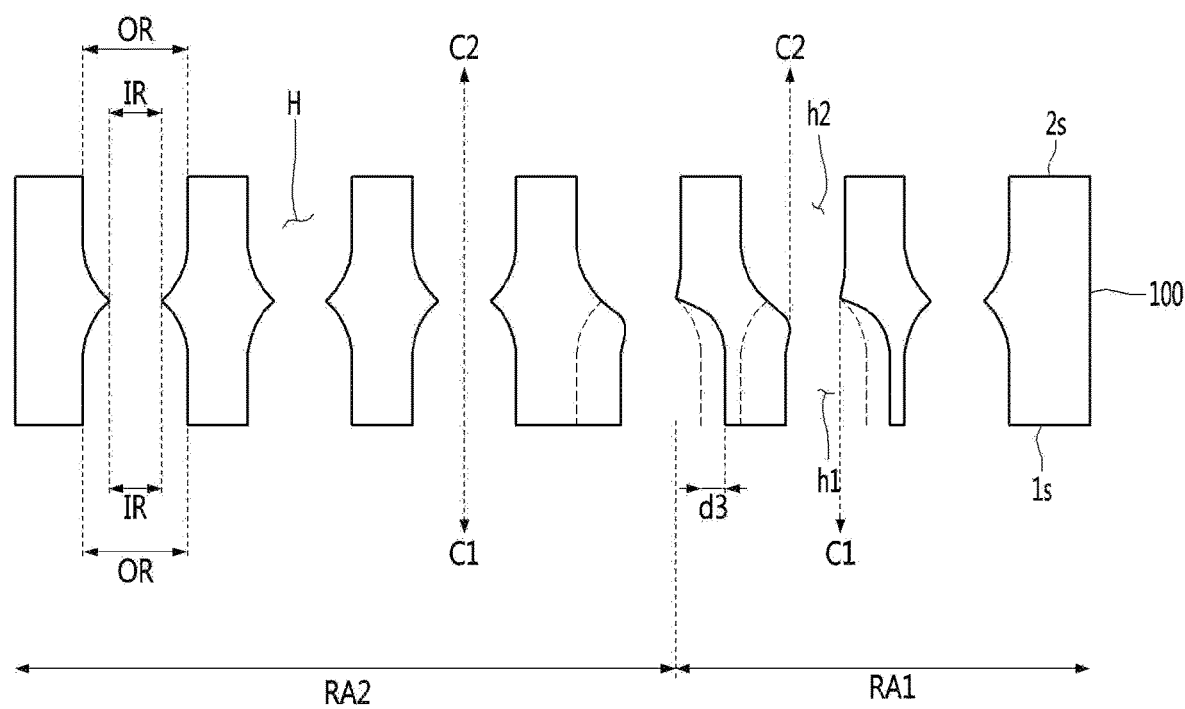

[FIG. 24]
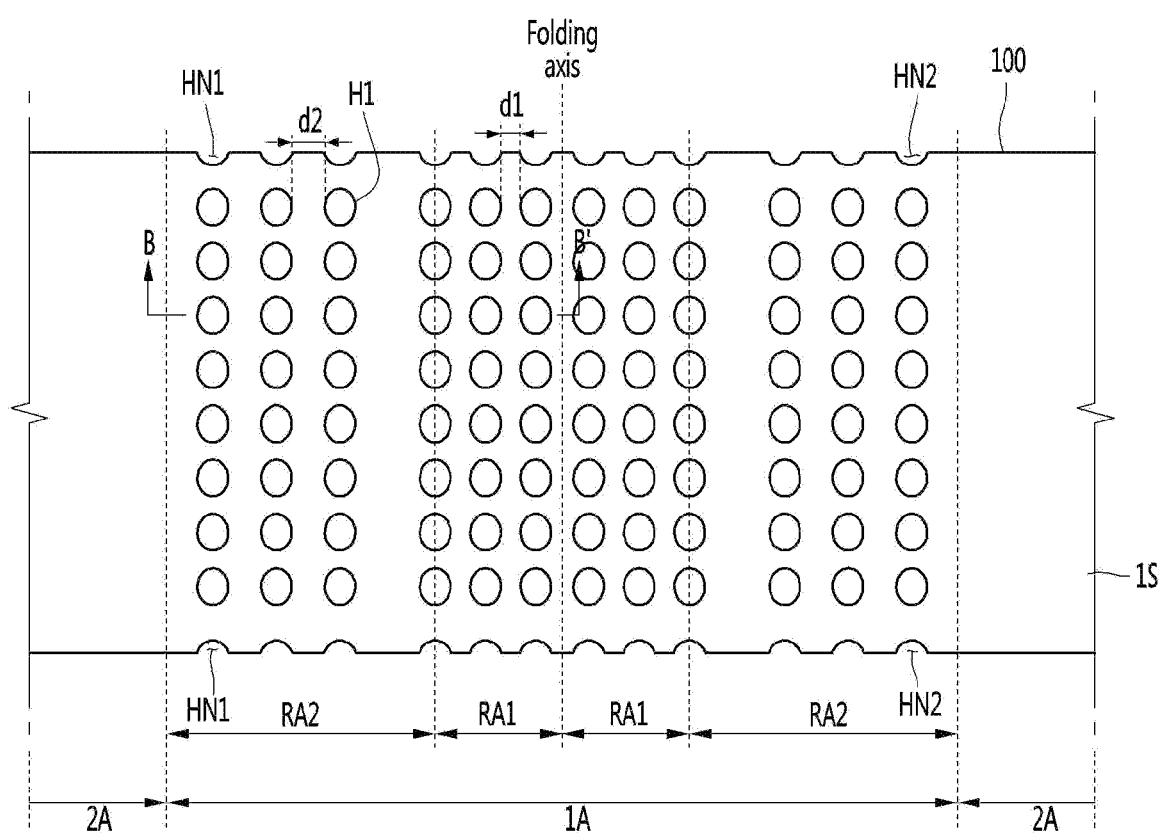

[FIG. 25]
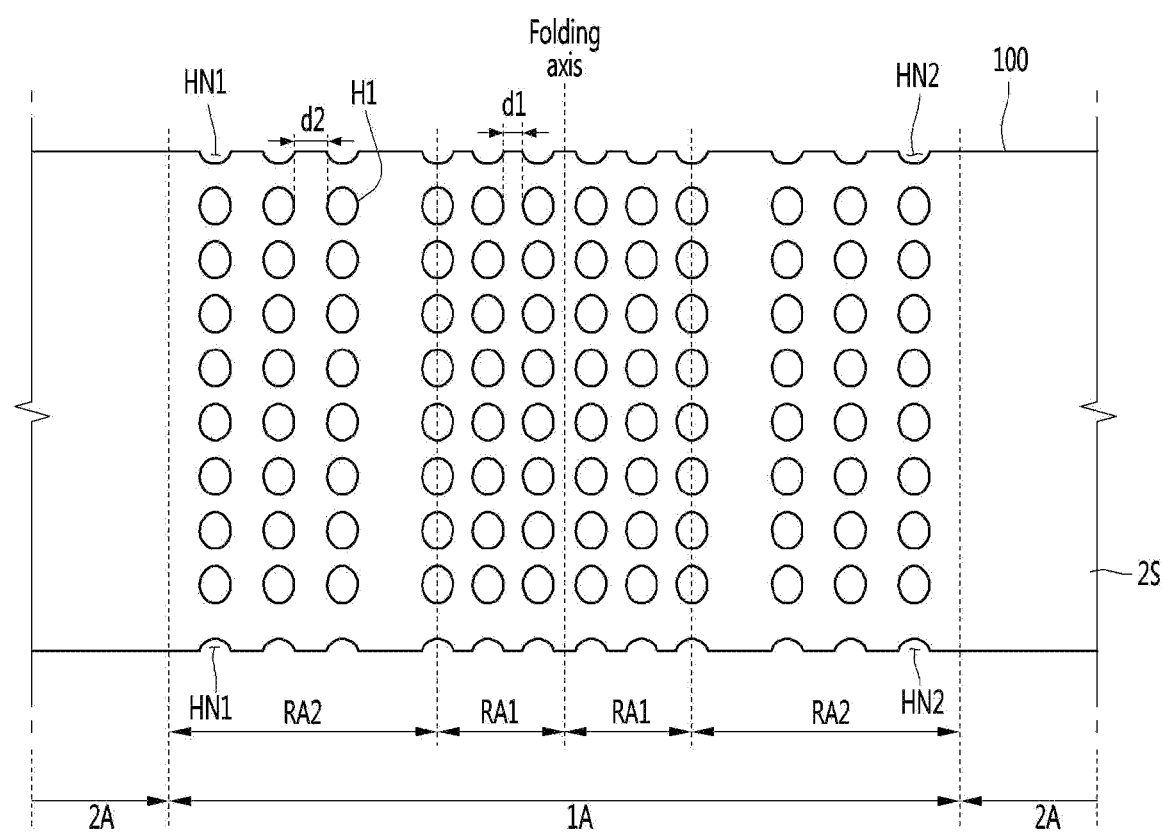

[FIG. 26]
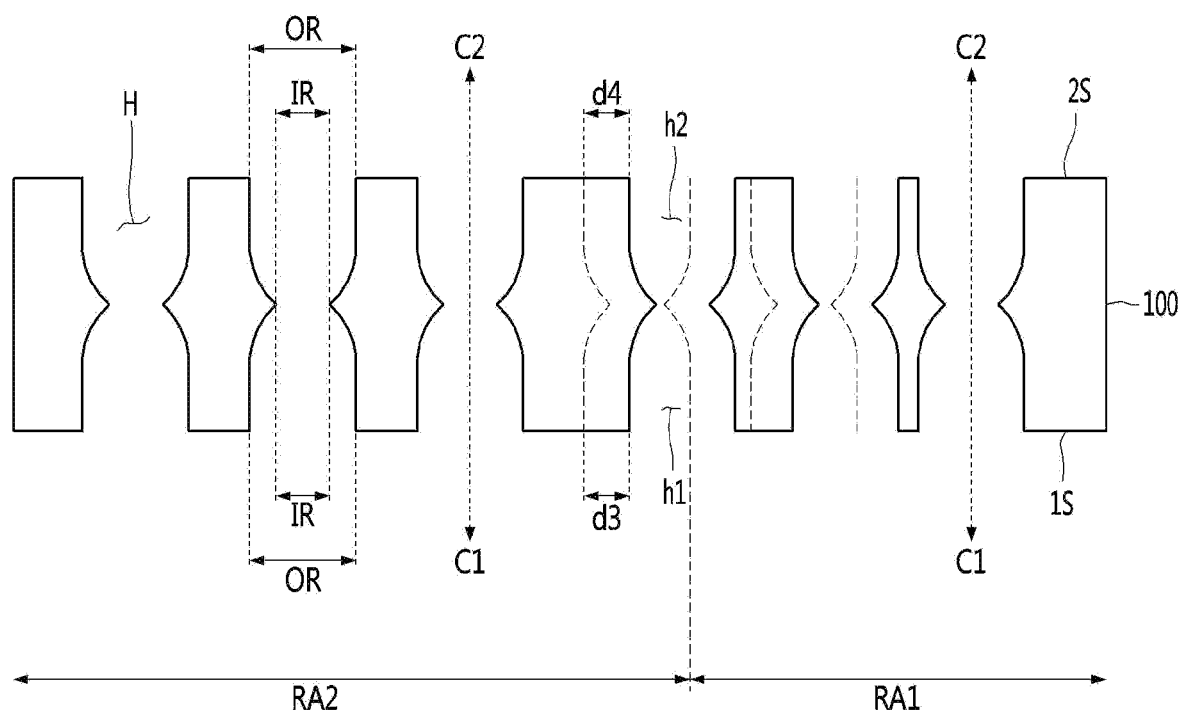

[FIG. 27]
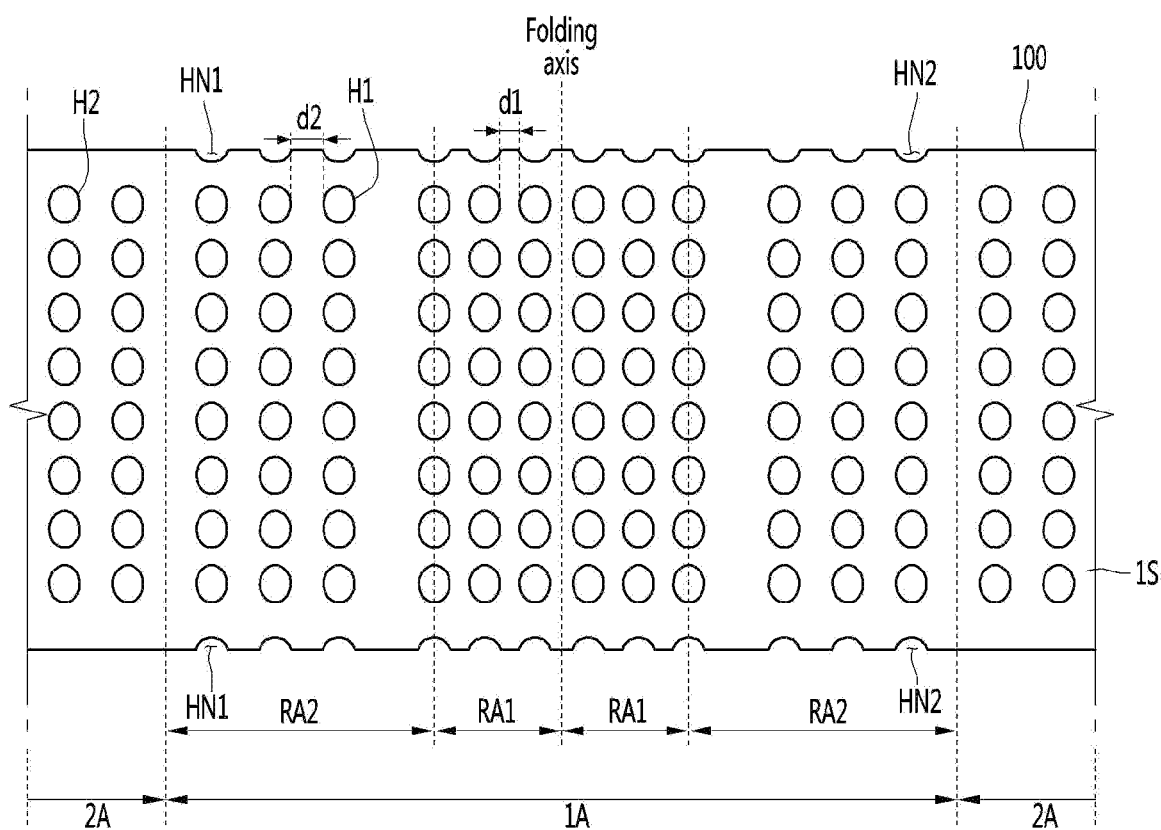

[FIG. 28]
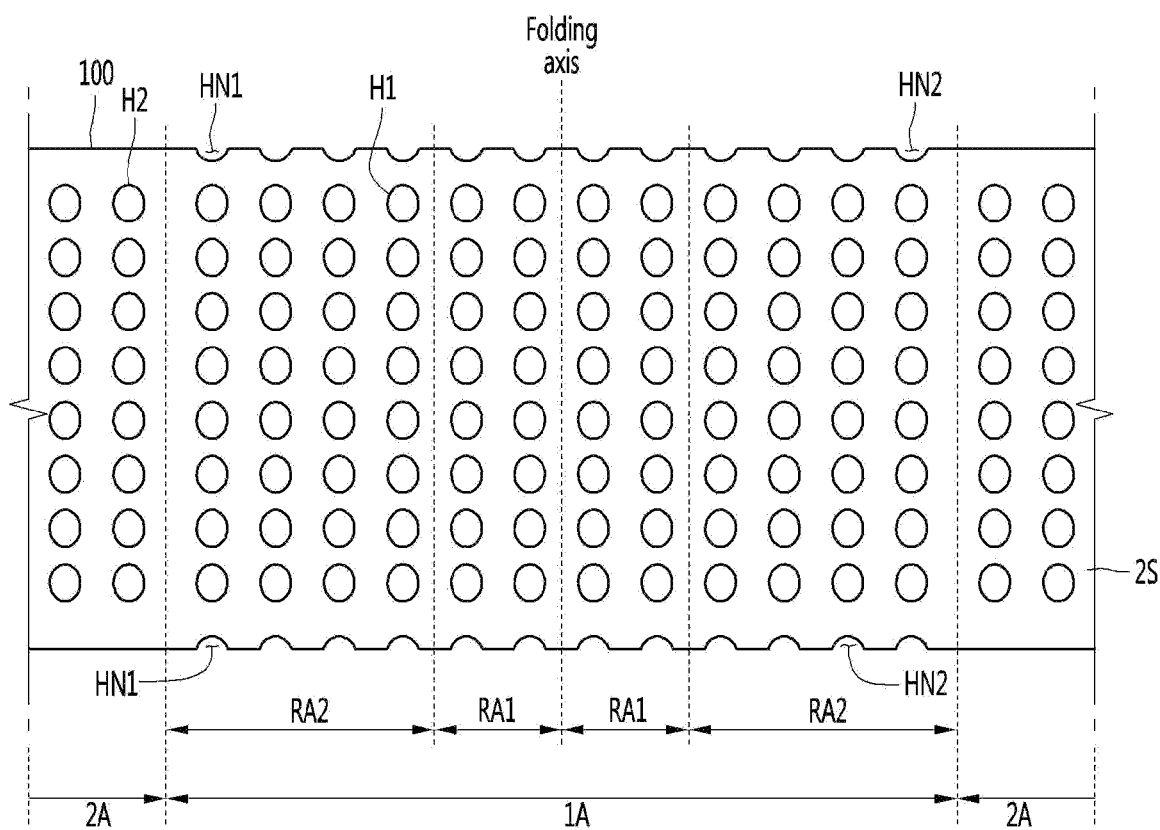

[FIG. 29]
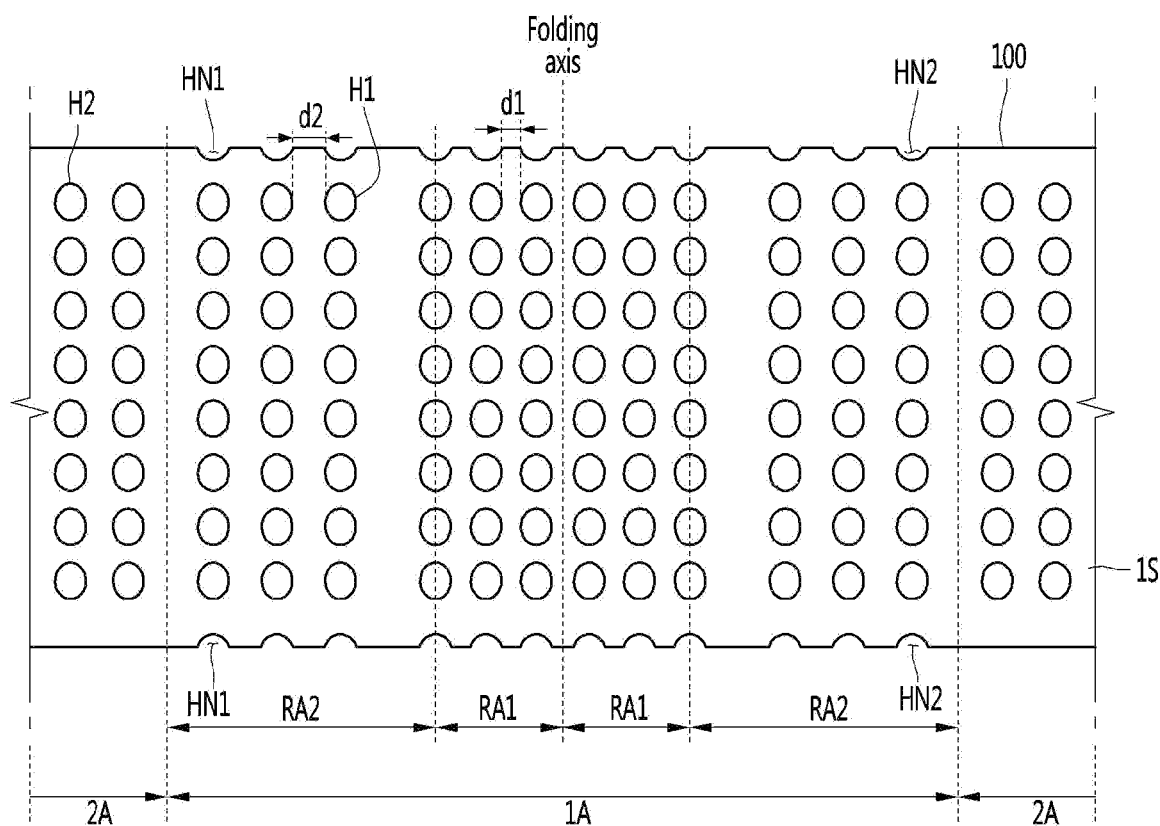

[FIG. 30]
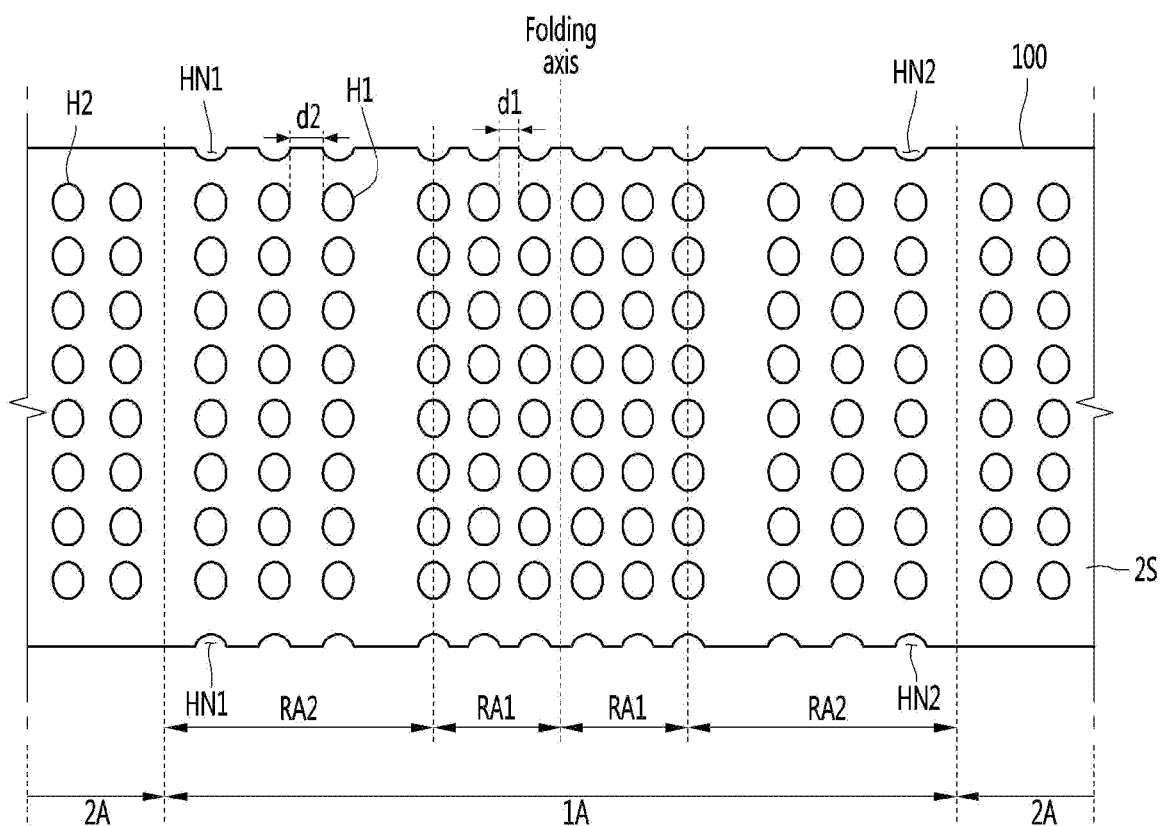

[FIG. 31]
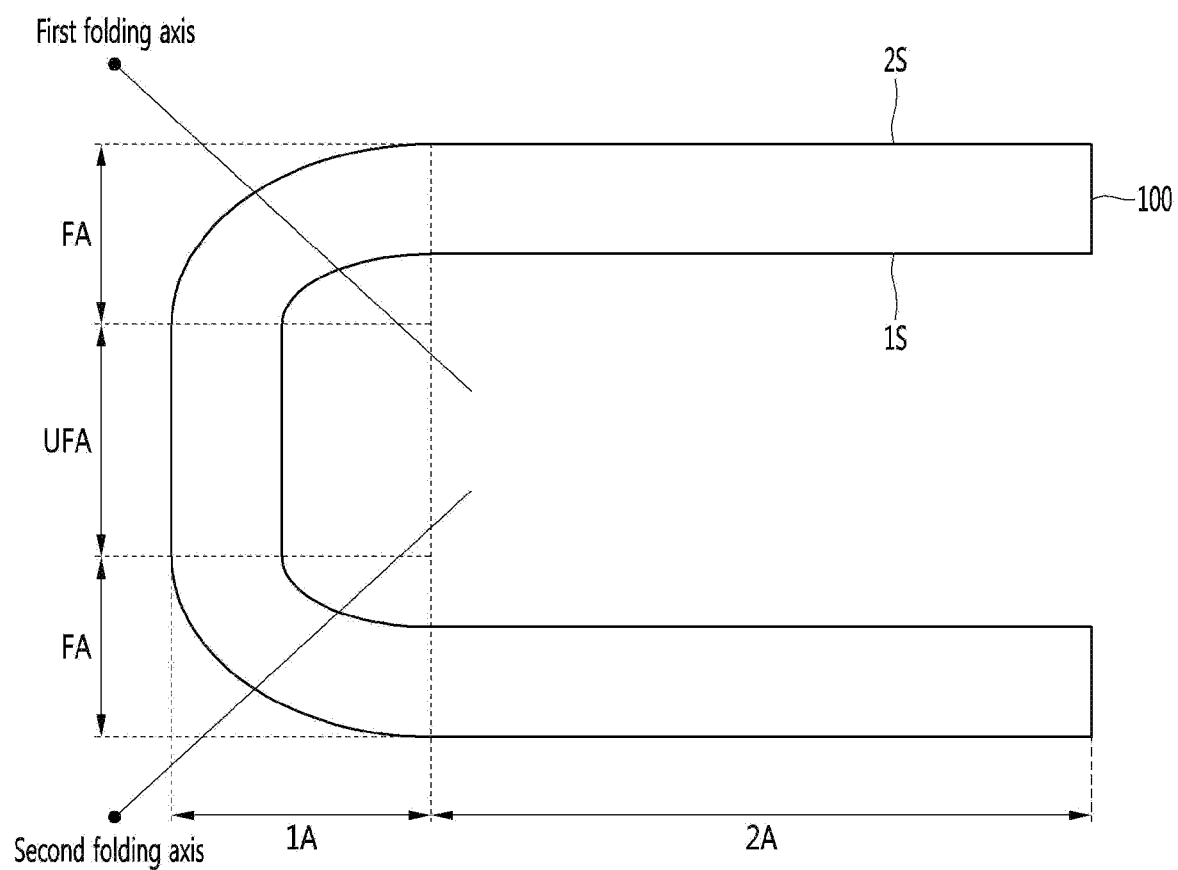

[FIG. 32]
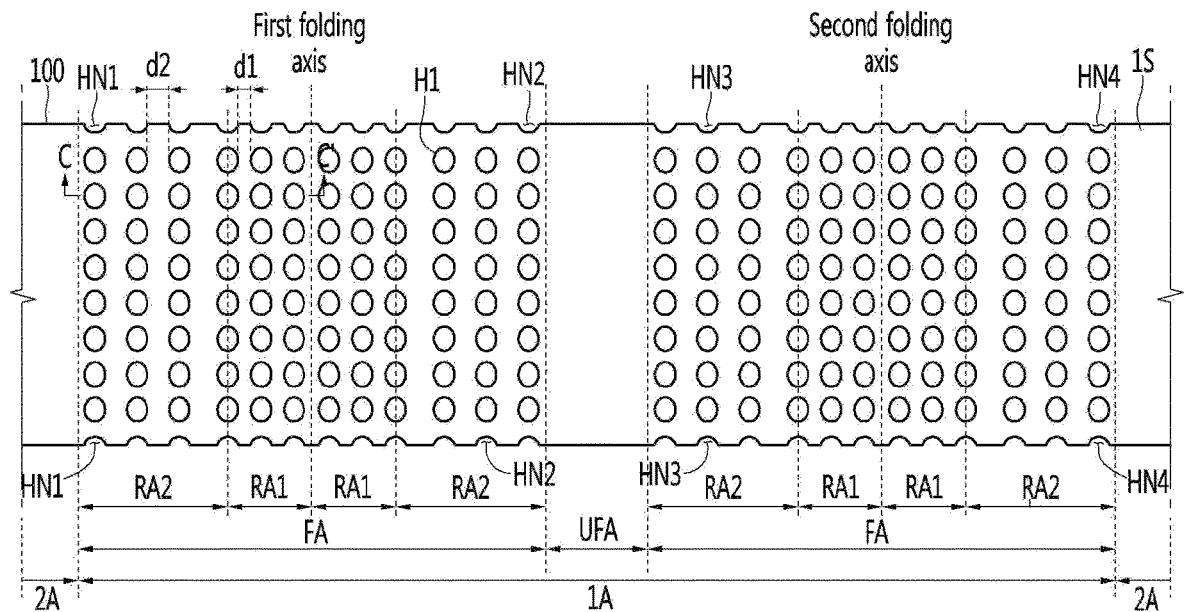
[FIG. 33]
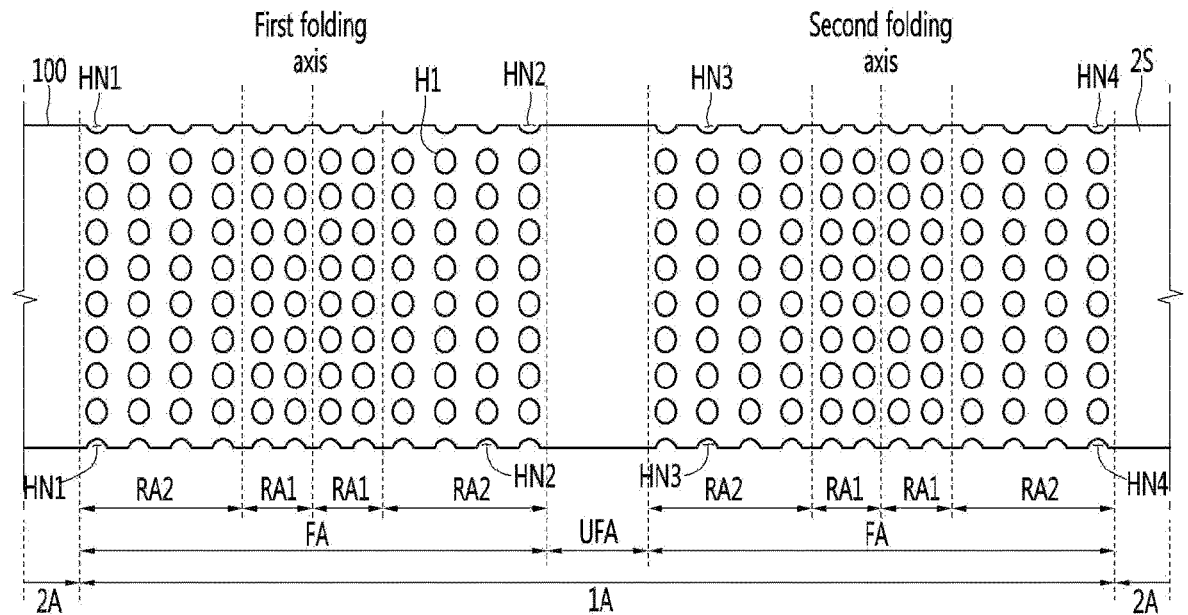

[FIG. 34]
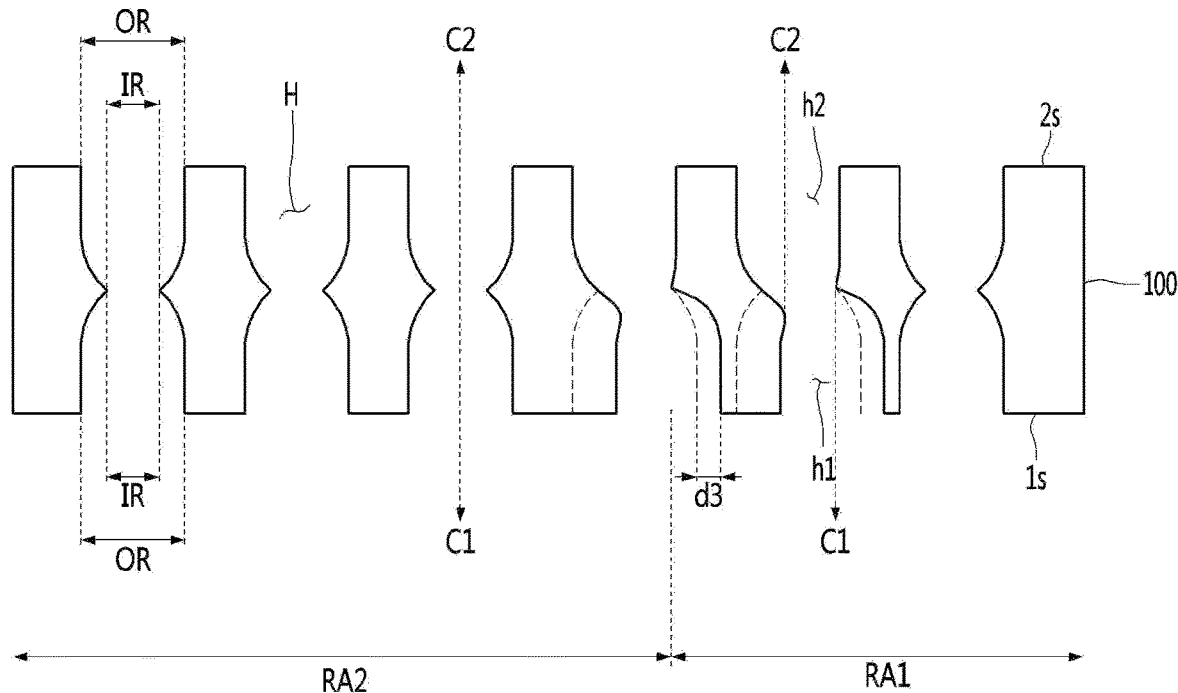
[FIG. 35]
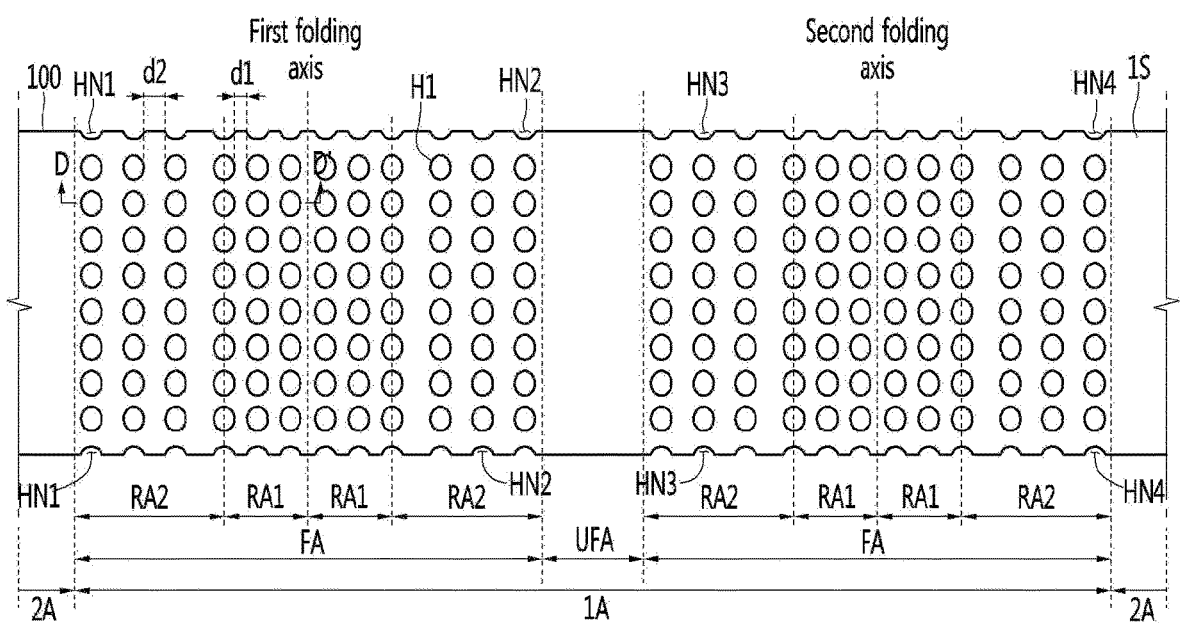

[FIG. 36]
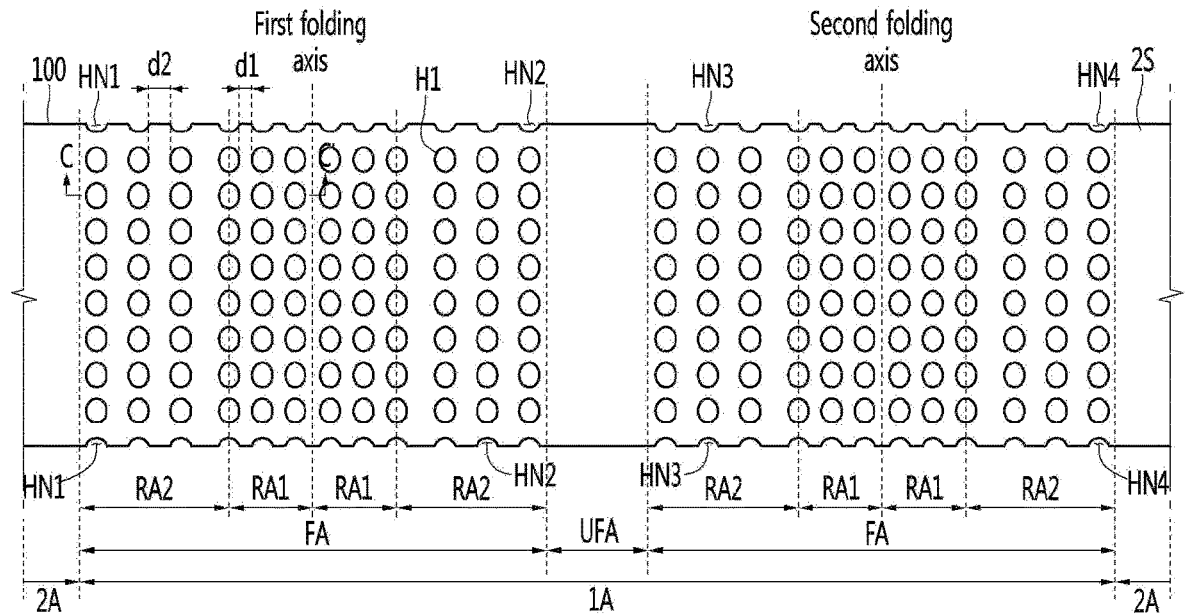
[FIG. 37]
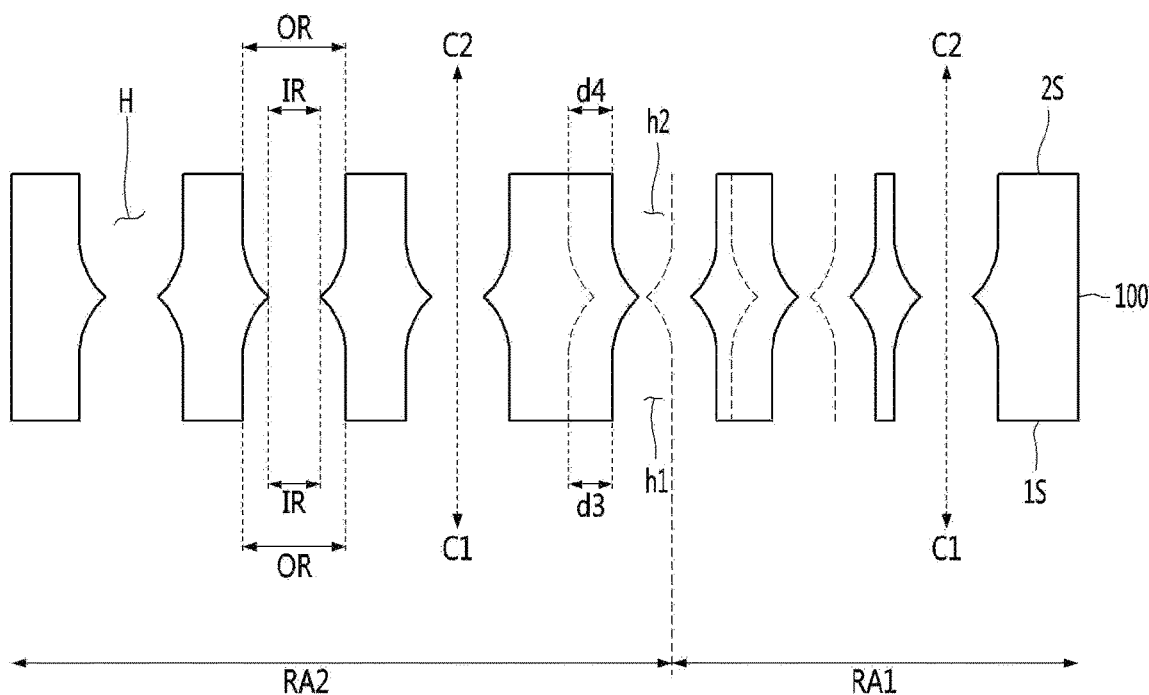

[FIG. 38]
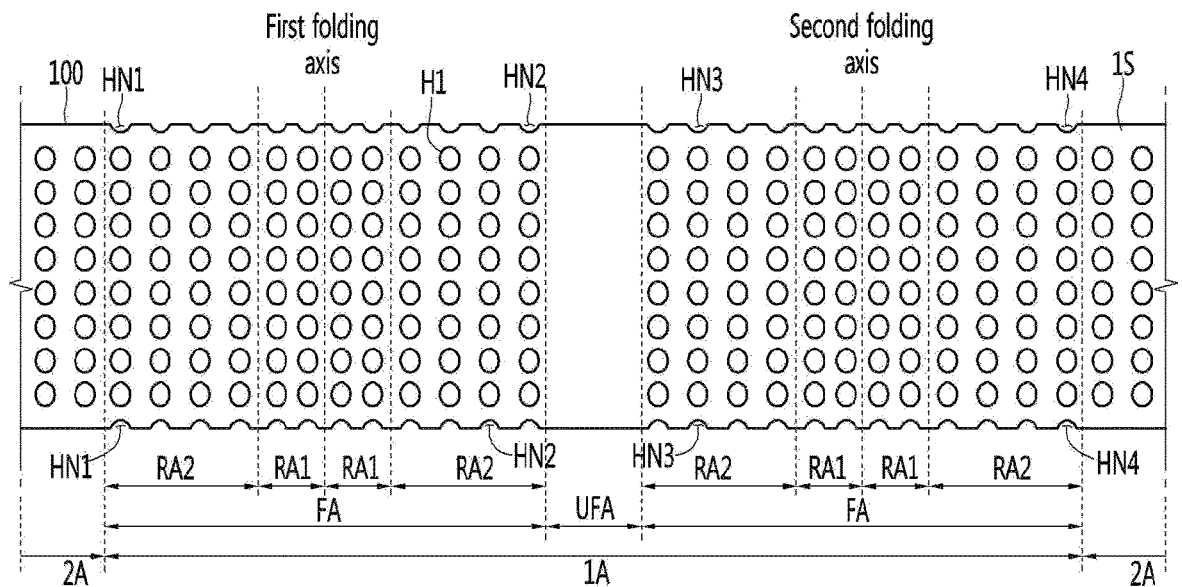
[FIG. 39]
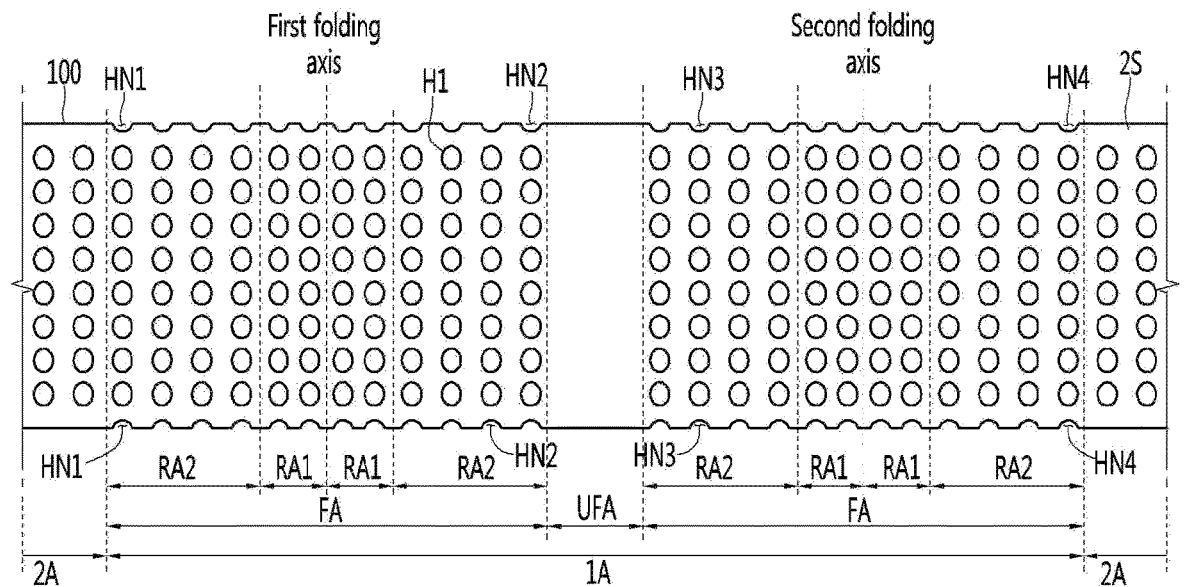

[FIG. 40]
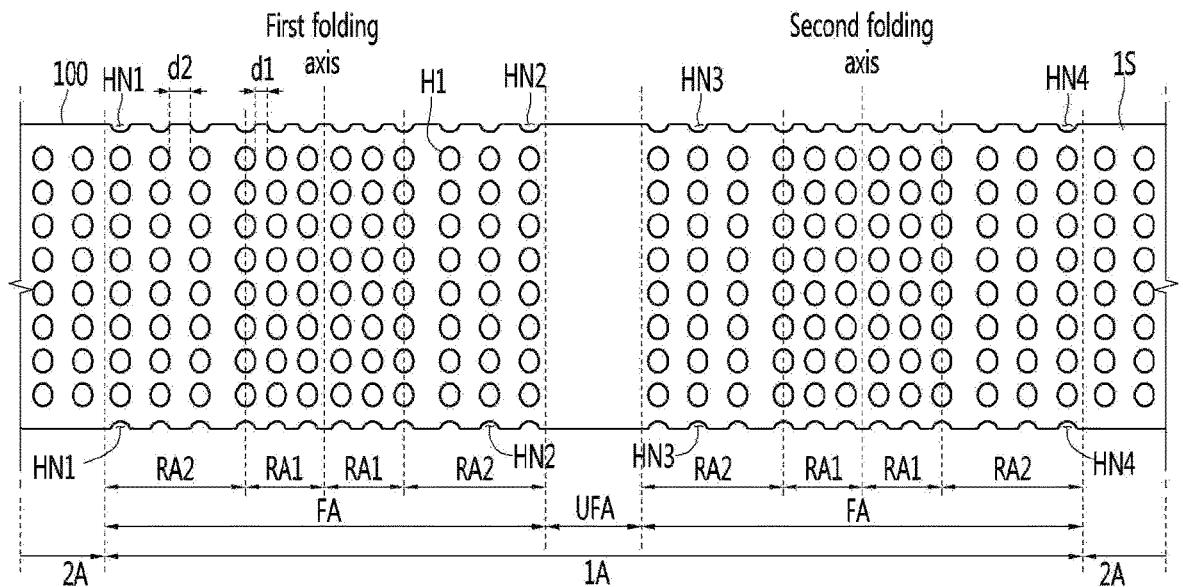
[FIG. 41]
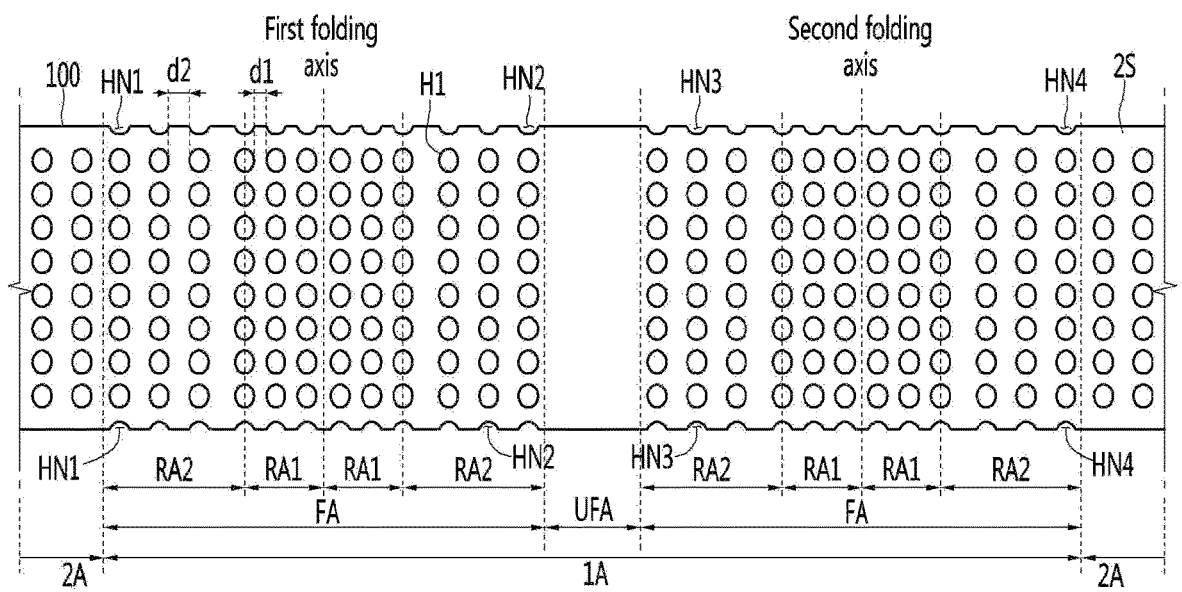

[FIG. 42]
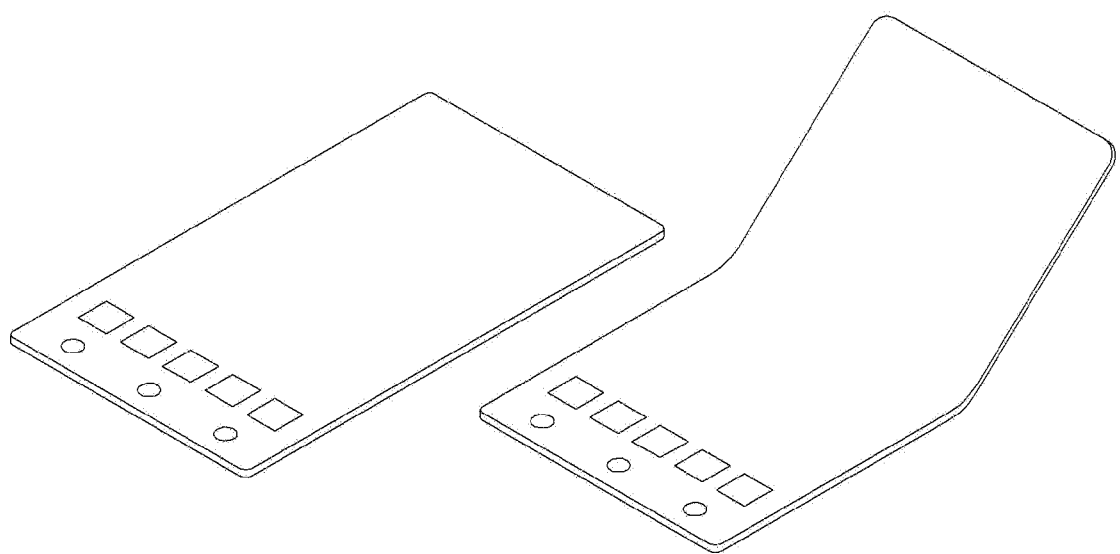

US 12,011,907 B2

SUBSTRATE FOR DISPLAY

CROSS-REFERENCE TO RELATED PATENT APPLICATIONS

This application is a U.S. National Stage Application under 35 U.S.C. § 371 of PCT Application No. PCT/KR2020/000458, filed Jan. 10, 2020, which claims priority to Korean Patent Application Nos. 10-2019-0003792 and 10-2019-0003813, filed Jan. 11, 2019, whose entire disclosures are hereby incorporated by reference.

TECHNICAL FIELD

Embodiments relate to a substrate for a display.

BACKGROUND

Recently, there is an increasing demand for a flexible display device capable of easily carrying various applications and displaying an image on a large screen when being carried.

Such a flexible display is folded or partially bent when being carried or stored, but may be implemented with the display unfolded when displaying images. Accordingly, the image display region may be increased, and a user may easily carry it.

Such a flexible display device may be repeatedly folded or bent, and then a restoration process of unfolding it again may be repeated.

Accordingly, a base material of the display device requires strength and elasticity, and cracks and deformations should not occur in the base material during folding and restoring.

Meanwhile, when the base material of the display device is folded, each folding region may have a different curvature size. Accordingly, depending on the sizes of the different curvatures generated for each region in the folded region, different compressive stresses act on each of the regions.

Specifically, tensile stress occurs on a folded outer surface depending on a folding direction, and may be offset by residual compressive stress, but compressive stress occurs on a folded inner surface, and residual compressive stress and compressive stress act together, and thus the folded inner surface may be damaged or cracked by the compressive stress.

Therefore, in a region in which the compressive stress is large, cracks may occur in the base material during folding, and the curvature size when a substrate is bent is restricted, and thus a degree of folding of the base material, that is, a degree of freedom in design may be decreased.

Therefore, a display substrate having a new structure is required, which may improve reliability and a degree of freedom in design of the display substrate applied to such a flexible display device.

SUMMARY

An embodiment is directed to providing a display substrate having improved reliability and a degree of freedom in design.

A display substrate according to the embodiment includes: a base material having a long direction and a short direction, and including one surface and the other surface, and a first region and a second region; and a hole passing through the one surface and the other surface of the base material, wherein the first region is defined as a folding region in which the one surface is folded to face, the second region is defined as an unfolding region, the hole includes a first hole formed in the first region, and the first hole includes at least three first holes having different sizes in the long direction of the base material.

In addition, a display substrate according to an embodiment includes: a base material including one surface and the other surface, and a first region and a second region; and a hole passing through the one surface and the other surface of the base material, wherein the first region is defined as a folding region in which the one surface is folded to face, the second region is defined as an unfolding region, the hole includes a plurality of first holes formed in the first region, each of the plurality of first holes includes a first through-hole formed in the one surface and a second through-hole formed in the other surface, and the first region includes a region in which a distance between centers of two adjacent first through holes among the plurality of first holes is different.

In addition, a display substrate according to an embodiment includes: a base material including one surface and the other surface, and a first region and a second region; and a hole passing through the one surface and the other surface of the base material, wherein the first region includes a folding region and an unfolding region in which the one surface is folded to face, the second region includes an unfolding region, the hole includes a plurality of first holes formed in the folding region of the first region, the plurality of first holes includes a first through-hole formed in the one surface and a second through-hole formed in the other surface, and the first region includes a region in which a distance between centers of two adjacent first through holes of the plurality of first holes is different.

BRIEF DESCRIPTION OF THE DRAWINGS

FIG. 1 is a perspective view of a display substrate according to an embodiment.

FIG. 2 is a view illustrating a side surface view of a display substrate according to a first embodiment.

FIG. 3 is a view illustrating a top view of one surface of the display substrate according to the first embodiment.

FIG. 4 is a view illustrating a top view of the other surface of the display substrate according to the first embodiment.

FIG. 5 is a view illustrating another top view of the one surface of the display substrate according to the first embodiment.

FIG. 6 is a view illustrating another top view of the other surface of the display substrate according to the first embodiment.

FIGS. 7 to 10 are views illustrating still another top views of the one surface and the other surface of the display substrate according to the first embodiment.

FIG. 11 is a view illustrating a side surface view of a display substrate according to a second embodiment FIG. 12 is a view illustrating a top view of one surface of the display substrate according to the second embodiment.

FIG. 13 is a view illustrating a top view of the other surface of the display substrate according to the second embodiment.

FIG. 14 is a view illustrating another top view of the one surface of the display substrate according to the second embodiment.

FIG. 15 is a view illustrating another top view of the other surface of the display substrate according to the second embodiment.

FIGS. 16 to 19 are views illustrating still another top views of the one surface and the other surface of the display substrate according to the second embodiment.

FIG. 20 is a view illustrating a side surface view of a display substrate according to a third embodiment FIG. 21 is a view illustrating a top view of one surface of the display substrate according to the third embodiment.

FIG. 22 is a view illustrating a top view of the other surface of the display substrate according to the third embodiment.

FIG. 23 is a view illustrating a cross-sectional view taken along line A-A' of FIG. 21.

FIG. 24 is a view illustrating another top view of the one surface of the display substrate according to the third embodiment.

FIG. 25 is a view illustrating another top view of the other surface of the display substrate according to the third embodiment.

FIG. 26 is a view illustrating a cross-sectional view taken along line B-B' of FIG. 24.

FIGS. 27 to 30 are views illustrating still another top views of the one surface and the other surface of the display substrate according to the third embodiment.

FIG. 31 is a view illustrating a side surface view of a display substrate according to a fourth embodiment FIG. 32 is a view illustrating a top view of one surface of the display substrate according to the fourth embodiment.

FIG. 33 is a view illustrating a top view of the other surface of the display substrate according to the fourth embodiment.

FIG. 34 is a view illustrating a cross-sectional view taken along line C-C' of FIG. 32.

FIG. 35 is a view illustrating another top view of the one surface of the display substrate according to the fourth embodiment.

FIG. 36 is a view illustrating another top view of the other surface of the display substrate according to the fourth embodiment.

FIG. 37 is a view illustrating a cross-sectional view taken along line D-D' of FIG. 35.

FIGS. 38 to 41 are views illustrating still another top views of the one surface and the other surface of the display substrate according to the fourth embodiment.

FIG. 42 is a view for describing an example in which a display substrate according to embodiments is applied.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a display substrate according to a first embodiment will be described with reference to drawings.

Referring to FIGS. 1 to 8, a display substrate according to a first embodiment includes a base material 100.

The base material 100 may include metals, metal alloys, plastics, composite materials (e.g., carbon fiber reinforced plastics, magnetic or conductive materials, glass fiber reinforced materials, etc.), ceramics, sapphire, glass, and the like.

As described above, in case of the base material 100 having rigidity, when bending it in one direction, a problem that the base material 100 is damaged while being folded or bent due to a tensile stress or a compressive stress generated by bending may occur.

In addition, a curvature of a folding region is limited by the tensile stress or the compressive stress generated when the base material 100 is bent in one direction, and thus a problem that a degree of freedom in design of the base material is lowered may occur.

The display substrate according to an embodiment may prevent the base material from being damaged by such folding or bending, and the degree of freedom in design may be improved by relaxing restriction according to the curvature.

Referring to FIG. 1, the base material 100 may be bent in one direction.

Specifically, the base material 100 may include one surface 1S and the other surface 2S opposite to the one surface 1S. In the base material 100, the one surface 1S or the other surface 2S may be bent to face each other.

In a following description, as shown in FIG. 1, the base material 100 will be described with respect to bending in a direction in which the one surfaces 1S face each other.

In the base material 100, a first region 1A and a second region 2A may be defined. The first region 1A and the second region 2A may be regions defined when the base material 100 is bent in the direction in which the one surfaces 1S face each other.

Specifically, the base material 100 is bent in one direction, and the base material 100 may be divided into the first region 1A which is a folded region (folding region) and the second region 2A which is an unfolded region (unfolding region).

Specifically, referring to FIGS. 3 to 10, the base material 100 may include a first region 1A that is a region in which the base material 100 is bent. The base material 100 may include a second region 2A that is not bent and is disposed adjacent to the first region 1A.

For example, the second region 2A may be formed on the left side and the right side of the first region 1A with respect to the direction in which the base material 100 is bent.

The first region 1A and the second region 2A may be formed on the same base material 100. That is, the first region 1A and the second region 2A are not separated on the same base material 100, and may be formed integrally with each other.

A size of the first region 1A and that of the second region 2A may be different from each other. Specifically, the size of the second region 2A may be larger than that of the first region 1A.

The drawings illustrate that the first region 1A is positioned in a central portion of the base material 100, but the embodiment is not limited thereto. That is, the first region 1A may be positioned in one end and an end region of the base material 100. That is, the first region 1A may be positioned at one end and the end region of the base material 100 such that the size of the second region 2A is asymmetric.

Holes may be formed in the first region 1A. Specifically, the first region 1A may be formed with a plurality of first holes H1 that are spaced apart from each other. The first hole H1 may be formed passing through the base material 100. Specifically, the first hole H1 may be formed passing through one surface 1S and the other surface 2S of the base material 100.

That is, the first hole H1 may be formed passing through the one surface 1S positioned inside a folding direction and the other surface 2S disposed outside the folding direction.

The first holes H1 may be formed in a regular pattern in the first region 1A. Alternatively, the first holes H1 may be formed in an irregular pattern in the first region 1A.

The first hole H1 may be formed while having a curved surface. In detail, the first hole H1 may be formed in a shape having a curved surface such as an elliptical shape, a hemispherical shape, a circular shape, or the like.

However, the embodiment is not limited thereto, and the first hole H1 may be formed in a polygonal shape such as a triangle, a quadrangle, or the like.

FIG. 2 is a view illustrating a side surface view of a display substrate according to a first embodiment.

Referring to FIG. 2, the substrate 100 may be folded in one direction. In detail, the one surface 1S may be folded in a direction facing each other.

A first region 1A and a second region 2A may be formed in the base material 100 by folding the base material 100 in one direction. That is, the base material 100 may be formed with a folding region formed by folding the base material 100 in one direction and an unfolding region positioned at both ends of the folding region.

The folding region may be defined as a region in which a curvature R is formed, and the unfolding region may be defined as a region in which a curvature R is not formed or a curvature is close to zero.

Referring to FIG. 2, the base material 100 is folded in one direction, and may be formed in the order of an unfolding region, a folding region, an unfolding region.

The display substrate according to the embodiment may improve reliability and a degree of freedom in design of the display substrate by changing a size and proportion of a hole formed in the folding region.

FIGS. 3 and 4 are views illustrating one surface and the other surface of the display substrate according to the third embodiment. That is, FIG. 3 is a view illustrating a top view of a folded inner surface when the base material 100 is folded, and FIG. 4 is a view illustrating a top view of a folded outer surface when the base material 100 is folded.

Referring to FIG. 3, a first region 1A and a second region 2A may be formed in the base material 100. That is, the base material 100 may be formed with a folding region formed by folding the base material 100 in one direction and an unfolding region positioned at both ends of the folding region. That is, the first region 1A may be a folding region, and the second region 2A may be an unfolding region.

The base material 100 may have a length in a long direction and a length in a short direction.

The second region 2A may extend from the first region 1A, and the second region 2A may be positioned in the outer periphery of the base material 100 based on the length in the long direction of the base material 100.

The folding region may be defined as a region in which a curvature R is formed, and the unfolding region may be defined as a region in which a curvature R is not formed or a curvature is close to zero.

The folding region may be defined as a region between the first hinge portion HN1 and the second hinge portion HN2.

Specifically, the hinge portions may be defined as a point in which folding of the base material 100 is started. That is, the folding is started at the first hinge portion HN1 and the second hinge portion HN2, and the base material 100 may be folded in a direction in which one surface 1S of the base material 100 faces.

The first hinge portion HN1 and the second hinge portion HN2 may be positioned in an end region of the base material 100. In detail, the first hinge portion HN1 and the second hinge portion HN2 may be positioned at both end regions in a short direction among the end regions of the base material 100.

In addition, the first hinge portion HN1 and the second hinge portion HN2 may be formed by passing through the both end regions in the short direction of the base material 100. That is, the first hinge portion HN1 and the second hinge portion HN2 may be defined as a hole h formed by passing through the both end regions in the short direction of the base material 100.

That is, the first hinge portion HN1 and the second hinge portion HN2 are formed between the first region 1A and the second region 2A, and may be defined as a hole formed by opening the end region in the short direction of the base material 100.

A shape of the hole h may be the same as or different from a shape of the first hole H1. For example, the hole h may be formed while having a curved surface. In detail, the hole h may be formed in a shape having a curved surface such as an elliptical shape, a hemispherical shape, or a circular shape, or the like.

However, the embodiment is not limited thereto, and the hole h may be formed in a polygonal shape such as a triangle or a quadrangle, or the like.

Referring to FIG. 3, the first hole H1 may be formed in the first region 1A between the first hinge portion HN1 and the second hinge portion HN2, that is, the folding region The first hole H1 may include a plurality of holes having different sizes in the folding region. In detail, the first hole H1 may include at least three or more holes having different sizes in a long direction of the base material in the folding region.

In FIG. 3 and following drawings, three holes having different sizes are illustrated, but the embodiment is not limited thereto, and less than three or more than three holes according to a change in a curvature size may be included.

For example, the first hole H1 may include a first through-hole H1-1, a second through-hole H1-2, and a third through-hole H1-3 disposed in the folding region. The first through-hole H1-1, the second through-hole H1-2, and the third through-hole H1-3 may be formed in different sizes.

Specifically, the first region 1A of the base material 100 may include regions having different curvature sizes. Here, the curvature size refers to a degree of bending of the base material. That is, the curvature size may increase as the base material is bent a lot.

Specifically, the first region of the base material may include a first folding region 1-1A having a first curvature R1, a second folding region 1-2A having a second curvature R2, and a third folding region 1-3A having a third curvature R3.

The first curvature R1, the second curvature R2, and the third curvature R3 may have a size of about 1 µm to 2 µm.

The first through-hole H1-1, the second through-hole H1-2, and the third through-hole H1-3 may be formed in the first folding region 1-1A, the second folding region 1-2A, and the third folding region 1-3A, respectively.

In this case, the first through-hole H1-1, the second through-hole H1-2, and the third through-hole H1-3 may be formed at different proportions. Here, a size of a hole may be defined as a diameter or an area of the hole.

That is, when the hole is formed in a circular shape, the size of the hole may be defined as a size of an outer diameter of the hole, that is, the maximum diameter in a long direction of one surface or the other surface in which the holes are formed.

Alternatively, when the hole is formed in a shape other than a circular shape, the size of the hole is defined as the size of the outer diameter of the hole, that is, an area of the hole measured on one surface or the other surface in which the holes are formed.

Hereinafter, a case in which the hole is formed in a circular shape will be mainly described.

Specifically, the sizes of the first through-hole H1-1, the second through-hole H1-2, and the third through-hole H1-3 may vary depending on the curvature sizes of the first folding region 1-1A, the second folding region 1-2A, and the third folding region 1-3A.

Specifically, the size of the first through-hole H1-1, the second through-hole H1-2, and the third through-hole H1-3 may be proportional to the curvature size. That is, a size of the first hole may be large in a region in which the curvature is large, and the size of the first hole may be small in a region in which the curvature is small.

Accordingly, the display substrate according to the first embodiment, when the base material is in the folded state, minimizes a distribution of compressive stress that is changed depending on the curvature size, thereby realizing the display substrate with improved folding reliability.

That is, in a region with a large curvature, a size of a hole that may disperse the compressive stress is formed larger than that in a region with a small curvature, thereby more effectively dispersing the compressive stress.

Meanwhile, a difference between the maximum diameters of the first holes H1 may satisfy the following Equation 1.

$$0.8t \leq \text{difference between maximum diameters of first holes H1} \leq 1.1t \quad \text{[Equation 1]}$$

(where t is a thickness of a base material)

That is, the sizes of the first through-hole H1-1, the second through-hole H1-2, and the third through-hole H1-3 may be changed to 0.8 times to 1.1 times the thickness of the base material.

Meanwhile, the thickness t of the base material 100 may be about 0.01 mm to 2 mm. When the thickness of the base material 100 is less than about 0.1 mm, it is easy to fold or bend the base material 100, but rigidity of the base material 100 is reduced, and thus it may be easily damaged by an external impact. When the thickness of the base material 100 exceeds about 2 mm, stress is greatly generated due to the thickness of the base material 100 when the base material 100 is folded or bent, and thus the base material may be damaged, or a bending size, that is, a curvature of the base material may be limited.

When the difference between the maximum diameters of the first holes H1 is less than 0.8 times the thickness of the base material, the compressive stress according to the curvature size may not be effectively dispersed, thereby deteriorating the reliability. When the difference between the maximum diameters of the first holes H1 is more than 1.1 times the thickness of the base material, strength of the base material 100 may be lowered.

In addition, a difference between the maximum value and the minimum value of the first holes H1 may satisfy the following Equation 2.

$$0.2t \leq \text{difference between maximum value and minimum value of first holes H1} \quad \text{[Equation 2]}$$

(where t is a thickness of a base material)

When the difference between the maximum value and the minimum value of the first holes H1 is less than 0.2 times the thickness of the base material, the compressive stress according to the curvature size may not be effectively dispersed, thereby deteriorating the reliability.

FIG. 4 is a view illustrating a top view of the other surface of the base material 100. That is, it is a view illustrating a top view of the outside of a folding direction, not the inside thereof.

Referring to FIG. 4, since the first hole H1 is formed passing through one surface and the other surface of the base material 100, the first hole H1 formed on the other surface of the base material 100 may be also formed in the first region between the first hinge portion HN1 and the second hinge portion HN2, that is, the folding region, similar to a position of the first hole H1 formed on the one surface.

A size of the first hole H1 formed in the other surface may be formed to be the same, unlike the first hole formed on the one surface.

That is, the other surface is a folded outer surface of the base material and unlike the inner surface, no compressive stress occurs. Therefore, the size of the first hole formed on the other surface is not changed according to the curvature size, and may be formed to be the same.

However, the embodiment is not limited thereto, and the size of the first hole may be differently formed on the other surface of the base material according to the curvature size, like the above-described one surface. Alternatively, the first hole is not formed on the other surface of the base material, but a groove may be formed on the one surface, corresponding to a shape and size of the first hole.

In addition, in the first hole H1, a size of an outer diameter formed on the one surface and a size of an outer diameter formed on the other surface may be different from each other.

For example, in the first hole H1, the size of the outer diameter formed on the other surface may be smaller than that of the outer diameter formed on the one surface. Accordingly, when the base material 100 is folded in a direction in which the one surface faces each other, a size of an outer diameter formed on a folded inner surface is larger than that of an outer diameter formed on a folded outer surface, and thus the base material 100 may be easily folded.

That is, in the other surface, since the size of the first hole is small, surface stress of a remaining base material is increased, and accordingly, the other surface of the base material has a large expanding property. In addition, in the one surface, since the size of the first hole is large, the surface stress of the remaining base material is relatively small, and accordingly, the one surface of the base material has a large shrinking property.

Therefore, when the base material 100 is folded in the direction in which the one surface faces each other, the base material 100 may be easily folded by making the size of the first hole of the one surface relatively large.

Meanwhile, in the display substrate according to the first embodiment, not the size of the first hole in the folding region but a proportion of the first hole may be changed.

Referring to FIGS. 14 and 15, the first hole H1 may be formed in the first region between the first hinge portion HN1 and the second hinge portion HN2, that is, the folding region FA.

The first holes H1 may be formed at different proportions in each of the folding regions. Specifically, the folding region may include at least three or more regions having different first hole proportions in a long direction of the base material.

In FIG. 5 and following drawings, three holes having different proportions are illustrated, but the embodiment is not limited thereto, and less than three or more than three holes according to a change in a curvature size may be included.

Here, the proportion of the first holes may be defined as a formation area of the first holes per unit area, and the first hole proportion may increase as the formation area of the first hole increases. That is, that the proportion of the first holes is large may also be defined as "the number of first holes is large" or "the size of the first holes is large".

For example, the first hole H1 may include a first through-hole H1-1, a second through-hole H1-2, and a third through-hole H1-3 disposed in the folding region. The first through-hole H1-1, the second through-hole H1-2, and the third through-hole H1-3 may be formed at different proportions.

Specifically, a first region of the base material 100 may include regions having different curvature sizes. In detail, the first region of the base material may include a first folding region 1-1A having a first curvature R1, a second folding region 1-2A having a second curvature R2, and a third folding region 1-3A having a third curvature R3.

The first curvature R1, the second curvature R2, and the third curvature R3 may have a size of about 1 μm to 2 μm.

The first through-hole H1-1, the second through-hole H1-2, and the third through-hole H1-3 may be formed in the first folding region 1-1A, the second folding region 1-2A, and the third folding region 1-3A, respectively.

In this case, the first through-hole H1-1, the second through-hole H1-2, and the third through-hole H1-3 may be formed at different proportions. In detail, the proportions of the first through-hole H1-1, the second through-hole H1-2, and the third through-hole H1-3 may vary depending on the curvature sizes of the first folding region 1-1A, the second folding region 1-2A, and the third folding region 1-3A.

Specifically, the proportions of the first through-hole H1-1, the second through-hole H1-2, and the third through-hole H1-3 may be proportional to the curvature size. That is, a proportion of the first hole may be large in a region in which the curvature is large, and the proportion of the first hole may be small in a region in which the curvature is small.

Accordingly, in the display substrate according to the embodiment, the display substrate with improved folding reliability may be realized by minimizing a distribution of compressive stress that is changed depending on the curvature size when the base material is in a folded state.

That is, in a region with a large curvature, a proportion of the hole that may disperse the compressive stress is formed larger than that in with a small curvature, thereby more effectively dispersing the compressive stress.

FIG. 6 is a view illustrating a top view of the other surface of the base material 100. That is, it is a view illustrating a top view of the outside of a folding direction, not the inside thereof.

Referring to FIG. 6, since the first hole H1 is formed passing through one surface and the other surface of the base material 100, the first hole H1 formed on the other surface of the base material 100 may be also formed in the first region 1A between the first hinge portion HN1 and the second hinge portion HN2, that is, the folding region, similar to a position of the first hole H1 formed on the one surface.

A size of the first hole H1 formed on the other surface may be formed in the same proportion, unlike the first hole formed on the one surface.

Accordingly, the first holes formed on the one surface may be partially formed passing through the other surface, and partially formed passing through only the one surface. For example, H1-3' corresponding to H1-3 in FIG. 5 may be formed as a hole passing through H1-3, and H1-3" may be formed as a groove on the other surface of the display substrate.

That is, the other surface is a folded outer surface of the base material and unlike the inner surface, no compressive stress occurs. Therefore, the proportion of the first hole formed on the other surface is not changed according to the curvature size, and may be the same.

However, the embodiment is not limited thereto, and the proportion of the first hole may be differently formed on the other surface of the base material according to the curvature size, like the above-described one surface. Alternatively, the first hole is not formed on the other surface of the base material, but a groove may be formed only on the one surface, like a shape and size of the first hole.

In addition, in the first hole H1, the proportion of the first hole formed on the one surface and the proportion of the first hole formed on the other surface may be different from each other.

For example, in the first hole H1, the proportion of the first hole formed on the other surface may be smaller than that of the first hole formed on the one surface. Accordingly, when the base material 100 is folded in a direction in which the one surface faces each other, the proportion of the first hole formed on a folded inner surface is larger than that of the first hole formed on a folded outer surface, and thus the base material 100 may be easily folded.

That is, in the other surface, since the proportion of the first hole is small, surface stress of a remaining base material is increased, and accordingly, the other surface of the base material has a large expanding property. In addition, in the one surface, since the proportion of the first hole is large, the surface stress of the remaining base material is relatively small, and accordingly, the one surface of the base material has a large shrinking property.

Therefore, when the base material 100 is folded in the direction in which the one surface faces each other, the base material 100 may be easily folded by making the proportion of the first hole of the one surface relatively large.

Meanwhile, in the display substrate according to the first embodiment, a hole may also be formed in the unfolding region.

Referring to FIGS. 7 to 10, in a display substrate, holes may be formed in a second region of a base material 100.

Specifically, the base material 100 may include a first region 1A and a second region 2A, and a first hole H1 may be formed in the first region 1A, and a second hole H2 may be formed in the second region 2A.

Since the first holes H1 formed in the first region 1A are the same as the embodiment described above, a following description is omitted. That is, the first hole of the above-described embodiment with reference to FIGS. 3 to 6 may be combined with the following other embodiments as shown in FIGS. 7 to 10.

A plurality of second holes H2 spaced apart from each other may be formed in the second region 2A.

The second hole H2 may be overlapped with one surface and the other surface of the second region 2A of the base material 100 to be formed passing through the base material 100, or to be formed passing through only one surface.

A size of the second hole H2 may be different from that of the first hole H1. Alternatively, a proportion of the second hole H2 may be different from that of the first hole H1.

Specifically, referring to FIGS. 7 and 8, the size of the second hole H2 may be different from that of the first hole H1. In detail, the size of the second hole H2 may be smaller than that of one of a plurality of first holes having different sizes. Alternatively, referring to FIGS. 9 and 10, the proportion of the second hole H2 may be different from that of the first hole H1. In detail, the proportion of the second hole H2 may be smaller than that of one region of a plurality of regions having different proportions.

Accordingly, it is possible to prevent the second region from bending together when the base material is folded by making the size or proportion of the holes in the second region to be smaller than that of the holes in the first region.

That is, in the display substrate according to FIGS. 7 to 10, holes or grooves may be formed not only in a region that is bent but also in a region that is not bent.

That is, holes or grooves may be formed in all regions of the base material.

Accordingly, it is possible to prevent the display substrate from warping or twisting by reducing a difference between deformation of the first region due to heat and deformation of the second region due to heat.

Specifically, when the difference in deformation due to heat in the first region and the second region is too large, the display substrate may be warped or twisted. Accordingly, cracks may occur in the base material in the boundary region between the first region and the second region.

Accordingly, in the display substrate according to an embodiment, it is possible to prevent damage to the display substrate due to thermal deformation by forming a hole in the second region as well.

Hereinafter, a display substrate according to a second embodiment will be described with reference to FIGS. 11 to 19.

Referring to FIG. 11, the base material 100 may be folded in one direction. In detail, the one surface 1S may be folded in a direction facing each other.

A first region 1A and a second region 2A may be formed on the base material 100 by folding the base material 100 in one direction. That is, the base material 100 may be formed with a first region formed by folding the base material 100 in one direction and a second region positioned at both ends of the first region.

The first region may be a folding region FA and an unfolding region UFA. Further, the second region may be an unfolding region UFA.

That is, the display substrate according to the second embodiment may have two folding axes, and the first region may include both the folding region FA and the unfolding region UFA.

The folding region may be defined as a region in which a curvature R is formed, and the unfolding region may be defined as a region in which the curvature R is not formed or a curvature is close to zero.

That is, the size of the folding region of the display substrate according to the second embodiment may be smaller than the size of the folding region of the display substrate according to the above-described first embodiment.

That is, referring to FIG. 11, the base material 100 is folded in one direction, and may be formed in the order of an unfolding region, a folding region, an unfolding region, a folding region, and an unfolding region.

That is, a design of the display substrate may be freely modified by controlling a size or a proportion of the first hole described below.

FIGS. 12 and 13 are views illustrating one surface and the other surface of the display substrate according to the fourth embodiment. That is, FIG. 12 is a view illustrating a top view of a folded inner surface when the base material 100 is folded, and FIG. 13 is a view illustrating a top view of a folded outer surface when the base material 100 is folded.

Referring to FIG. 12, the base material 100 may be formed with a first region 1A and a second region 2A.

The first region 1A may include a folding region FA and an unfolding region UFA. The folding region FA may be defined as a region in which a curvature R is formed, and the unfolding region UFA may be defined as a region in which a curvature is not formed or a curvature is close to zero.

The folding region of the first region 1A may be defined as a region between a first hinge portion HN1 and a second hinge portion HN2 and a region between a third hinge portion HN3 and a fourth hinge portion HN4. In addition, the unfolding region of the first region 1A may be defined as a region between the second hinge portion HN2 and the third hinge portion HN3.

Specifically, the hinge portions may be defined as a point in which folding of the base material 100 is started. That is, the folding is started at the first hinge portion HN1, the second hinge portion HN2, the third hinge portion HN3, and the fourth hinge portion HN4, and the base material 100 may be folded in a direction in which one surface 1S of the base material 100 faces each other.

The first hinge portion HN1, the second hinge portion HN2, the third hinge portion HN3, and the fourth hinge portion HN4 may be positioned in an end region of the base material 100. In detail, the first hinge portion HN1, the second hinge portion HN2, the third hinge portion HN3, and the fourth hinge portion HN4 may be positioned at both end regions in a short direction among the end regions of the base material 100.

In addition, the first hinge portion HN1, the second hinge portion HN2, the third hinge portion HN3, and the fourth hinge portion HN4 may be formed by passing through both end regions in a short direction among the end regions of the base material 100. That is, the first hinge portion HN1, the second hinge portion HN2, the third hinge portion HN3, and the fourth hinge portion HN4 may be defined as a hole h formed by passing through both end regions in a short direction among the end regions of the base material 100.

That is, the first hinge portion HN1, the second hinge portion HN2, the third hinge portion HN3, and the fourth hinge portion HN4 are formed between the unfolding region of the first region 1A and the second region 2A, and may be defined as a hole formed by opening the end region of the base material 100.

A shape of the hole h may be the same as or different from a shape of the first hole H1. For example, the hole h may be formed while having a curved surface. In detail, the hole h may be formed in a shape having a curved surface such as an elliptical shape, a hemispherical shape, or a circular shape, or the like.

However, the embodiment is not limited thereto, and the hole h may be formed in a polygonal shape such as a triangle or a quadrangle, or the like.

Referring to FIG. 12, the first hole H1 may be formed in the first region 1A between the first hinge portion HN1 and the second hinge portion HN2 and the first region 1A between the third hinge portion HN3 and the fourth hinge portion HN4, that is, the folding region.

The first hole H1 may include a plurality of holes having different sizes in the folding region. In detail, the first hole H1 may include at least three or more holes having different sizes in a long direction of the base material in the folding region.

In FIG. 12 and following drawings, three holes having different sizes are illustrated, but the embodiment is not limited thereto, and less than three or more than three holes having different sizes according to a change in a curvature size may be included.

For example, the first hole H1 may include a first through-hole H1-1, a second through-hole H1-2, and a third through-hole H1-3 disposed in the folding region. The first through-hole H1-1, the second through-hole H1-2, and the third through-hole H1-3 may be formed in different sizes.

Specifically, the folding region FA of the first region 1A of the base material 100 may include regions having different curvature sizes. In detail, the folding region FA of the first region 1A of the base material may include a first folding region 1-1A having a first curvature R1, a second folding region 1-2A having a second curvature R2, and a third folding region 1-3A having a third curvature R3.

The first curvature R1, the second curvature R2, and the third curvature R3 may have a size of about 1 µm to 2 µm.

The first through-hole H1-1, the second through-hole H1-2, and the third through-hole H1-3 may be formed in the first folding region 1-1A, the second folding region 1-2A, and the third folding region 1-3A, respectively.

In this case, the first through-hole H1-1, the second through-hole H1-2, and the third through-hole H1-3 may be formed in different sizes. In detail, the sizes of the first through-hole H1-1, the second through-hole H1-2, and the third through-hole H1-3 may vary depending on the curvature sizes of the first folding region 1-1A, the second folding region 1-2A, and the third folding region 1-3A.

Here, a size of a hole may be defined as a diameter or an area of the hole.

That is, when the hole is formed in a circular shape, the size of the hole may be defined as a size of an outer diameter of the hole, that is, the maximum diameter in a long direction of one surface or the other surface in which the holes are formed.

Alternatively, when the hole is formed in a shape other than a circular shape, the size of the hole is defined as the size of the outer diameter of the hole, that is, an area of the hole measured on one surface or the other surface in which the holes are formed.

Hereinafter, a case in which the hole is formed in a circular shape will be mainly described.

Specifically, the size of the first through-hole H1-1, the second through-hole H1-2, and the third through-hole H1-3 may be proportional to the curvature size. That is, a size of the first hole may be large in a region in which the curvature is large, and the size of the first hole may be small in a region in which the curvature is small.

Accordingly, the display substrate according to the second embodiment, when the base material is in the folded state, minimizes a distribution of compressive stress that is changed depending on the curvature size, thereby realizing the display substrate with improved folding reliability.

Meanwhile, a difference between the maximum diameters of the first holes H1 may satisfy the following Equation 1.

$$0.8t \leq \text{difference between maximum diameters of first holes H1} \leq 1.1t \quad \text{[Equation 1]}$$

(where t is a thickness of a base material)

That is, the sizes of the first through-hole H1-1, the second through-hole H1-2, and the third through-hole H1-3 may be changed to 0.8 times to 1.1 times the thickness of the base material.

Meanwhile, the thickness t of the base material 100 may be about 0.01 mm to 2 mm. When the thickness of the base material 100 is less than about 0.1 mm, it is easy to fold or bend the base material 100, but rigidity of the base material 100 is reduced, and thus it may be easily damaged by an external impact. When the thickness of the base material 100 exceeds about 2 mm, stress is greatly generated due to the thickness of the base material 100 when the base material 100 is folded or bent, and thus the base material may be damaged, or a bending size, that is, a curvature of the base material may be limited.

When the difference between the maximum diameters of the first holes H1 is less than 0.8 times the thickness of the base material, the compressive stress according to the curvature size may not be effectively dispersed, thereby deteriorating the reliability. When the difference between the maximum diameters of the first holes H1 is more than 1.1 times the thickness of the base material, strength of the base material 100 may be lowered.

In addition, a difference between the maximum value and the minimum value of the first holes H1 may satisfy the following Equation 2.

$$0.2t \leq \text{difference between maximum value and minimum value of first holes H1} \quad \text{[Equation 2]}$$

(where t is a thickness of a base material)

When the difference between the maximum value and the minimum value of the first holes H1 is less than 0.2 times the thickness of the base material, the compressive stress according to the curvature size may not be effectively dispersed, thereby deteriorating the reliability.

Meanwhile, a third hole H3 may be formed in the unfolding region of the first region. The third hole H3 may be formed to have the same or a similar size, unlike the first hole H1. For example, the third hole H3 may be formed of holes having a uniform size that is the same as or different from that of the first hole H1.

FIG. 13 is a view illustrating a top view of the other surface of the base material 100. That is, it is a view illustrating a top view of the outside of a folding direction, not the inside thereof.

Referring to FIG. 13, since the first hole H1 is formed passing through one surface and the other surface of the base material 100, the first hole H1 formed on the other surface of the base material 100 may be also formed in the first region between the first hinge portion HN1 and the second hinge portion HN2 and the first region between the third hinge portion HN3 and the fourth hinge portion HN4, that is, the folding region, similar to a position of the first hole H1 formed on the one surface.

A size of the first hole H1 formed in the folding region of the other surface may be formed to be the same, unlike the first hole formed on the one surface.

That is, the other surface is a folded outer surface of the base material and unlike the inner surface, no compressive stress occurs. Therefore, the size of the first hole formed on the other surface is not changed according to the curvature size, and may be formed to be the same.

However, the embodiment is not limited thereto, and the size of the first hole may be differently formed on the other surface of the base material according to the curvature size, like the above-described one surface. Alternatively, the first hole is not formed on the other surface of the base material, but a groove may be formed on the one surface, corresponding to a shape and size of the first hole.

In addition, in the first hole H1, a size of an outer diameter formed on the one surface and a size of an outer diameter formed on the other surface may be different from each other.

For example, in the first hole H1, the size of the outer diameter formed on the other surface may be smaller than that of the outer diameter formed on the one surface. Accordingly, when the base material 100 is folded in a direction in which the one surface faces each other, a size of an outer diameter formed on a folded inner surface is larger than that of an outer diameter formed on a folded outer surface, and thus the base material 100 may be easily folded.

That is, in the other surface, since the size of the first hole is small, surface stress of a remaining base material is increased, and accordingly, the other surface of the base material has a large expanding property. In addition, in the one surface, since the size of the first hole is large, the surface stress of the remaining base material is relatively small, and accordingly, the one surface of the base material has a large shrinking property.

Therefore, when the base material 100 is folded in the direction in which the one surface faces each other, the base material 100 may be easily folded by making the size of the first hole of the one surface relatively large.

Meanwhile, in the display substrate according to the second embodiment, not the size of the first hole in the folding region but a proportion of the first hole may be changed.

Referring to FIGS. 14 and 15, the first hole H1 may be formed in the first region between the first hinge portion HN1 and the second hinge portion HN2 and the first region between the third hinge portion HN3 and the fourth hinge portion HN4, that is, the folding region FA.

The first holes H1 may be formed at different proportions in each of the folding regions. Specifically, the folding region may include at least three or more regions having different first hole proportions in a long direction of the base material.

In FIG. 14 and following drawings, three holes having different proportions are illustrated, but the embodiment is not limited thereto, and less than three or more than three holes having different proportions according to a change in a curvature size may be included.

Here, the proportion of the first holes may be defined as a formation area of the first holes, and the first hole proportion may increase as the formation area of the first hole increases. That is, that the proportion of the first holes is large may also be defined as "the number of first holes is large" or "the size of the first holes is large".

For example, the first hole H1 may include a first through-hole H1-1, a second through-hole H1-2, and a third through-hole H1-3 disposed in the folding region. The first through-hole H1-1, the second through-hole H1-2, and the third through-hole H1-3 may be formed at different proportions.

Specifically, a folding region of a first region of the base material 100 may include regions having different curvature sizes. In detail, the folding region of the first region of the base material may include a first folding region 1-1A having a first curvature R1, a second folding region 1-2A having a second curvature R2, and a third folding region 1-3A having a third curvature R3.

The first curvature R1, the second curvature R2, and the third curvature R3 may have a size of about 1 μm to 2 μm.

The first through-hole H1-1, the second through-hole H1-2, and the third through-hole H1-3 may be formed in the first folding region 1-1A, the second folding region 1-2A, and the third folding region 1-3A, respectively.

In this case, the first through-hole H1-1, the second through-hole H1-2, and the third through-hole H1-3 may be formed at different proportions. In detail, the proportions of the first through-hole H1-1, the second through-hole H1-2, and the third through-hole H1-3 may vary depending on the curvature sizes of the first folding region 1-1A, the second folding region 1-2A, and the third folding region 1-3A.

Specifically, the proportions of the first through-hole H1-1, the second through-hole H1-2, and the third through-hole H1-3 may be proportional to the curvature size. That is, a proportion of the first hole may be large in a region in which the curvature is large, and the proportion of the first hole may be small in a region in which the curvature is small.

Accordingly, in the display substrate according to the embodiment, the display substrate with improved folding reliability may be realized by minimizing a distribution of compressive stress that is changed depending on the curvature size when the base material is in a folded state.

FIG. 15 is a view illustrating a top view of the other surface of the base material 100. That is, it is a view illustrating a top view of the outside of a folding direction, not the inside thereof.

Referring to FIG. 15, since the first hole H1 is formed passing through one surface and the other surface of the base material 100, the first hole H1 formed on the other surface of the base material 100 may be also formed in the first region between the first hinge portion HN1 and the second hinge portion HN2 and the first region between the third hinge portion HN3 and the fourth hinge portion HN4, that is, the folding region, similar to a position of the first hole H1 formed on the one surface.

A size of the first hole H1 formed on the other surface may be formed in the same proportion, unlike the first hole formed on the one surface.

Accordingly, the first holes formed on the one surface may be partially formed passing through the other surface, and partially formed passing through only the one surface.

That is, the other surface is a folded outer surface of the base material and unlike the inner surface, no compressive stress occurs. Therefore, the proportion of the first hole formed on the other surface is not changed according to the curvature size, and may be the same.

However, the embodiment is not limited thereto, and the proportion of the first hole may be differently formed on the other surface of the base material according to the curvature size, like the above-described one surface. Alternatively, the first hole is not formed on the other surface of the base material, but a groove may be formed only on the one surface, like a shape and size of the first hole.

In addition, in the first hole H1, the proportion of the first hole formed on the one surface and the proportion of the first hole formed on the other surface may be different from each other.

For example, in the first hole H1, the proportion of the first hole formed on the other surface may be smaller than that of the first hole formed on the one surface. Accordingly, when the base material 100 is folded in a direction in which the one surface faces each other, the proportion of the first hole formed on a folded inner surface is larger than that of the first hole formed on a folded outer surface, and thus the base material 100 may be easily folded.

That is, in the other surface, since the proportion of the first hole is small, surface stress of a remaining base material is increased, and accordingly, the other surface of the base material has a large expanding property. In addition, in the one surface, since the proportion of the first hole is large, the surface stress of the remaining base material is relatively small, and accordingly, the one surface of the base material has a large shrinking property.

Therefore, when the base material 100 is folded in the direction in which the one surface faces each other, the base material 100 may be easily folded by making the proportion of the first hole of the one surface relatively large.

Meanwhile, in the display substrate according to the second embodiment, a hole may be formed in the unfolding region.

Referring to FIGS. 16 to 19, in a display substrate, holes may be formed in a second region of a base material 100.

Specifically, the base material 100 may include a first region 1A and a second region 2A, and a first hole H1 and a third hole H3 may be formed in the first region 1A, and a second hole H2 may be formed in the second region 2A.

Since the first hole H1 and the third hole H3 formed in the first region 1A are the same as the embodiment described above, a following description is omitted. That is, the first hole and the third hole of the above-described embodiment with reference to FIGS. 12 to 15 may be combined with the following other embodiments.

A plurality of second holes H2 spaced apart from each other may be formed in the second region 2A.

The second hole H2 may be overlapped with one surface and the other surface of the second region 2A of the base material 100, and may be formed passing through the base material 100.

A size of the second hole H2 may be different from sizes of the first hole H1 and the third hole H3. Alternatively, a proportion of the second hole H2 may be different from that of the first hole H1.

Specifically, referring to FIGS. 16 and 17, the size of the second hole H2 may be different from the sizes of the first hole H1 and the third hole H3. In detail, the size of the second hole H2 may be smaller than the size of one of a plurality of first holes having different sizes or the size of the third hole H3.

Alternatively, referring to FIGS. 18 and 19, the proportion of the second hole H2 may be different from the proportion of the first hole H1. In detail, the proportion of the second hole H2 may be different from a proportion of one region of a plurality of regions having different proportions.

Accordingly, it is possible to prevent the second region from bending together when the base material is folded by making the size or proportion of the holes in the second region to be smaller than that of the holes in the first region.

That is, in the display substrate according to FIGS. 16 to 19, holes may be formed not only in the first region but also in the second region that is not bent.

Accordingly, it is possible to prevent the display substrate from warping or twisting by reducing a difference between deformation of the first region due to heat and deformation of the second region due to heat.

Specifically, when the difference in deformation due to heat in the first region and the second region is too large, the display substrate may be warped or twisted. Accordingly, cracks may occur in the base material in the boundary region between the first region and the second region.

Accordingly, in the display substrate according to an embodiment, it is possible to prevent damage to the display substrate due to thermal deformation by forming a hole in the second region as well.

In the display substrate according to the first embodiment, a size and proportion of the hole may be different depending on a degree of folding in the folding region in which the base material is folded, that is, the curvature size.

Accordingly, it is possible to effectively disperse compressive stress that varies for each region in accordance with the curvature size on the folded inner surface.

That is, it is possible to effectively disperse the compressive stress in a portion in which the compressive stress acts greatly by making the size and proportion of the holes different according to the curvature size, that is, a size of the generated compressive stress, and thus, cracks in the base material due to the compressive stress may be prevented.

In addition, restriction according to the curvature size may be reduced by making the size and proportion of the holes different according to the curvature size, and folding may be performed by a curvature to be achieved, and thus a degree of freedom in designing the display substrate may be improved.

Hereinafter, a display substrate according to a third embodiment will be described with reference to FIGS. 20 to 30. In the description of the display substrate according to the third embodiment, the description of the same or similar contents as those of the above-described embodiments will be omitted, and the same reference numerals will be assigned to the same components.

FIG. 20 is a side view of the display substrate according to the third embodiment, and FIGS. 21 and 22 are views illustrating one surface and the other surface of the display substrate according to the third embodiment. That is, FIG. 21 is a view illustrating a top view of a folded inner surface when the base material 100 is folded, and FIG. 22 is a view illustrating a top view of a folded outer surface when the base material 100 is folded.

Referring to FIG. 21, a first region 1A and a second region 2A may be formed in the base material 100. That is, the base material 100 may be formed with a folding region formed by folding the base material 100 in one direction and an unfolding region positioned at both ends of the folding region. That is, the first region 1A may be a folding region, and the second region 2A may be an unfolding region.

The folding region may be defined as a region in which a curvature R is formed, and the unfolding region may be defined as a region in which a curvature R is not formed or a curvature is close to zero.

In addition, the first region 1A and the second region 2A may be divided depending on whether or not a hinge portion is formed. In detail, a plurality of hinge portions may be formed in the first region 1A, and hinge portions may not be formed in the second region 2A.

That is, the folding region may be defined as a region in which a first hinge portion HN1 and a second hinge portion HN2 are formed.

Specifically, the hinge portions may be defined as a point in which folding of the base material 100 is started. That is, the folding is started at the first hinge portion HN1 and the second hinge portion HN2, and the base material 100 may be folded in a direction in which one surface 1S of the base material 100 faces each other.

Such a hinge portion may include a plurality of hinge portions according to a folding shape of the base material 100. The hinge portions may be formed at an end of the base material overlapped with at a direction of a row in which the first hole H1 is formed based on a length of a short direction in a width direction of the base material 100.

Specifically, the first hinge portion HN1 and the second hinge portion HN2 may be positioned in an end region of the base material 100. In detail, the first hinge portion HN1 and the second hinge portion HN2 may be positioned at both end regions in a short direction among the end regions of the base material 100.

In addition, the first hinge portion HN1 and the second hinge portion HN2 may be formed by passing through a region in the short direction among the end regions of the base material 100. That is, the first hinge portion HN1 and the second hinge portion HN2 may be defined as holes formed by passing through both end regions in a short direction among the end regions of the base material 100.

A shape of the hole of the hinge portion may be the same as or different from a shape of the first hole H1. For example, the hole may be formed while having a curved surface. In detail, the hole may be formed in a shape having a curved surface such as an elliptical shape, a hemispherical shape, a circular shape, or the like.

However, the embodiment is not limited thereto, and the hole may be formed in a polygonal shape such as a triangle, a quadrangle, or the like.

Referring to FIG. 21, the first hole H1 may be formed in a first region 1A in which the first hinge portion HN1 and the second hinge portion HN2 are formed, that is, a folding region.

The first hole H1 may be formed such that the size of the first hole H1 per unit area is different from each other for each region in the folding region.

That is, the size of the first hole H1 per unit area formed in an inner surface of the base material formed by folding the base material 100, that is, one surface 1S of the base material may be formed to be different from each other for each region in the folding region.

Here, the size of the first hole H1 per unit area may be defined as an area in which the first hole H1 is formed per unit area, and an increase in the size of the first hole H1 per unit area may also be defined by an increase in the size of the first hole or an increase in the number of the first holes.

At least two folding regions may be defined in the base material 100. For example, in the base material 100, at least two folding regions may be defined depending on a curvature of the base material 100 formed by folding the base material 100.

Referring to FIG. 21, the first region 1A of the base material 100 may include a first curvature region RA1 and a second curvature region RA2. That is, the first region 1A may include the first curvature region RA1 and the second curvature region RA2 having different sizes.

Although two curvature regions are defined in FIG. 21, the embodiment is not limited thereto, and various numbers of curvature regions may be defined depending on a curvature size.

The first curvature region RA1 and the second curvature region RA2 may have different curvature sizes.

Here, the curvature size may refer to a size of curvature radius generated when the base material is warped. That is, when the curvature radius is small, the curvature size is large, and thus it may refer that the base material is warped largely, and when the curvature radius is large, the curvature size is small, and thus it may refer that the base material is warped relatively small.

Specifically, the curvature radius of the first curvature region RA1 close to the folding axis may be smaller than the curvature radius of the second curvature region RA2 farther from the folding axis than the first curvature region RA1.

The sizes of the first holes H1 per unit area formed in the first curvature region RA1 and the second curvature region RA2 may be different from each other. In detail, the size of the first hole H1 per unit area formed in the first curvature region RA1 may be larger than the size of the first hole H1 per unit area formed in the second curvature region RA2.

That is, the first hole H1 formed in the first region 1A may be formed such that the hole size per unit area in a region having a smaller curvature radius is further increased.

In other words, a distance d1 between the first holes H1 formed in the first curvature region RA1 may be smaller than a distance d2 between the first holes H1 formed in the second curvature region RA2. That is, the first holes H1 formed in the first curvature region RA1 may be formed more densely, that is, at a higher density than the first holes H1 formed in the second curvature region RA2.

FIG. 23 is a cross-sectional view taken along line A-A' of FIG. 21, and is a view illustrating a shape of a first hole passing through the one surface 1S and the other surface 2S.

Referring to FIG. 23, the first hole H1 may include a first through-hole h1 passing through the one surface 1S and a second through-hole h2 passing through the other surface 2S.

The first through-hole h1 and the second through-hole h2 may have sizes of an inner diameter IR and an outer diameter OR. That is, the outer diameter of the first through-hole h1 and the second through-hole h2 may be larger than the inner diameter.

The outer diameter of the first through-hole h1 and the second through-hole h2 may be about 0.01 mm to 10 mm.

In the first through-hole h1 and the second through-hole h2, central axes passing through a center of each through-hole may be defined. That is, central axes passing through a center of the outer diameter of the first through-hole h1 and the outer diameter of the second through-hole h2 may be defined.

In the first curvature region RA1, a first central axis C1 of the first through-hole h1 and a second central axis C2 of the second through-hole h2 may be different in one first hole. In addition, in the second curvature region RA2, the first central axis C1 of the first through-hole h1 and the second central axis C2 of the second through-hole h2 may be same in one first hole.

That is, the first central axis C1 of the first through-hole h1 in the first curvature region RA1 may be positioned closer to the folding axis than the second central axis C2 of the second through-hole h2 in the second curvature region RA2. That is, in the first curvature region RA1, the first central axis C1 of the first through-hole h1 may be formed to be shifted closer to the folding axis than the second central axis C2 of the second through-hole h2.

In other words, the first region may include a region in which a distance between centers of two adjacent first through-holes among a plurality of first holes is different.

That is, a distance of the first central axes C1 of the adjacent first through-hole h1 in the first curvature region RA1 may be smaller than a distance of the first central axes C1 of the adjacent first through-hole h1 in the second curvature region RA2.

That is, in the first curvature region RA1, a position of the first through-hole h1 may be changed such that an area of the first through-hole h1 per unit area increases as the position is closer to the folding axis.

That is, the first central axis C1 of the first through-hole may be positioned to be shifted in the folding axis direction with respect to the second central axis C2 of the second through-hole.

That is, the first through-hole may be formed to be shifted in a folding axis direction by a predetermined distance with respect to a virtual through-hole indicated by a dotted line.

In addition, the first central axis C1 of the first through-hole may be positioned to be shifted more and more toward the folding axis.

That is, the distance of the first central axes C1 of the adjacent first through-holes h1 in the first curvature region RA1 may be gradually decreased toward the folding axis.

In this case, a shift distance d3 of the central axis of the first through-hole h1 may satisfy the following Equation 3.

$$0.1t \leq \text{shift distance d3 of central axis of first through-hole} \leq 10t \quad \text{[Equation 3]}$$

(where t is a thickness of a base material)

Accordingly, the first holes formed on the folded inner surface, that is, the one surface 1S of the base material may have different sizes per unit area in regions in which a curvature radius is different. Therefore, in a region with a small curvature radius, a size of the first holes per unit area may be formed to be large, and in a region with a large curvature radius, a size of the first holes per unit area may be formed to be relatively small.

Therefore, in the display substrate according to the embodiment, the display substrate with improved folding reliability may be realized by minimizing a distribution of compressive stress that is changed according to the curvature size when the base material is in a folded state.

That is, in the region with a small curvature radius, a proportion of the hole that may disperse the compressive stress is formed larger than that in the region with a large curvature radius, thereby more effectively dispersing the compressive stress generated on the folded inner surface of the base material.

FIG. 22 is a view illustrating a top view of the other surface of the base material 100. That is, it is a view illustrating a top view of the outside of a folding direction, not the inside.

Referring to FIG. 22 and FIG. 23, in the other surface 2S which is the folded outer surface, the first holes H1 may be formed in the same size per unit area in the first curvature region RA1 and the second curvature region RA2.

That is, on the other surface 2S, a first central axis C1 in the first curvature region RA1 and a second central axis C2 in the second curvature region RA2 may be coincident with each other.

That is, on the other surface, the second through-hole of the first curvature region RA1 may be positioned at the same distance as the second through-hole of the second curvature region RA2.

That is, the other surface does not generate compressive stress as the folded outer surface of the base material, unlike the inner surface. Therefore, the size of the first hole formed on the other surface is not changed according to the curvature size, and may be formed to have the same size.

Meanwhile, the embodiment is not limited thereto, and the other surface of the base material may be formed by shifting the position of the second through-hole in the folding axis direction according to the curvature size, like the above-described one surface.

Referring to FIGS. 24 to 26, the first hole H1 may be formed in a first region 1A in which the first hinge portion HN1 and the second hinge portion HN2 are formed, that is, a folding region.

The first hole H1 may be formed with different sizes per unit area for each region in the folding region. Specifically, the folding region may include a region in which first holes having different sizes per unit area are formed.

That is, the size of the first hole H1 per unit area formed in an inner surface of the base material formed by folding the base material 100, that is, one surface 1S of the base material may be formed to be different from each other for each region in the folding region.

Here, the size of the first hole H1 per unit area may be defined as an area in which the first hole H1 is formed per unit area, and an increase in the size of the first hole H1 per unit area may also be defined by an increase in the size of the first hole or an increase in the number of the first holes.

In the base material 100, at least two folding regions may be defined. For example, in the base material 100, at least two folding regions may be defined according to the curvature of the base material 100 that is formed by folding the base material 100.

Referring to FIGS. 24 and 26, the first region 1A of the base material 100 may include a first curvature region RA1 and a second curvature region RA2. That is, the first region 1A may include the first curvature region RA1 and the second curvature region RA2 having different sizes.

Although two curvature regions are defined in FIG. 24, the embodiment is not limited thereto, and various numbers of curvature regions may be defined depending on a curvature size.

Since shapes of the first hole, the first through-hole, and the second through-hole on the one surface 1S described with reference to FIGS. 24 and 26 are the same as or similar to those of FIGS. 21 and 23 described above, following description will be omitted.

Referring to FIGS. 25 and 26, the first curvature region RA1 and the second curvature region RA2 of the other surface of the base material 100 may have different curvature radii. In detail, the curvature radius of the first curvature region RA1 close to the folding axis may be smaller than the curvature radius of the second curvature region RA2 farther from the folding axis than the first curvature region RA1.

The sizes of the first holes H1 per unit area formed in the first curvature region RA1 and the second curvature region RA2 may be different from each other. In detail, the size of the first hole H1 per unit area formed in the first curvature region RA1 may be larger than the size of the first hole H1 per unit area formed in the second curvature region RA2.

In other words, a distance d1 between the first holes H1 formed in the first curvature region RA1 may be smaller than a distance d2 between the first holes H1 formed in the second curvature region RA2.

That is, the first holes H1 formed in the first curvature region RA1 may be formed more densely, that is, at a higher density than the first holes H1 formed in the second curvature region RA2.

FIG. 26 is a cross-sectional view taken along line B-B' of FIG. 24, and is a view illustrating a shape of a first hole passing through the one surface 1S and the other surface 2S.

Referring to FIG. 26, the first hole H1 may include a first through-hole h1 passing through the one surface 1S and a second through-hole h2 passing through the other surface 2S.

The first through-hole h1 and the second through-hole h2 may have sizes of an inner diameter IR and an outer diameter OR. That is, the outer diameter of the first through-hole h1 and the second through-hole h2 may be larger than the inner diameter.

The outer diameter of the first through-hole h1 and the second through-hole h2 may be about 0.01 mm to 10 mm.

In the first through-hole h1 and the second through-hole h2, central axes passing through a center of each through-hole may be defined. That is, in the first through-hole h1 and the second through-hole h2, first and second central axes passing through a center of the outer diameter of each through-hole may be defined.

In the first curvature region RA1, the first central axis C1 of the first through-hole h1 and the second central axis C2 of the second through-hole h2 may be positioned close to the folding axis. That is, in the first curvature region RA1, a distance of the first central axis C1 of the first through-hole h1 and the second central axis C2 of the second through-hole h2 may be positioned so as to be closer than a distance of the first and second central axes in the second curvature region RA2.

In other words, the first region may include a region in which a distance between centers of two adjacent first through-holes among a plurality of first holes is different, and may include a region in which a distance between centers of two adjacent second through-holes among the plurality of first holes is different.

That is, in the first curvature region RA1, positions of the first through-hole h1 and the second through-hole h2 may be changed such that the size of the first through-hole h1 per unit area increases as the position is closer to the folding axis.

That is, in the first curvature region RA1, a distance between the first central axis C1 of the first through-hole h1 and the second central axis C2 of the second through-hole h2 may be shifted so as to be closer than a distance between the first and second central axes in the curvature region RA2.

That is, the first through-hole and the second through-hole may be formed to be shifted in a folding axis direction by a predetermined distance with respect to a virtual through-hole indicated by a dotted line.

In addition, the first central axis C1 of the first through-hole and/or the second central axis C2 of the second through-hole may be positioned to be shifted more and more toward the folding axis.

That is, the distance of the first central axes C1 of the adjacent first through-holes h1 in the first curvature region RA1 and/or the distance of the second central axes C2 of the second through-holes h2 may be gradually decreased toward the folding axis.

In this case, a shift distance d3 of the central axis of the first through-holes h1 and a shift distance d4 of the central axis of the second through-holes h2 may satisfy the following Equation 4.

$$0.1t \leq \text{shift distance d3 of central axis of first through-hole, shift distance d4 of central axis of second through-hole} \leq 10t \qquad \text{[Equation 4]}$$

(where t is a thickness of a base material)

The shift distance d3 of the first through-holes h1 and the shift distance d4 of the second through-holes h2 may be the same or different. That is, in the first curvature region RA1, the first through-hole and the second through-hole may be formed to be shifted by the same distance from each other so that the first and second central axes coincide with each other. Alternatively, in the first curvature region RA1, the first through-hole and the second through-hole may be formed to be shifted by different distances so as to change first and second central axes.

Accordingly, the first holes formed on the folded inner surface, that is, the one surface and the other surface of the base material may have different sizes of the first holes per unit area in regions in which a curvature size is different. Thereby, in a region with a small curvature radius, a size of the first holes per unit area may be formed to be large, and in a region with a large curvature radius, a size of the first holes per unit area may be formed to be relatively small.

Therefore, in the display substrate according to the embodiment, the display substrate with improved folding reliability may be realized by minimizing a distribution of compressive stress that is changed according to the curvature size when the base material is in a folded state.

In addition, it is possible to effectively disperse the stress for each curvature region during folding by making the hole size per unit area in the one surface region and the other surface region similar.

That is, in the region with a small curvature radius, a proportion of the hole that may disperse the compressive stress is formed larger than that in the region with a large curvature radius, thereby more effectively dispersing the compressive stress generated on the folded inner surface of the base material.

Meanwhile, in a display substrate according to an embodiment, a hole may also be formed in an unfolding region.

Referring to FIGS. 27 to 30, in a display substrate, holes may be formed in a second region of a base material 100.

Specifically, the base material 100 may include a first region 1A and a second region 2A, a first hole H1 may be formed in the first region 1A, and a second hole H2 may be formed in the second region 2A.

Since the first holes H1 formed in the first region 1A are the same as the embodiment described above, a following description is omitted. That is, the first hole of the above-described embodiment with reference to FIGS. 21 to 24 may be combined with the following other embodiments as shown in FIGS. 9 to 12.

A plurality of second holes H2 spaced apart from each other may be formed in the second region 2A.

The second hole H2 may be overlapped with one surface and the other surface of the second region 2A of the base material 100 to be formed passing through the base material 100, or to be formed passing through only one surface.

The second hole H2 may be different from the size of the first hole H1. Alternatively, the sizes of the outer diameter and the inner diameter of the second hole H2 may be different from those of the first hole H1.

Specifically, referring to FIGS. 27 to 30, the size of the second hole H2 may be smaller than the size of the first hole H1.

Accordingly, it is possible to prevent the second region from bending together when the base material is folded by making the size or proportion of the holes in the second region to be smaller than the holes in the first region.

Alternatively, referring to FIGS. 27 to 30, the size of the second hole H2 per unit area may be smaller than the size of the first hole per unit area of the first and second curvature regions of the first region.

Accordingly, the size of the second hole H2 per unit area is smaller than the size of the first hole per unit area of the first region, so that the folding region and the unfolding region may be separated, and since the hinge portion is not formed in the second region, the first region may be warped with a smaller force than the second region. That is, in the display substrate according to FIGS. 27 to 30, holes may be formed not only in a region that is bent but also in a region that is not bent.

That is, holes may be formed in all regions of the base material.

Accordingly, it is possible to prevent the display substrate from warping or twisting by reducing a difference between deformation of the first region due to heat and deformation of the second region due to heat.

Specifically, when the difference in deformation due to heat in the first region and the second region is too large, the display substrate may be warped or twisted. Accordingly, cracks may occur in the base material in the boundary region between the first region and the second region.

Accordingly, in the display substrate according to an embodiment, it is possible to prevent damage to the display substrate due to thermal deformation by forming a hole in the second region as well.

Hereinafter, a display substrate according to a fourth embodiment will be described with reference to FIGS. 31 to 41. In the description of the display substrate according to the fourth embodiment, the description of the same or similar contents as those of the above-described embodiments will be omitted, and the same reference numerals will be assigned to the same components.

Referring to FIG. 31, the base material 100 may be folded in one direction. In detail, the one surface 1S may be folded in a direction facing each other.

A first region 1A and a second region 2A may be formed on the base material 100 by folding the base material 100 in one direction. That is, the base material 100 may be formed with a first region formed by folding the base material 100 in one direction and a second region positioned at both ends of the first region.

The first region may be a folding region FA and an unfolding region UFA. Further, the second region may be an unfolding region UFA.

That is, the display substrate according to the fourth embodiment may have two folding axes, that is, a first folding axis and a second folding axis, and the first region may include both the folding region FA and the unfolding region UFA.

The folding region may be defined as a region in which a curvature R generated by warping of the base material is formed, and the unfolding region may be defined as a region in which the curvature R is not formed or a curvature is close to zero.

That is, the size of the folding region of the display substrate according to the fourth embodiment may be smaller than the size of the folding region of the display substrate according to the above-described third embodiment.

That is, referring to FIG. 31, the base material 100 is folded in one direction, and may be formed in the order of an unfolding region, a folding region, an unfolding region, a folding region, and an unfolding region.

That is, a design of the display substrate may be freely modified by controlling a proportion of the first hole described below, that is, a size of the hole per unit area.

FIGS. 32 and 33 are views illustrating one surface and the other surface of the display substrate according to the fourth embodiment. That is, FIG. 32 is a view illustrating a top view of a folded inner surface when the base material 100 is folded, and FIG. 33 is a view illustrating a top view of a folded outer surface when the base material 100 is folded.

In addition, FIG. 34 is a cross-sectional view for describing a shape and a position of a hole of the display substrate according to the fourth embodiment.

Referring to FIG. 32, the base material 100 may be formed with a first region 1A and a second region 2A.

The first region 1A may include a folding region FA and an unfolding region UFA. The folding region FA may be defined as a region in which a curvature R is formed, and the unfolding region UFA may be defined as a region in which a curvature is not formed or a curvature is close to zero.

The folding region of the first region 1A may be defined as a region in which a first hinge portion HN1 and a second hinge portion HN2 are formed and a region in which a third hinge portion HN3 and a fourth hinge portion HN4 are formed. In addition, the unfolding region of the first region 1A may be defined as a region between the second hinge portion HN2 and the third hinge portion HN3.

Specifically, the hinge portions may be defined as a point in which folding of the base material 100 is started. That is, the folding is started at the first hinge portion HN1, the second hinge portion HN2, the third hinge portion HN3, and the fourth hinge portion HN4, and the base material 100 may be folded in a direction in which one surface 1S of the base material 100 faces each other.

Such a hinge portion may include a plurality of hinge portions according to a folding shape of the base material 100. The hinge portions may be formed at an end of the base material overlapped with at a direction of a row in which the first hole H1 is formed based on a length of a short direction in a width direction of the base material 100.

The first hinge portion HN1, the second hinge portion HN2, the third hinge portion HN3, and the fourth hinge portion HN4 may be positioned in an end region of the base material 100. In detail, the first hinge portion HN1, the second hinge portion HN2, the third hinge portion HN3, and the fourth hinge portion HN4 may be positioned at both end regions in a short direction among the end regions of the base material 100.

In addition, the first hinge portion HN1, the second hinge portion HN2, the third hinge portion HN3, and the fourth hinge portion HN4 may be formed by passing through both end regions in a short direction among the end regions of the base material 100. That is, the first hinge portion HN1, the second hinge portion HN2, the third hinge portion HN3, and the fourth hinge portion HN4 may be defined as a hole formed by passing through both end regions in the short direction among the end regions of the base material 100.

A shape of the hole may be the same as or different from a shape of the first hole H1. For example, the hole may be formed while having a curved surface. In detail, the hole h may be formed in a shape having a curved surface such as an elliptical shape, a hemispherical shape, a circular shape, or the like.

However, the embodiment is not limited thereto, and the hole h may be formed in a polygonal shape such as a triangle, a quadrangle, or the like.

Referring to FIGS. 32 and 34, the first hole H1 may be formed in a first region 1A in which the first hinge portion HN1 and the second hinge portion HN2 are formed and a first region 1A in which the third hinge portion HN3 and the fourth hinge portion HN4 are formed, that is, a folding region.

The first hole H1 may be formed such that the size of the first hole H1 per unit area is different from each other for each region in the folding region.

That is, the size of the first hole H1 per unit area formed in an inner surface of the base material formed by folding the base material 100, that is, one surface 1S of the base material may be formed to be different from each other for each region in the folding region.

Here, the size of the first hole H1 per unit area may be defined as an area in which the first hole H1 is formed per unit area, and an increase in the size of the first hole per unit area may also be defined by an increase in the size of the first hole or an increase in the number of the first holes.

Referring to FIG. 32, the first region 1A of the base material 100 may include a first curvature region RA1 and a second curvature region RA2. That is, the first region 1A may include the first curvature region RA1 and the second curvature region RA2 having different sizes.

Here, the curvature size may refer to a size of curvature radius. That is, when the curvature radius is small, the curvature size is large, and thus it may refer that the base material is warped largely, and when the curvature radius is large, the curvature size is small, and thus it may refer that the base material is warped relatively small.

The first curvature region RA1 and the second curvature region RA2 may have different curvature radii. In detail, the curvature radius of the first curvature region RA1 close to the folding axis may be smaller than the curvature radius of the second curvature region RA2 farther from the folding axis than the first curvature region RA1.

The sizes of the first holes H1 per unit area formed in the first curvature region RA1 and the second curvature region RA2 may be different from each other. In detail, the size of the first hole H1 per unit area formed in the first curvature region RA1 may be larger than the size of the first hole H1 per unit area formed in the second curvature region RA2.

That is, the first hole H1 formed in the first region 1A may be formed such that the hole size per unit area in a region having a smaller curvature radius is further increased.

In other words, a distance d1 between the first holes H1 formed in the first curvature region RA1 may be smaller than a distance d2 between the first holes H1 formed in the second curvature region RA2.

That is, the first holes H1 formed in the first curvature region RA1 may be formed more densely, that is, at a higher density than the first holes H1 formed in the second curvature region RA2.

FIG. 34 is a cross-sectional view taken along line C-C' of FIG. 32, and is a view illustrating a shape of a first hole passing through the one surface 1S and the other surface 2S.

Referring to FIG. 34, the first hole H1 may include a first through-hole h1 passing through the one surface 1S and a second through-hole h2 passing through the other surface 2S.

The first through-hole h1 and the second through-hole h2 may have sizes of an inner diameter IR and an outer diameter OR. That is, the outer diameter of the first through-hole h1 and the second through-hole h2 may be larger than the inner diameter.

The outer diameter of the first through-hole h1 and the second through-hole h2 may be about 0.01 mm to 10 mm.

In the first through-hole h1 and the second through-hole h2, central axes passing through a center of each through-hole may be defined. That is, central axes passing through a center of the outer diameter of the first through-hole h1 and the outer diameter of the second through-hole h2 may be defined.

In the first curvature region RA1, a first central axis C1 of the first through-hole h1 and a second central axis C2 of the second through-hole h2 may be different in one first hole.

In addition, in the second curvature region RA2, the first central axis C1 of the first through-hole h1 and the second central axis C2 of the second through-hole h2 may be same in one first hole.

That is, the first central axis C1 of the first through-hole h1 in the first curvature region RA1 may be positioned closer to the folding axis than the second central axis C2 of the second through-hole h2 in the second curvature region RA2. That is, in the first curvature region RA1, the first central axis C1 of the first through-hole h1 may be formed to be shifted closer to the folding axis than the second central axis C2 of the second through-hole h2.

In other words, the first region may include a region in which a distance between centers of two adjacent first through-holes among a plurality of first holes is different.

That is, a distance of the first central axes C1 of the adjacent first through-hole h1 in the first curvature region RA1 may be smaller than a distance of the first central axes C1 of the adjacent first through-hole h1 in the second curvature region RA2.

That is, in the first curvature region RA1, a position of the first through-hole h1 may be changed such that an area of the first through-hole h1 per unit area increases as the position is closer to the folding axis.

That is, the first central axis C1 of the first through-hole may be positioned to be shifted in the folding axis direction with respect to the second central axis C2 of the second through-hole.

In addition, the first central axis C1 of the first through-hole may be positioned to be shifted more and more toward the folding axis.

That is, the distance of the first central axes C1 of the adjacent first through-holes h1 in the first curvature region RA1 may be gradually decreased toward the folding axis.

In this case, a shift distance d3 of the central axis of the first through-hole h1 may satisfy the following Equation 3.

$$0.1t \leq \text{shift distance d3 of central axis of first through-hole} \leq 10t \quad \text{[Equation 3]}$$

(where t is a thickness of a base material)

Accordingly, the first holes formed on the folded inner surface, that is, the one surface 1S of the base material may have different sizes per unit area in regions in which a curvature radius is different. Therefore, in a region with a small curvature radius, a size of the first holes per unit area may be formed to be large, and in a region with a large curvature radius, a size of the first holes per unit area may be formed to be relatively small.

Therefore, in the display substrate according to the embodiment, the display substrate with improved folding reliability may be realized by minimizing a distribution of compressive stress that is changed according to the curvature size when the base material is in a folded state.

That is, in the region with a small curvature radius, a proportion of the hole that may disperse the compressive stress is formed larger than that in the region with a large curvature radius, thereby more effectively dispersing the compressive stress generated on the folded inner surface of the base material.

FIG. 33 is a view illustrating a top view of the other surface of the base material 100. That is, it is a view illustrating a top view of the outside of a folding direction, not the inside.

Referring to FIG. 32 and FIG. 33, in the other surface 2S which is the folded outer surface, the first holes H1 may be formed in the same size per unit area in the first curvature region RA1 and the second curvature region RA2.

That is, on the other surface 2S, a first central axis C1 in the first curvature region RA1 and a second central axis C2 in the second curvature region RA2 may be coincident with each other.

That is, on the other surface, the second through-hole of the first curvature region RA1 may be positioned at the same distance as the second through-hole of the second curvature region RA2.

That is, the other surface does not generate compressive stress as the folded outer surface of the base material, unlike the inner surface. Therefore, the size of the first hole formed on the other surface is not changed according to the curvature size, and may be formed to have the same size.

Meanwhile, the embodiment is not limited thereto, and the other surface of the base material may be formed by shifting the position of the second through-hole in the folding axis direction according to the curvature size, like the above-described one surface.

Referring to FIGS. 35 to 37, the first hole H1 may be formed in a first region 1A in which the first hinge portion HN1 and the second hinge portion HN2 are formed, that is, a folding region.

The first hole H1 may be formed with different sizes per unit area for each region in the folding region. Specifically, the folding region may include a region in which first holes having different sizes per unit area are formed.

That is, the size of the first hole H1 per unit area formed in an inner surface of the base material formed by folding the base material 100, that is, one surface 1S of the base material may be formed to be different from each other for each region in the folding region.

Here, the size of the first hole H1 per unit area may be defined as an area in which the first hole H1 is formed per unit area, and an increase in the size of the first hole H1 per unit area may also be defined by an increase in the size of the first hole or an increase in the number of the first holes.

In the base material 100, at least two folding regions may be defined. For example, in the base material 100, at least two folding regions may be defined according to the curvature of the base material 100 that is formed by folding the base material 100.

Referring to FIGS. 35 and 37, the first region 1A of the base material 100 may include a first curvature region RA1 and a second curvature region RA2. That is, the first region 1A may include the first curvature region RA1 and the second curvature region RA2 having different sizes.

Since shapes of the first hole, the first through-hole, and the second through-hole on the one surface 1S described with reference to FIGS. 35 and 37 are the same as or similar to those of FIGS. 32 and 34 described above, following description will be omitted.

Referring to FIGS. 36 and 37, the first curvature region RA1 and the second curvature region RA2 may have different curvature radii. In detail, the curvature radius of the first curvature region RA1 close to the folding axis may be smaller than the curvature radius of the second curvature region RA2 farther from the folding axis than the first curvature region RA1.

The sizes of the first holes H1 per unit area formed in the first curvature region RA1 and the second curvature region RA2 may be different from each other. In detail, the size of the first hole H1 per unit area formed in the first curvature region RA1 may be larger than the size of the first hole H1 per unit area formed in the second curvature region RA2.

In other words, a distance d1 between the first holes H1 formed in the first curvature region RA1 may be smaller than a distance d2 between the first holes H1 formed in the second curvature region RA2.

That is, the first holes H1 formed in the first curvature region RA1 may be formed more densely, that is, at a higher density than the first holes H1 formed in the second curvature region RA2.

FIG. 37 is a cross-sectional view taken along line D-D' of FIG. 35, and is a view illustrating a shape of a first hole passing through the one surface 1S and the other surface 2S.

Referring to FIG. 37, the first hole H1 may include a first through-hole h1 passing through the one surface 1S and a second through-hole h2 passing through the other surface 2S.

The first through-hole h1 and the second through-hole h2 may have sizes of an inner diameter IR and an outer diameter OR. That is, the outer diameter of the first through-hole h1 and the second through-hole h2 may be larger than the inner diameter.

The outer diameter of the first through-hole h1 and the second through-hole h2 may be about 0.01 mm to 10 mm.

In the first through-hole h1 and the second through-hole h2, central axes passing through a center of each through-hole may be defined. That is, in the first through-hole h1 and the second through-hole h2, first and second central axes passing through a center of the outer diameter of each through-hole may be defined.

In the first curvature region RA1, the first central axis C1 of the first through-hole h1 and the second central axis C2 of the second through-hole h2 may be positioned close to the folding axis. That is, in the first curvature region RA1, a distance of the first central axis C1 of the first through-hole h1 and the second central axis C2 of the second through-hole h2 may be positioned so as to be closer than a distance of the first and second central axes in the second curvature region RA2.

In other words, the first region may include a region in which a distance between centers of two adjacent first through-holes among a plurality of first holes is different and a region in which a distance between centers of two adjacent second through-holes among the plurality of first holes is different.

That is, in the first curvature region RA1, positions of the first through-hole h1 and the second through-hole h2 may be changed such that the size of the first through-hole h1 per unit area increases as the position is closer to the folding axis.

That is, in the first curvature region RA1, a distance between the first central axis C1 of the first through-hole h1 and the second central axis C2 of the second through-hole h2 may be shifted so as to be closer than a distance between the first and second central axes in the curvature region RA2.

In this case, a shift distance d3 of the central axis of the first through-hole h1 and a shift distance d4 of the central axis of the second through-hole h2 may satisfy the following Equation 4.

$$0.1t \leq \text{shift distance d3 of central axis of first through-hole, shift distance d4 of central axis of second through-hole} \leq 10t \quad \text{[Equation 4]}$$

(where t is a thickness of a base material)

The shift distance d3 of the first through-holes h1 and the shift distance d4 of the second through-holes h2 may be the same or different. That is, in the first curvature region RA1, the first through-hole and the second through-hole may be formed to be shifted by the same distance from each other so that the first and second central axes coincide with each other. Alternatively, in the first curvature region RA1, the first through-hole and the second through-hole may be formed to be shifted by different distances so as to change first and second central axes.

Accordingly, the first holes formed on the folded inner surface, that is, the one surface and the other surface of the base material may have different sizes of the first holes per unit area in regions in which a curvature size is different. Thereby, in a region with a small curvature radius, a size of the first holes per unit area may be formed to be large, and in a region with a large curvature radius, a size of the first holes per unit area may be formed to be relatively small.

Therefore, in the display substrate according to the embodiment, the display substrate with improved folding reliability may be realized by minimizing a distribution of compressive stress that is changed according to the curvature size when the base material is in a folded state.

In addition, it is possible to effectively disperse the stress for each curvature region during folding by making the hole size per unit area in the one surface region and the other surface region similar.

That is, in the region with a small curvature radius, a proportion of the hole that may disperse the compressive stress is formed larger than that in the region with a large curvature radius, thereby more effectively dispersing the compressive stress generated on the folded inner surface of the base material.

Meanwhile, in a display substrate according to an embodiment, a hole may also be formed in an unfolding region.

Referring to FIGS. 38 to 41, in a display substrate, holes may be formed in a second region of a base material 100.

Specifically, the base material 100 may include a first region 1A and a second region 2A, a first hole H1 may be formed in the first region 1A, and a second hole H2 may be formed in the second region 2A.

Since the first holes H1 formed in the first region 1A are the same as the embodiment described above, a following description is omitted. That is, the first hole of the above-described embodiment with reference to FIGS. 14 to 19 may be combined with the following other embodiments as shown in FIGS. 20 to 23.

A plurality of second holes H2 spaced apart from each other may be formed in the second region 2A.

The second hole H2 may be overlapped with one surface and the other surface of the second region 2A of the base material 100 to be formed passing through the base material 100, or to be formed passing through only one surface.

The second hole H2 may be the same as or similar to the size of the first hole H1. Alternatively, the sizes of the outer diameter and the inner diameter of the second hole H2 may be different from those of the first hole H1.

Specifically, referring to FIGS. 38 to 41, the size of the second hole H2 may be smaller than the size of the first hole H1.

Accordingly, it is possible to prevent the second region from bending together when the base material is folded by making the size or proportion of the holes in the second region to be smaller than the holes in the first region.

Alternatively, referring to FIGS. 38 to 41, the size of the second hole H2 per unit area may be smaller than the size of the first hole per unit area of the first and second curvature regions of the first region.

Accordingly, the size of the second hole H2 per unit area is smaller than the size of the first hole per unit area of the first region, so that the folding region and the unfolding region may be separated, and since the hinge portion is not formed in the second region, the first region may be warped with a smaller force than the second region.

That is, in the display substrate according to FIGS. 38 to 41, holes may be formed not only in a region that is bent but also in a region that is not bent.

That is, holes may be formed in all regions of the base material.

Accordingly, it is possible to prevent the display substrate from warping or twisting by reducing a difference between deformation of the first region due to heat and deformation of the second region due to heat.

Specifically, when the difference in deformation due to heat in the first region and the second region is too large, the display substrate may be warped or twisted. Accordingly, cracks may occur in the base material in the boundary region between the first region and the second region.

Accordingly, in the display substrate according to an embodiment, it is possible to prevent damage to the display substrate due to thermal deformation by forming a hole in the second region as well.

In the display substrate according to the third and fourth embodiments, a size of hole per unit area may be different depending on a degree of folding in the region in which the base material is folded, that is, a size of the curvature radius.

Accordingly, it is possible to effectively disperse compressive stress that varies for each region in accordance with the curvature size on the folded inner surface.

That is, it is possible to effectively disperse the compressive stress in a portion in which the compressive stress acts greatly by making the size of the hole per unit area different according to a size of the generated compressive stress, and thus, cracks in the base material due to the compressive stress may be prevented.

FIG. 42 is a view for describing an example in which a display substrate according to embodiments is applied.

Referring to FIG. 42, the display substrate according to the embodiments may be applied to a display device that displays a display.

For example, the display substrate according to the embodiments may be applied to display devices such as a mobile phone and a tablet.

Such a display substrate may be applied to display devices such as a flexible, bent or folded mobile phone or tablet.

The display substrate may be applied to display devices such as a flexible, bent or folded mobile phone or tablet, and thus it is possible to prevent a base material from being damaged by stress in a display device that is repeatedly folded or restored.

In the display substrate according to the embodiment, a size and proportion of the hole may be different depending on a degree of folding in the folding region in which the base material is folded, that is, the curvature size.

Accordingly, it is possible to effectively disperse compressive stress that varies for each region in accordance with the curvature size on the folded inner surface.

That is, it is possible to effectively disperse the compressive stress in a portion in which the compressive stress acts greatly by making the size and proportion of the holes different according to the curvature size, that is, a size of the generated compressive stress, and thus, cracks in the base material due to the compressive stress may be prevented.

In addition, restriction according to the curvature size may be reduced by making the size and proportion of the holes different according to the curvature size, and folding may be performed by a curvature to be achieved, and thus a degree of freedom in design of the display substrate may be improved.

In addition, in the display substrate according to the embodiment, a size of the hole per unit area may be different depending on a degree of folding in the folding region in which the base material is folded, that is, the curvature size.

Accordingly, it is possible to effectively disperse compressive stress that varies for each region in accordance with the curvature size on the folded inner surface.

That is, it is possible to effectively disperse the compressive stress in a portion in which the compressive stress acts greatly by making the size of the hole per unit area different according to the curvature size, that is, a size of the generated compressive stress, and thus, cracks in the base material due to the compressive stress may be prevented.

In addition, restriction according to the curvature size may be reduced by making the size of the hole per unit area different according to the size of curvature radius, and folding may be performed by a curvature radius to be achieved, and thus a degree of freedom in design of the display substrate may be improved.

What is claimed is:

1. A display substrate comprising:
a base material that is foldable based on a folding axis,
wherein the base material is defined in a first direction corresponding to the folding axis and a second direction perpendicular to the first direction,
wherein the base material includes an opening pattern in which at least one of one surface or another surface of the base material is open,
wherein the base material includes a first side surface and a second side surface positioned in the first direction,
wherein the opening pattern includes a first pattern part, a second pattern part, and a third pattern part that are spaced apart from each other along the second direction,
wherein the first pattern part includes a plurality of first patterns spaced from each other along the first direction and provided at a position farther in the second direction from the folding axis than the second and third pattern parts,
wherein the second pattern part includes a plurality of second patterns spaced from each other along the first direction and provided at a position closer in the second direction from the folding axis than the first pattern part,
wherein the third pattern part includes a plurality of third patterns spaced from each other along the first direction and provided at a position closer in the second direction from the folding axis than the first pattern part and the second pattern part,
wherein the plurality of third patterns are in non-contact with the first side surface and the second side surface,
wherein the plurality of first patterns includes a first outer pattern positioned closest to the first side surface,
wherein the plurality of second patterns includes a second outer pattern positioned closest to the first side surface,
wherein the plurality of third patterns includes a third outer pattern positioned closest to the first side surface,
wherein the first to third outer patterns are spaced apart from the first side surface in the first direction,
wherein the first outer pattern has a first distance in the first direction from a first central axis in the first direction of the first outer pattern the first side surface,
wherein the second outer pattern has a second distance in the first direction from a second central axis in the first direction of the second outer pattern to the first side surface,
wherein the third outer pattern has a third distance in the first direction from a third central axis the first direction of the third outer pattern to the first side surface, and
wherein the first to third distances are different from each other.

2. The display substrate of claim 1, wherein a distance between the first central axis and the second central axis in the first direction is equivalent to a distance between the second central axis and the third central axis in the first direction.

3. The display substrate of claim 1, wherein a distance between the first central axis and the second central axis in the second direction is equivalent to a distance between the second central axis and the third central axis in the second direction.

4. The display substrate of claim 1, wherein a thickness of the base material is 0.01 mm to 2 mm, and
wherein a difference between maximum lengths in the first direction of the first patterns, the second patterns and the third patterns satisfies a following Equation 1;

$$0.8t \leq \text{difference between the maximum lengths in the first direction of the first patterns, the second patterns and the third patterns} \leq 1.1t \quad \text{[Equation 1]}$$

(where t is a thickness of the base material).

5. The display substrate of claim 1, wherein a thickness of the base material is 0.01 mm to 2 mm, and
wherein a difference between a maximum length in the first direction and a minimum length in the first direction of the first patterns, the second patterns and the third patterns satisfies a following Equation 2;

$$0.2t \leq \text{difference between the maximum length in the first direction and the minimum length in the first direction of the first patterns, the second patterns and the third patterns} \quad \text{[Equation 2]}$$

(where t is a thickness of the base material).

6. The display substrate of claim 1, wherein the third pattern part includes a third-first pattern part and a third-second pattern part that are spaced apart from each other in the second direction with the folding axis interposed therebetween.

7. The display substrate of claim 1, wherein widths of the first patterns, the second patterns, and the third patterns in the second direction are equivalent.

8. The display substrate of claim 7, wherein a size of the first pattern, the second pattern, and the third pattern is proportional to a curvature size of the base material, and
wherein proportions of the first pattern, the second pattern, and the third pattern vary depending on the curvature size of the base material.

9. The display substrate of claim 6, wherein a length in the first direction of a third pattern of the third-first pattern part is equivalent to a length in the first direction of a third pattern of the third-second pattern part.

10. The display substrate of claim 1, wherein the base material further comprises: a first hinge portion and a second hinge portion connected to the first side surface and spaced apart in the second direction, and
wherein the first hinge portion and the second hinge portion are in non-contact with the first to third outer patterns.

11. A display substrate comprising:
a base material foldable based on a folding axis,
wherein the base material is defined in a first direction corresponding to the folding axis and a second direction perpendicular to the first direction,
wherein the base material includes an opening pattern in which at least one of one surface or another surface of the base material is open,
wherein the base material includes a first side surface and a second side surface positioned in the first direction,
wherein the opening pattern includes a first pattern part, a second pattern part, and a third pattern part that are spaced apart from each other along second direction,
wherein the first pattern part includes a plurality of first patterns spaced from each other along the first direction and provided at a position farther in the second direction from the folding axis than the second and third pattern parts,
wherein the second pattern part includes a plurality of second patterns spaced from each other along the first direction and provided at a position closer in the second direction from the folding axis than the first pattern part,
wherein the third pattern part includes a plurality of third patterns spaced from each other along the first direction and provided at a position closer in the second direction from the folding axis than the first pattern part and the second pattern part, and
wherein the third pattern part includes a third-first pattern part and a third-second pattern part that are spaced apart from each other in the second direction with the folding axis interposed therebetween.

12. The display substrate of claim 11, wherein the plurality of third patterns are in non-contact with the first side surface and the second side surface,
wherein the plurality of first pattern includes a first outer pattern positioned closest to the first side surface,
wherein the plurality of second patterns includes a second outer pattern positioned closest to the first side surface,
wherein the plurality of third patterns includes a third outer pattern positioned closest to the first side surface,
wherein the first to third outer patterns are spaced apart from the first side surface in the first direction,
wherein the first outer pattern has a first distance in the first direction from a first central axis in the first direction of the first outer pattern to the first side surface,
wherein the second outer pattern has a second distance in the first direction from a second central axis in the first direction of the second outer pattern to the first side surface,
wherein the third outer pattern has a third distance in the first direction from a third central axis in the first direction of the third outer pattern to the first side surface, and
wherein the first to third distances are different from each other.

13. The display substrate of claim 11, wherein a distance between the first central axis and the second central axis in the first direction is equivalent to a distance between the second central axis and a third central axis in the first direction.

14. The display substrate of claim 11, wherein the base material is folded such that the one surface faces the other surface around the folding axis,
wherein each of the first and third patterns includes a first portion provided at the one surface of the base material and a second portion provided at the other surface of the base material, and
wherein lengths in the second direction of the first and second parts that overlap each other in a vertical direction are different from each other.

15. The display substrate of claim 11, wherein a distance between the first central axis and a second central axis in a the second direction is equivalent to a distance between the second central axis and a third central axis in the second direction.

16. The display substrate of claim 14, wherein
horizontal central axes of the first and second portions that overlap each other in the vertical direction are misaligned with each other along the vertical direction.

17. The display substrate of claim 16, wherein
misaligned distances between the horizontal central axes of each of the first and third patterns are different from each other.

18. The display substrate of claim 17, wherein the misaligned distances of the horizontal central axes of each of the first patterns, the second patterns and the third patterns satisfies the following Equation 3

$$0.1t \leq \text{misaligned distances of horizontal central axes of each of the first patterns, the second patterns and the third patterns} \leq 10t \quad \text{[Equation 3]}$$

(where t is a thickness of the base material).

19. The display substrate of claim 12, wherein the base material further comprises:
a first hinge portion and a second hinge portion connected to the first side surface and spaced apart in the second direction, and
wherein the first hinge portion and the second hinge portion are in non-contact with the first to third outer patterns.

20. The display substrate of claim 14, wherein the base material includes a metal or metal alloy.

* * * * *